United States Patent
Wu et al.

(10) Patent No.: US 11,894,857 B2
(45) Date of Patent: Feb. 6, 2024

(54) READOUT CIRCUIT, SIGNAL QUANTIZING METHOD AND DEVICE, AND COMPUTER DEVICE

(71) Applicant: Shanghai United Imaging Microelectronics Technology Co., Ltd., Shanghai (CN)

(72) Inventors: Rong Wu, Irvine, CA (US); Longheng Luo, Shanghai (CN); Jieyou Zhao, Shanghai (CN); Mingfeng Chen, Shanghai (CN)

(73) Assignee: Shanghai United Imaging Microelectronics Technology Co., Ltd., Shanghai (CN)

( * ) Notice: Subject to any disclaimer, the term of this patent is extended or adjusted under 35 U.S.C. 154(b) by 10 days.

(21) Appl. No.: 17/695,066

(22) Filed: Mar. 15, 2022

(65) Prior Publication Data

US 2022/0209783 A1 Jun. 30, 2022

(51) Int. Cl.
*H03M 1/12* (2006.01)
*H03M 1/06* (2006.01)
*H03M 1/80* (2006.01)
*H03M 1/18* (2006.01)

(52) U.S. Cl.
CPC ........ *H03M 1/1245* (2013.01); *H03M 1/0648* (2013.01); *H03M 1/183* (2013.01); *H03M 1/802* (2013.01)

(58) Field of Classification Search
CPC .................. H03M 1/1245; H03M 1/0648
USPC .................. 341/144, 126, 155, 123
See application file for complete search history.

(56) References Cited

U.S. PATENT DOCUMENTS

| | | | | |
|---|---|---|---|---|
| 6,130,636 A | * | 10/2000 | Severwright | G01S 13/325 342/120 |
| 9,076,554 B1 | * | 7/2015 | Zanchi | H03F 1/083 |
| 10,062,450 B1 | * | 8/2018 | Moore | G11C 27/024 |
| 2008/0258951 A1 | * | 10/2008 | Doorenbos | H03M 3/46 341/143 |
| 2012/0200350 A1 | * | 8/2012 | Murphy | H03F 3/68 330/85 |
| 2018/0004353 A1 | * | 1/2018 | Shin | G02F 1/13338 |

* cited by examiner

*Primary Examiner* — Peguy Jean Pierre
(74) *Attorney, Agent, or Firm* — Polsinelli PC

(57) ABSTRACT

Disclosed are a readout circuit, a signal quantizing method, a signal quantizing device, and a computer device. The readout circuit includes: a signal sampler, including a plurality of channels; a plurality of integrators, connected to the plurality of channels and having a one-to-one relationship with the plurality of channels; a signal processor, including a first operational amplifier, a sampling input of the first operational amplifier being connected to outputs of the plurality of integrators, respectively; and an analog-digital converter. An input of the analog-digital converter is connected to an output of the first operational amplifier.

17 Claims, 14 Drawing Sheets

READOUT CIRCUIT, SIGNAL QUANTIZING METHOD AND DEVICE, AND COMPUTER DEVICE

TECHNICAL FIELD

The present application relates to the field of electronic technology, particularly, to a readout circuit, a signal quantizing method and device, and a computer device.

BACKGROUND

The readout circuit performs preprocessing and signal conversion on an analog signal sampled by the signal sampler to generate a current signal, and is a signal transmission channel for transmitting the analog signal sampled by the signal sampler to a subsequent application system. The performance of the readout circuit will directly affect performance indexes of the signal sampler.

Commonly, power consumption is a very important index considered in the design of the readout circuits, and has become an important factor of limiting cost and performance. Therefore, how to design a structure of the readout circuit with low power consumption has become a problem to be solved urgently.

SUMMARY

Embodiments of the present application provide a readout circuit, a signal quantizing method and device, and a computer device, which can reduce the power consumption of the readout circuit.

On one aspect, the present application provides a readout circuit. The readout circuit includes a signal sampler including a plurality of channels, a plurality of integrators connected to the plurality of channels and having a one-to-one relationship with the plurality of channels, a signal processor including a first operational amplifier, a sampling input of the first operational amplifier being connected to outputs of the plurality of integrators, respectively, and an analog-digital converter, an input of the analog-digital converter being connected to an output of the first operational amplifier.

In some embodiments, the signal processor further includes a first sampling capacitor, and a first terminal of the first sampling capacitor is connected to the sampling input of the first operational amplifier, and a second terminal of the first sampling capacitor is connected to the output of the first operational amplifier.

In some embodiments, the signal processor further includes sampling switches, and the sampling switches are connected to the first terminal and the second terminal of the first sampling capacitor, respectively.

In some embodiments, a sampling mode of the first sampling capacitor is bottom-plate sampling.

In some embodiments, the signal processor further includes a resetting capacitor, a first terminal of the resetting capacitor is connected to the sampling input of the first operational amplifier, and a second terminal of the resetting capacitor is connected to the output of the first operational amplifier.

In some embodiments, the signal processor further includes resetting switches, and the resetting switches are connected to the first terminal and the second terminal of the resetting capacitor, respectively.

In some embodiments, the signal processor further includes holding switches, one of the holding switches is connected between the first terminal of the resetting capacitor and a common-mode voltage input of the signal processor, and another of the holding switches is connected between the second terminal of the resetting capacitor and a common-mode voltage output of the signal processor.

In some embodiments, the readout circuit further includes a plurality of third sampling capacitors, and at least one of the plurality of third sampling capacitors is configured to be connected to the outputs of the plurality of integrators, respectively, the readout circuit further includes a randomizing circuit, and the randomizing circuit is configured to randomize an order in which the plurality of third sampling capacitors are flip-flopped to the signal processor.

In some embodiments, the readout circuit further includes a signal modelling channel, the signal modelling channel includes a second operational amplifier, an output of the second operational amplifier is an output of the signal modelling channel and is connected to the input of the analog-digital converter.

In some embodiments, the signal modelling channel further includes a modelling-related sampling capacitor. A first terminal of the modelling-related sampling capacitor is connected to a sampling input of the second operational amplifier, and a second terminal of the modelling-related sampling capacitor is connected to the output of the second operational amplifier.

In some embodiments, the signal modelling channel further includes a modelling-related resetting capacitor. A first terminal of the modelling-related resetting capacitor is connected to a sampling input of the second operational amplifier, and a second terminal of the modelling-related resetting capacitor is connected to the output of the second operational amplifier.

In some embodiments, the signal modelling channel further includes modelling-related resetting switches. The modelling-related resetting switches are connected to the first terminal and the second terminal of the modelling-related sampling capacitor, respectively, and the modelling-related resetting switches are configured to be turned on when the modelling-related resetting capacitor is resetting.

In some embodiments, the signal modelling channel further includes modelling-related holding switches. One of the modelling-related holding switches is provided between the first terminal of the modelling-related resetting capacitor and a common-mode voltage input of the signal processor, and another of the modelling-related holding switches is provided between the second terminal of the modelling-related resetting capacitor and a common-mode voltage output of the signal processor. The modelling-related holding switches are configured to be turned on when the signal modelling channel is holding.

According to another aspect of the present application, the present application provides a readout circuit. The readout circuit includes: a signal processing circuit including a plurality of third sampling capacitors and a signal processor, where one terminal of each of the plurality of third sampling capacitors is connected to an input of the signal processor, and at least one of the plurality of third sampling capacitors is configured to sample at least one signal; a randomizing circuit, configured to randomize an order in which the plurality of third sampling capacitors are flip-flopped to the signal processor; and an analog-digital converter, an input end of the analog-digital converter being connected to an output of the signal processor.

According to another aspect of the present application, the present application provides a readout circuit. The readout circuit includes a main signal channel, configured to process an electric charge signal together with an interference noise signal to obtain a first processed electric charge signal, and the interference noise signal being noise information generated by the readout circuit; a signal modelling channel, configured to process the interference noise signal to obtain a second processed electric charge signal; an analog-digital converter, configured to perform a processing of restraining noise on the first processed electric charge signal and the second processed electric charge signal, to obtain a quantized result corresponding to the electric charge signal.

According to another aspect of the present application, the present application provides a signal quantizing method, applicable to the readout circuit above. The signal quantizing method includes the signal sampler collecting an analog signal from each of the plurality of channels, the plurality of integrators converting the analog signal collected from each of the plurality of channels into an electric charge signal, respectively, the signal processor receiving the electric charge signals output by the plurality of integrators in sequence, the signal processor sampling and holding each of the electric charge signals, and the analog-digital converter performing an analog-digital conversion on sampled and held electric charge signal to obtain a quantized result of the electric charge signal.

In some embodiments, the readout circuit further includes a plurality of third sampling capacitors, and at least one of the plurality of third sampling capacitors is configured be connected to the output of each of the plurality of integrators of each of the plurality of channels. The readout circuit further includes a randomizing circuit. The signal processor sampling and holding each of the electric charge signals includes: the randomizing circuit randomizing an order in which the electric charge signals are held, and the signal processor holding the electric charge signals in sequence based on a randomized order.

In some embodiments, the readout circuit further includes a signal modelling channel, the signal modelling channel includes a second operational amplifier, an output of the second operational amplifier is an output of the signal modelling channel and is connected to the input of the analog-digital converter. The signal processor sampling and holding each of the electric charge signals includes: the signal processor processing the electric charge signal together with an interference noise signal to obtain a first processed electric charge signal, and the interference noise signal being noise information generated by the readout circuit; and a signal modelling channel processing the interference noise signal to obtain a second processed electric charge signal.

In some embodiment, the analog-digital converter performing the analog-digital conversion on the sampled and held electric charge signal to obtain the quantized result of the electric charge signal includes: the analog-digital converter performing a processing of restraining noise on the first processed electric charge signal and the second processed electric charge signal to obtain the quantized result of the electric charge signal.

According to another aspect of the present application, the present application provides a computer device. The computer device includes a memory and a processor. A computer program is stored in the memory, and when executing the computer program, the processor performs steps of the method above.

The embodiments of the present application further provide a readout circuit. The readout circuit includes a signal processor and an analog-digital converter. The sampling input of the signal processor is configured to be connected to outputs of a plurality of integrators connected to a plurality of channels respectively, and an output of the signal processor is connected to an input of the analog-digital converter.

The signal processor is configured to receive an electric charge signal output from each of the plurality of integrators through the sampling input sequentially, to sample and hold the electric charge signal, and to transmit the sampled and held electric charge signal to the analog-digital converter to obtain a quantized result of the electric charge signal.

In one of the embodiments, the readout circuit further includes a signal sampler, and the signal sampler includes a plurality of channels, and each of the plurality channels of the signal sampler is connected to one integrator.

The signal sampler is configured to collect the analog signal of an object device, to transmit the analog signal to each of the integrators corresponding to the channels, and obtain an electric charge signal output by the integrator.

In one of the embodiments, the readout circuit further includes a signal sampler, a plurality of integrators, a signal processor, and an analog-digital converter. The signal sampler includes a plurality of channels, and each of the plurality of channels of the signal sampler is connected to one integrator. The output of each of the integrators is connected to the sampling input of the signal processor. The output of the signal processor is connected to the input of the analog-digital converter.

The signal sampler is configured to collect the analog signals of the object device, and the analog signals are transmitted to the integrators corresponding to the channels to obtain the electric charge signals output by the integrators.

The signal processor is configured to receive the electric charge signal output by each of the integrators through the sampling input in sequence, to sample and hold the electric charge signal, and transmit the sampled and held electric charge signal, namely the first processed electric charge signal, to the analog-digital converter to obtain a quantized result of the analog signal.

In one of the embodiments, the signal processor includes a sampling capacitor. A first terminal of the sampling capacitor is connected to the sampling input of the signal processor, and the second terminal of the sampling capacitor is connected to the output of the signal processor.

The sampling capacitor is configured to be charged according to the electric charge signal of a current channel received by the sampling input, and to hold the electric charge signal in the sampling capacitor during the conversion of the electric charge signal of the previous channel by the analog-digital converter.

In one of the embodiments, the signal processor further includes sampling switches, and the sampling switches are connected to two terminals of the sampling capacitor, respectively.

In one of the embodiments, the sampling switches are configured to be turned on while the sampling capacitor is being charged or discharged.

In one of the embodiments, the sampling mode of the sampling capacitor is bottom-plate sampling.

In one of the embodiments, the signal processor includes a resetting capacitor. A first terminal of the resetting capacitor is connected to the sampling input of the signal processor, and a second terminal of the resetting capacitor is connected to the output of the signal processor.

After the signal processor finishes processing the electric charge signal of one channel, the resetting capacitor resets the voltage at the sampling input of the signal processor to the initial input voltage, and/or resets the voltage at the output of the signal processor to the initial output voltage.

In one of the embodiments, the signal processor further includes resetting switches. The resetting switched are connected to two terminals of the resetting capacitor, respectively.

In one of the embodiments, the resetting switches are configured to be turned on while the resetting capacitor is resetting.

In one of the embodiments, the signal processor also includes holding switches. One of the holding switches is connected between the first terminal of the resetting capacitor and a common-mode voltage input, and another of the holding switches is connected between the second terminal of the resetting capacitor and a common-mode voltage output.

In one of the embodiments, the holding switches are configured to be turned on while the signal processor is sampling.

In one of the embodiments, the signal processor is a flip-flop-capacitor-type signal processor.

In one of the embodiments, the signal processor has a gain-boost folded co-source co-gate structure.

In one of the embodiments, the signal sampler is a photoelectric sensor.

In one of the embodiments, the readout circuit further includes a randomizing circuit. The signal processor includes a plurality of third sampling capacitors.

At least one of the plurality of third sampling capacitors is configured to sample the electric charge signals output by the integrators corresponding to each of the channels.

The randomizing circuit is configured to randomize an order in which the plurality of third sampling capacitors are flip-flopped to the signal processor.

The signal processor is also configured to sequentially hold the electric charge signal sampled by each of the sampling capacitors according to the randomized order, and to transmit the held electric charge signal to the analog-digital converter to obtain a quantized result of the electric charge signal.

In one of the embodiments, the readout circuit also includes a signal modelling channel.

The signal modelling channel is configured to process the interference noise signal to obtain a first processed electric charge signal. The interference noise signal is the noise information generated by the readout circuit.

The analog-digital converter is configured to perform a processing of restraining noise on the first processed electric charge signal and the second processed electric charge signal, to obtain a quantized result corresponding to the electric charge signal.

In one of the embodiments, the signal modelling channel includes the second operational amplifier.

The second operational amplifier is configured to sample and hold the interference noise signal to obtain the second processed electric charge signal, and input the second processed electric charge signal to the analog-digital converter.

In one of the embodiments, the signal modelling channel further includes modelling-related sampling capacitor.

The modelling-related sampling capacitor is configured to be charged according to the interference noise signal, and through the output of the second operational amplifier, the second processed electric charge signal is discharged to the analog-digital converter.

In one of the embodiments, the signal modelling channel further includes a modelling-related resetting capacitor.

The modelling-related resetting capacitor is configured to reset the voltage at the sampling input of the second operational amplifier to the initial input voltage, and reset the voltage at the output of the second operational amplifier to the initial output voltage.

In one of the embodiments, the signal modelling channel further includes modelling-related resetting switches. The modelling-related resetting switches are connected to two terminals of the modelling-related resetting capacitor, respectively. The modelling-related resetting switches is turned on while the modelling-related resetting capacitor is resetting.

In one of the embodiments, the signal modelling channel further includes modelling-related holding switches. Of the modelling-related holding switches, one is connected between the first terminal of the modelling-related resetting capacitor and the common-mode voltage input, and another is connected between the second terminal of the modelling-related resetting capacitor and the common-mode voltage output. The modelling-related holding switches are turned on while the second operational amplifier is sampling.

In another aspect, an embodiment of the present application provides a readout circuit, and the readout circuit includes a randomizing circuit, a signal processing circuit, and an analog-digital converter. The signal processing circuit includes a plurality of third sampling capacitors and a signal processor.

At least one of the plurality of third sampling capacitors is configured to sample an object electric charge signal of at least one channel.

The randomizing circuit is configured to randomize an order in which the plurality of third sampling capacitors are flip-flopped to the signal processing circuit.

The signal processor is configured to perform a processing of holding the object electric charge signals sampled by the plurality of third sampling capacitors in sequence according to the randomized order, and to transmit the held object electric charge signal to the analog-digital converter, to obtain a quantized result of the object electric charge signal.

In one of the embodiments, each of the sampling capacitors is configured to sample the object electric charge signal of one corresponding channel.

In one of the embodiments, the object electric charge signal is obtained based on the analog signal.

In one of the embodiments, the readout circuit further includes an analog front-end circuit.

The analog front-end circuit is configured to collect an analog signal of the object device, and convert the analog signal into the object electric charge signal.

In one of the embodiments, the analog front-end circuit includes a signal sampler and integrators. The signal sampler includes at least one channel, and at least one integrator is connected in each channel of the signal sampler.

The signal sampler is configured to collect an analog signal of an object device, transmit the analog signal to a corresponding integrator of each channel, and obtain the object electric charge signal output by each of the integrators.

In one of the embodiments, the signal processing circuit further includes sampling switches.

The sampling switches are connected to two terminals of at least one sampling capacitor, respectively. The sampling switches are configured to be turned on while the corresponding sampling capacitor is being charged or discharged.

In one of the embodiments, the sampling switches are connected to the two terminals of each of the sampling capacitors, respectively.

In one of the embodiments, each sampling capacitor adopts bottom-plate sampling.

In one of the embodiments, the signal processing circuit further includes resetting capacitor;

A first terminal of the resetting capacitor is connected to a sampling input of the signal processor, and a second terminal of the resetting capacitor is connected to an output of the signal processor.

The resetting capacitor is configured to, after the object electric charge signal is processed once, reset the voltage at the sampling input of the signal processor to the initial input voltage, and reset the voltage at the output of the signal processor to the initial output voltage.

In one of the embodiments, the signal processing circuit further includes resetting switches.

The resetting switches are connected to two terminals of the resetting capacitor respectively. The resetting switch is configured to be turned on while the resetting capacitor is resetting.

In one of the embodiments, the signal processing circuit further includes holding switches.

One of the holding switches is connected between the first terminal of the resetting capacitor and the common-mode voltage input, and another of the holding switches is connected between the second terminal of the resetting capacitor and the common-mode voltage output. The holding switches are configured to be turned on while the signal processor is holding.

In one of the embodiments, the signal processor is a flip-flop-capacitor-type signal processor.

In one of the embodiments, the signal processor has a gain-boost folded co-source co-gate structure.

In another aspect, the embodiment of the present application provides a readout circuit. The readout circuit includes a main signal channel, a signal modelling channel and an analog-digital converter. A timing sequence and a structure of the main signal channel are the same as those of the signal modelling channel respectively.

The main signal channel is configured to process an object electric charge signal together with an interference noise signal, to obtain a first processed electric charge signal. The interference noise signal is noise information generated by the readout circuit.

The signal modelling channel is configured to process the interference noise signal, to obtain the second processed electric charge signal.

The analog-digital converter is configured to perform processing of restraining noise on the first processed electric charge signal and the second processed electric charge signal, to obtain a quantized result corresponding to the object electric charge signal.

In one of the embodiments, the timing and the structure of the main signal channel are the same as those of the signal modelling channel respectively.

In one of the embodiments, the object electric charge signal is obtained based on the analog signal.

In one of the embodiments, the interference noise signal includes a disorder signal generated in a process of obtaining the object electric charge signal based on the analog signal, and power supply noise, ground noise, and bias noise generated in the readout circuit.

In one of the embodiments, the readout circuit further includes an analog front-end circuit.

The analog front-end circuit is configured to collect the analog signal of the object device, and to convert the analog signal into the object electric charge signal.

In one of the embodiments, the analog front-end circuit includes a signal sampler and integrators. The signal sampler includes a plurality of channels, and each of the plurality of channels of the signal sampler is connected to one of the integrators.

The signal sampler is configured to collect an analog signal of an object device, transmit the analog signal to the integrator corresponding to each channel, and obtain the object electric charge signal output by each of the integrators.

In one of the embodiments, the main signal channel includes a first operational amplifier. An output of the first operational amplifier is connected to an input of the analog-digital converter.

The first operational amplifier is configured to sample and hold the object electric charge signal together with the interference noise signal, to obtain the first processed electric charge signal, and output the first processed electric charge signal to the analog-digital converter.

In one of the embodiments, the signal modelling channel includes the second operational amplifier. The output of the second operational amplifier is connected to the input of the analog-digital converter.

The signal modelling channel is configured to sample and hold the interference noise signal, to obtain the second processed electric charge signal, and output the second processed electric charge signal to the analog-digital converter.

In one of the embodiments, the main signal channel also includes a first sampling capacitor. The first sampling capacitor is configured to be charged according to the object electric charge signal and the interference noise signal, and through the output of the first operational amplifier, the first processed electric charge signal is discharged to the analog-digital converter.

In one of the embodiments, the first terminal of the first sampling capacitor is connected to the sampling input of the first operational amplifier, and the second terminal of the first sampling capacitor is connected to the output of the first operational amplifier.

In one of the embodiments, the signal modelling channel also includes a second sampling capacitor. The second sampling capacitor is configured to be charged according to the interference noise signal, and discharge the second processed charge signal to the analog-digital converter through the output of the signal modelling channel.

In one of the embodiments, the first output of the second sampling capacitor is connected to the sampling input of the signal modelling channel, and the second terminal of the second sampling capacitor is connected to the output of the signal modelling channel.

In one of the embodiments, the main signal channel also includes first sampling switches. The first sampling switches are connected to two terminals of the first sampling capacitor respectively. The first sampling switches are configured to be turned on while the first sampling capacitor is being charged or discharged.

In one of the embodiments, the signal modelling channel also includes the second sampling switch. The second sampling switches are connected to two terminals of the second sampling capacitor, respectively. The second sampling switches are configured to be turned on while the second sampling capacitor is being charged or discharged.

In one of the embodiments, the first sampling capacitor and the modelling-related sampling capacitor both adopt a bottom-plate sampling mode.

In one of the embodiments, the main signal channel also includes a resetting capacitor. The resetting capacitor is configured to, after the object electric charge signal and the interference noise signal are processed once, reset the voltage at the sampling input of the signal processor to an initial input voltage, and reset the voltage at the output of the signal processor to the initial output voltage.

In one of the embodiments, the first terminal of the first resetting capacitor is connected to the sampling input of the signal processor, and the second terminal of the first resetting capacitor is connected to the output of the signal processor.

In one of the embodiments, the signal modelling channel further includes the second resetting capacitor. The second resetting capacitor is configured to, after the interference noise signal is processed once, reset the voltage at the sampling input of the second operational amplifier to an initial input voltage, and reset the voltage at the output of the second operational amplifier to an initial output voltage.

In one of the embodiments, the first end of the second resetting capacitor is connected to the sampling input of the second operational amplifier, and the second end of the second resetting capacitor is connected to the output of the second operational amplifier.

In one of the embodiments, the main signal channel further includes the first resetting switches. The first resetting switches are connected to the two terminals of the first resetting capacitor. The first resetting switches are configured to be turned on while the first resetting capacitor is resetting.

In one of the embodiments, the signal modelling channel further includes the second resetting switches. The resetting switches are connected to the two terminals of the second resetting capacitor, respectively. The second resetting switches are configured to be turned on while the second resetting capacitor is resetting.

In one of the embodiments, the main signal channel further includes first holding switches, one of which is connected between the first terminal of the first resetting capacitor and the common-mode voltage input, and another of which is connected between the second terminal of the first resetting capacitor and the common-mode voltage output. The first holding switches are configured to be turned on while the signal processor is sampling.

In one of the embodiments, the signal modelling channel further includes second holding switches, one of which is connected between the first terminal of the second resetting capacitor and the common-mode voltage input, and another of which is connected between the second terminal of the second resetting capacitor and the common-mode voltage output. The second holding switches are configured to be turned on while the second operational amplifier is sampling.

In one of the embodiments, the signal processor and the modelling-related signal processor are both flip-flop-capacitor-type signal processors.

In one of the embodiments, the signal processor and the modelling-related signal processor adopt the gain-boost folded co-source co-gate structure.

In another aspect, an embodiment of the present application provides a processor, where the processor includes the readout circuit of any one of the embodiments above.

In another aspect, the embodiment of the application provides a signal quantizing method, and the signal quantizing method includes receiving electric charge signals output by the integrators, sampling and holding each of the electric charge signals, and performing a processing of analog-digital conversion on the sampled and held electric charge signal, to obtain a quantized result of the electric charge signal.

In another aspect, the embodiment of the application provides a signal quantizing device, and the signal quantizing device includes a receiving module, configured to receive a plurality of electric charge signals, and sample and hold the plurality of electric charge signals, and a quantizing module, configured to perform a processing of analog-digital conversion on the sampled and held electric charge signal, to obtain the quantized result of the electric charge signal.

In another aspect, the embodiment of the application provides a signal randomizing method, which is applicable to the readout circuit, and the signal randomizing method includes sampling object electric charge signals of a plurality of channels, randomizing an order in which the object electric charge signals are held, and holding each of the object electric charge signals in sequence according to the randomized order.

In another aspect, the embodiment of the application provides a signal randomizing device, and the signal randomizing device includes a sampling module, configured to sample object electric charge signals of a plurality of channels, an order processing module, configured to randomize an order in which the object electric charge signals are held, and a holding module, configured to hold each of the object electric charge signals in sequence according to the randomized order.

In another aspect, the embodiment of the application provides a noise restraining method, which is applicable to a readout circuit. The noise restraining method includes processing an object electric charge signal together with interference noise signal to obtain a first processed electric charge signal, the interference noise signal being the noise information generated by the readout circuit, processing the interference noise signal to obtain a second processed electric charge signal, and restraining noise from the first processed electric charge signal and the second processed electric charge signal, to obtain a quantized result of the object electric charge signal.

In another aspect, the embodiment of this application provides a noise restraining device, and the noise restraining device includes a first processing module, configured to process an object electric charge signal together with interference noise signal to obtain a first processed electric charge signal, the interference noise signal being the noise information generated by the readout circuit, a second processing module, configured to process the interference noise signal to obtain a second processed electric charge signal, and a third processing module, configured to restrain noise from the first processed electric charge signal and the second processed electric charge signal, to obtain a quantized result of the object electric charge signal.

In another aspect, the embodiment of the present application provides a computer device, including a memory and a processor. The memory stores a computer program. When executing the computer program, the processor preforms the steps of the method of any one of the embodiments above.

In another aspect, the embodiment of the present application provides a computer-readable storage medium, on which a computer program is stored, and when the computer program is executed, the steps of the method of any one of the embodiments above are executed.

In another aspect, the embodiment of the present application provides a computer product, including a computer program, and when the computer program is executed, the steps of the method of any one of the embodiments above are executed.

The embodiments of the present application provide a readout circuit, a signal quantizing method and a signal quantizing device, and a computer device. The readout circuit includes a signal processor and an analog-digital converter. The sampling input of the signal processor is configured to be connected to the outputs of the integrators corresponding to the plurality of channels respectively. The output of the signal processor is connected to the input of the analog-digital converter. The signal processor is configured to sequentially receive, through the sampling input, the electric charge signals output by the integrators, to sample and hold each of the electric charge signals, and to transmit the sampled and held electric charge signals to the analog-digital converter to obtain the quantized result of the analog signal. Since it is the electric charge signals output by the integrators corresponding to the plurality of channels that the sampling input of the signal processor receives, that is, the signal processor is multiplex for the plurality of channels, thus significantly reducing the power consumption, greatly simplifying the circuit structure, and having better applicability.

Figure 1:
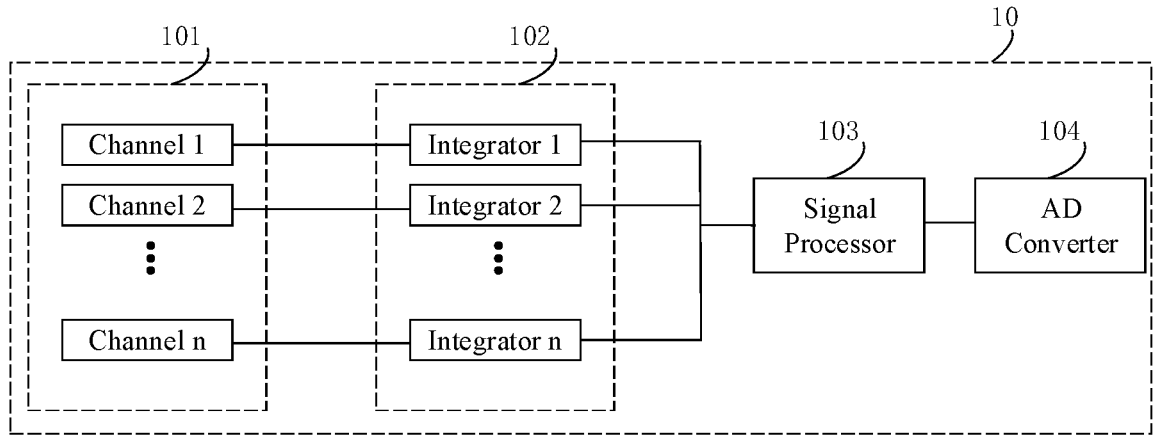
FIG. 1 is a schematic structural view showing a readout circuit according to an embodiment of the present application.

| Description of reference numerals: | |
| --- | --- |
| 10. readout circuit; | 101. signal sampler; |
| 102. integrator; | 103. signal processor; |
| 104. analog-digital converter; | 1030. first operational amplifier; |

| Description of reference numerals: | |
|---|---|
| 1031. sampling capacitor; | 1032. sampling switch; |
| 1033. resetting capacitor; | 1034. resetting switch; |
| 1035. holding switch; | 105. randomizing circuit; |
| 106. modelling-related signal processor; | 1060. second operational amplifier. |

DETAILED DESCRIPTION OF THE EMBODIMENTS

The technical solutions of embodiments according to the present disclosure will be clearly and completely described below in combination with the accompanying drawings of the present disclosure. It will be apparent that the described embodiments are only a part of the embodiments of the present disclosure, rather than all of the embodiments. Based on the embodiments of the present disclosure, all other embodiments obtained by those skilled in the art without creative work also fall within the protection scope the present disclosure.

It should be understood that the terms "first," "second" and the like in the claims, specification and drawings of the present disclosure are used to distinguish different objects, but not intended to describe a specific order. The term "comprising" used in the specification and claims of this application indicates the presence of the described feature, integrity, step, operation, element and/or component, but is not intended to exclude the presence or addition of one or more other features, integrities, steps, operations, elements, components, and/or groups thereof.

It should also be understood that the terms used in the specification of the present disclosure are only for the purpose of describing particular embodiments, but not intended to limit the present application. As used in the specification and claims of the disclosure, unless the context clearly indicates, otherwise the singular forms "a," "an," and "the" are intended to include the plural forms. It should also be further understood that, as used in the specification and claims of the disclosure, the term "and/or" refers to one or more of any combination or possible combinations of the associated listed items, and includes these combinations. As used in this specification and in the claims of the disclosure, the term "if" may be interpreted as "when" or "once" or "in response to determining" or "in response to detecting" from the context. Similarly, the sentences that "if it is determined" or "if it (a described condition or event) is detected" may be interpreted, based on the context, to be that "once it is determined" or "in response to the determination" or "once it (the described condition or event) is detected" or "in response to detection of it (the described condition or event)".

In the related art, in order to improve sensitivity and integration of a sensor, the sensor active front end generally adopts low-voltage and low-power sensitive components, which will cause the output signal to be extremely weak, the amplitudes of a lot of voltage output signals of the sensor to be even less than 1 uv. However, the performance of the subsequent readout circuit of the sensor determines the processing accuracy of the signals sampled by the sensor. The power consumption is a very important index considered in the design of the readout circuit. In order to reduce the power consumption of the readout circuit, the inventors have conducted deep analyses of the structure design of the readout circuit (taking the signal sampler being a photoelectric sensor as an example), and by combining with the structure of the readout circuit in the related art during the analysis, have found following facts.

Firstly, after the photocurrent signal input into each of the plurality of channels of the photoelectric sensor passes through the integrator, it is sampled by the top-plate sampling of the sampling capacitor, and then is processed in the voltage domain by the continual time (CT) unit-gain buffer. Where, the number of the CT unit-gain buffers is the same as the number of the channels of the photoelectric sensor, and the holding time of the sampling capacitors are gradually increased according to channels, and the holding time of the signal of the last CT unit-gain buffer is the longest, which may easily cause the channel noise to increase along with the increase of the sequence numbers of the channels. In addition, since the sampling capacitor adopts the top-plate sampling, the sampling capacitor at the input of the CT unit-gain buffer with a single input will be affected by problems such as a ground bouncing and a digital interference.

Secondly, based on what described firstly above, in order to achieve a maximum utilization of hardware resources, and reduce the mismatch between different channels and improve consistency, the CT unit-gain buffer may be arranged after the multiplexer (MUX). However, in such a connection mode, too long and complex layout wiring of the multi-channel signal link will cause a charge redistribution between the total capacitor of the generated parasitic capacitance and the sampling capacitor, thus reducing the signal amplitude and deteriorating a signal-to-noise ratio of the signal link.

Thirdly, after the photocurrent signal in each of the plurality of channels of the photoelectric sensor passes through the integrator, it is sampled by the sampling capacitor by means of the bottom-plate sampling, and is processed only in the charge domain, and then the signal charges are processed by the flip-flop-capacitor-type signal processor, and which provides a buffering function for the analog-digital converter of the subsequent stage. However, in such a structure, for the multi-channel photoelectric sensor, if each channel is provided with one signal processor, the power consumption of the system will be too large to meet the requirements of low power consumption of the system.

Therefore, how to reduce the power consumption of the system of the readout circuit has become a technical problem to be solved urgently. In view of the above situations, the present application provides a readout circuit, a signal quantizing method and device, and a computer device, which can reduce the power consumption of the readout circuit, improve the signal processing accuracy, greatly simplify the circuit structure, and have better applicability.

The readout circuit provided by the present application, and the implementation process of reading out the analog signal sampled by the signal sampler by using the readout circuit, will be described in detail with reference to the accompanying drawings herein.

In an embodiment, as shown in FIG. 1, an embodiment of the present application provides a readout circuit 10. The readout circuit includes integrators 102 (including an integrate 1 to an integrate n) arranged in a plurality of channels (including a channel 1 to a channel n) respectively, a signal processor 103, and an analog-digital converter 104. The sampling input of the signal processors 103 is connected to the outputs of the integrators 102 (including the integrator 1 to the integrator n) arranged in the plurality of channels (including the channel 1 to channel n) respectively. The signal processor 103 includes a first operational amplifier 1030. The input of the first operational amplifier 1030 is the input of the signal processor 103, and the output of the first operational amplifier 1030 is the output of the signal processor 103. The output of the signal processor 103 is connected to the input of the analog-digital converter 104. The signal processor 103 is configured to sequentially receive, through the sampling input, the electric charge signals output by each of the integrators 102, to sample and hold each of the electric charge signals, and to transmit the sampled and held electric charge signals to the analog-digital converter 104 to obtain a quantized result of the analog signal.

The signal processor 103 is a front-end circuit of the analog-digital converter 104, is mainly configured to sample the analog input and isolate the circuit, to provide relatively lossless noise for the analog-digital converter 104. In the embodiment of the present application, the signals of the same time in the channels are held by the signal processor 103, and then are converted by the common analog-digital converter 104 and sent to a memory connected at the back end. In this way, during the conversion of the analog-digital converter 104, the input signals are held unchanged by the signal processor 103, thus ensuring that a correct converted result may be obtained after the input signals pass the analog-digital converter 104.

Specifically, after the electric charge signals are output from the integrators connected in each channel, the electric charge signals are all input, through the sampling input, into the signal processor 103 in the order of the sequence numbers of the channels. For example, 128 channels are provided, the integrator in each channel outputs an electric charge signal. As such, the signal firstly input to the sampling input of the signal processor 103 is the electric charge signal output by the integrator in the first channel, the following signal is the electric charge signal output by the integrator in the second channel, till the electric charge signal output by the integrator in the 128th channel. Controlled by the input logic levels, the signal processor 103 is in a "sampling" state or a "holding" state. In the "sampling" state, the output of the signal processor 103 follows the input analog signal. In the "holding" state, the output of the signal processor 103 holds an instantaneous input analog signal sampled when the previous sampling ends, till a next sampling state starts.

The electric charge signal output by the signal processor 103 is transmitted into the analog-digital converter 104 connected to the signal processor 103. The analog-digital converter 104 is an electronic component configured to convert an analog signal into a digital signal. That is, after the electric charge signal is input into the analog-digital converter 104, the analog-digital converter 104 converts the electric charge signal into a digital signal and outputs it. The output digital signal is the quantized result of the analog signal of the object device, which is sampled by the signal sampler.

As may be seen from the structure shown in FIG. 1, the plurality of the channels are connected to their respective integrators 102, and all the integrators are connected to the same signal processor 103. That is, in the structure of the readout circuit of the embodiment of the present application, only one signal processor 103 is required to be arranged. The charges output by the integrators of different channels are sequentially sampled and held by the signal processor 103, thus providing a buffer function for the analog-digital converter, till the analog-digital converter at the back end completes converting all signals, and the correct quantized results of the analog signals are obtained.

The readout circuit provided by the embodiment of the present application includes the signal processor and the analog-digital converter. The sampling inputs of the signal processors are connected to the outputs of the integrators arranged in the plurality of channels respectively. The output of the signal processor is connected to the input of the analog-digital converter. The signal processor is configured to sequentially receive, through the sampling input, the electric charge signals output by each of the integrators, to sample and hold each of the electric charge signals, and to transmit the sampled and held electric charge signals to the analog-digital converter to obtain the quantized result of the analog signal. Since it is the electric charge signals output by the integrators in the plurality of channels that the sampling input of the signal processor receives, that is, the signal processor is multiplex for the plurality of channels, thus significantly reducing the power consumption, greatly simplifying the circuit structure, and having better applicability.

That is, the readout circuit provided by the embodiment of the present application uses the multiplex signal processor for the plurality of channels. After being sampled, the analog signals of the object device are transmitted to the respective integrators of the channels, and the integrators will output their respective electric charge signals. These electric charge signals will be input into the signal processor, and the signal processor may receive, through the sampling input, the electric charge signals output by the integrators, and sample and hold each of the electric charge signals, and transmit the sampled and held electric charge signals to the analog-digital converter, so that the electric charge signals are converted by the analog-digital converter to obtain the quantized result of the analog signal. In this way, the use of the multiplex signal processor for the plurality of channels may significantly reduce the power consumption, greatly simplify the circuit structure, and have better applicability, thereby avoiding the defect that the channels with a relatively long hold time have relatively high power consumptions, which are casused in the case that, each of the channels is connected to one buffer to provide a buffering function for the the analog-digital converter, after the collected signal has passed through the integrator and then enter the analog-digital converter.

Based on the above-mentioned embodiments, in an embodiment, please continue to refer to FIG. 1, a signal sampler 101 in the readout circuit 10 includes a plurality of channels (including the channel 1 to the channel n), and each channel of the signal sampler 101 is connected to and provided with one of the integrators 102 (including the integrator 1 to the integrator n). The signal sampler 101 is configured to sample the analog signals of the object device, to transmit the analog signals to the respective integrators 102 in the channels to obtain the electric charge signal output by each of the integrators 102.

The signal sampler 101 is configured to sample analog signals, such as optical signals, photoelectric signals, voice signals, temperature signals, etc. Correspondingly, the signal sampler 101 may be any type of sensors, such as a photoelectric sensor, a voice sensor, a temperature sensor, and the like.

Taking the photoelectric sensor as an example, the signal sampler 101 includes a plurality of channels 101 (including the channel 1 to the channel n), that is, the photoelectric sensor includes the plurality of channels. Usually, for a sensor, a multi-channel sensor is named relative to a single-channel sensor. For example, the difference between the multi-channel sensor and the single-channel sensor is the number of data that they can measure. Generally, the single-channel sensor can measure only one data, and the multi-channel sensor can measure a plurality of data simultaneously. The specific number of channels of the multi-channel sensor is not limited in this embodiment of the present application. For example, 128 channels are provided, that is, n=128.

The signal sampler 101 is configured to sample the analog signals of the object device, and to transmit the analog signals to the respective integrators 102 of the channels to obtain the electric charge signals output by each of the integrators 102. The object device generally refers to any device in any field. For example, in the medical industry, the object device refers to any medical device, including but not limited to magnetic resonance imaging (MRI) equipment, computed tomography (CT) equipment, a X-ray machine, or an ultrasonic imaging device, etc. The type and specific function of the object device are not limited in the embodiment of the present application.

The integrator 102 is a component whose output signal is the integration of the input signal over time. The integrator may be regarded as a counter in a continuous domain, and may accumulate the input and then output the accumulated value. In the embodiment of the present application, each of the channels (including the channel 1 to the channel n) of the signal sampler 101 is connected to one of the integrators 102 (including the integrator 1 to the integrator n), so that the signal sampled by the signal sampler 101 is converted into an electric charge signal by the integrator. For example, the photoelectric signal sampled by the photoelectric sensor is converted into an electric charge signal by the integrator.

In this embodiment, the signal sampler includes the plurality of channels, and each of the plurality of the channels is connected to an integrator correspondingly. The analog signals sampled by the signal sampler are input into the respective integrators of the channels through the corresponding channels. In this way, the analog signals are converted by the integrators of the plurality of channels, thus obtaining the electric charge signal corresponding to each channel, and ensuring the signal conversion efficiency. Further, after the plurality of channels of the signal sampler are connected to their respective integrators, all integrators are connected to the same signal processor. Because the plurality of channels of the signal sampler are connected to their respective integrators, and the outputs of all integrators are connected to the sampling input of the same signal processor, in this way, the signal processor is multiplex for the plurality of channels, thus significantly reducing the power consumption of during the signal quantization.

For the implementation of the signal processor 103, in an embodiment, the signal processor 103 in this embodiment of the present application is a flip-flop-capacitor-type signal processor. In an embodiment, the signal processor 103 has a gain-boost folded co-source co-gate structure.

The flip-flop-capacitor-type structure is a fully differential structure, which may well eliminate a DC bias and an even-order harmonic distortion, and restrain common-mode noise from the substrate. Moreover, the feedback coefficient of the flip-flop-capacitor-type structure is 1, so under the condition of the same closed-loop bandwidth, the unit gain bandwidth (GBW) of the operational amplifier required by the flip-flop-capacitor-type structure is relatively small. Therefore, the flip-flop-capacitor-type structure of the embodiment of the present application may further reduce the final power consumption of the readout circuit.

The first operational amplifier 1030 is the most important module of the signal processor 103, and the gain and the bandwidth of the first operational amplifier directly determine the accuracy and the speed of the signal processing. A multi-stage amplifier, a relatively small bias current, and a long-channel device are required for the relatively high gain, while a single-stage amplifier, a relatively large bias current, and a short-channel device are required for the relatively large bandwidth. In view of these requirements, in the embodiment of the present application, the first operational amplifier 1030 of the signal processor 103 adopts the gain-boost folded co-source co-gate structure, thereby improving the gain of the amplifier, and meeting the requirements of the relatively high gain and the relatively large bandwidth. In the embodiment of the present application, the gain-boost folded co-source co-gate structure may be used, which enables the low-frequency gain and the bandwidth of the signal processor 103 to be large enough, thereby meeting the requirements for the establishment accuracy and the speed of the analog-digital converter.

Based on the embodiments above, the connection structure of the signal processor 103, and the sampling and holding process of the signal processor 103 will be described in detail in several embodiments herein.

Figure 2:
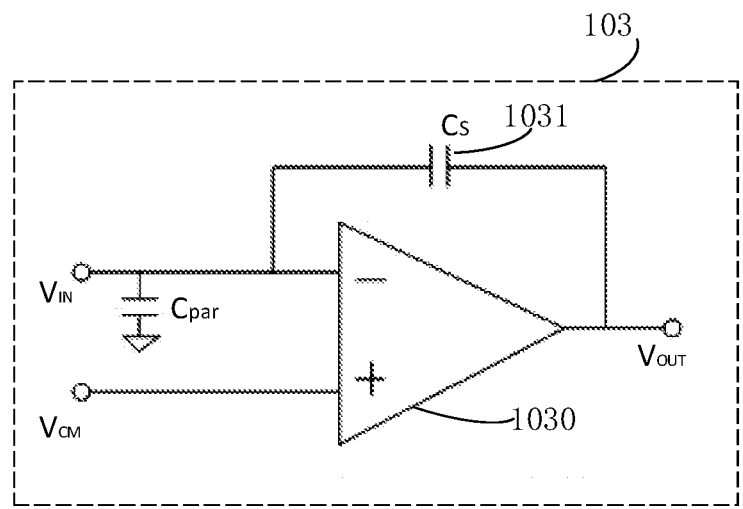
FIG. 2 is a schematic structural view showing a signal processor of the readout circuit according to an embodiment of the present application.

As shown in FIG. 2, in an embodiment, the signal processor 103 further includes a sampling capacitor 1031. A first terminal of the sampling capacitor 1031 is connected to a sampling input $V_{IN}$ of the signal processor 103, and a second end of the sampling capacitor 1031 is connected to an output $V_{OUT}$ of the signal processor 103. The sampling capacitor 1031 is configured to be charged according to the electric charge signal of a current channel received by the sampling input $V_{IN}$, and to hold the electric charge signal in the sampling capacitor 1031 while the analog-digital converter 104 is converting the electric charge signal of the previous channel.

The first operational amplifier 1030 needs to be externally connected to the sampling capacitor 1031 to realize the sampling and holding function. Specifically, referring to FIG. 2, a first terminal of the sampling capacitor 1031 is connected to the sampling input $V_{IN}$ of the signal processor 103, and a second terminal of the sampling capacitor 1031 is connected to the output $V_{OUT}$ of the signal processor.

During operation, the signal processor 103 is in the "sampling" state or in the "holding" state. In the "sampling" state, the electric charge signal output by the integrator 102 of the current channel is input into the sampling capacitor 1031 connected to the first operational amplifier 1030 through the sampling input $V_{IN}$. At this time, an output voltage Vo at the output $V_{OUT}$ may follow the input signal Vi at the input $V_{IN}$, and the voltage of the sampling capacitor 1031 is the same as the input voltage at the input terminal $V_{IN}$.

In the "holding" state, the sampling capacitor 1031 is neither charged nor discharged any longer, and at the instant of the "sampling" state being switched to the "holding" state, it means that the analog-digital converter 104 is converting the electric charge signal of the previous channel. During the conversion, the sampling capacitor 1031 is neither charged nor discharged, and the electric charge signal is held in the sampling capacitor 1031. At this time, the value of the input signal Vi at the sampling input $V_{IN}$ remains unchanged, and the output voltage Vo at the output $V_{OUT}$ of the signal processor 103 may also remain a constant output value for a long time till the "holding" state is switched to the "sampling" state. In this way, after the "sampling" state is switched to the "holding" state, and while the analog-digital converter 104 is converting the signal, the input signal is held unchanged by the sampling capacitor 1031, so that the analog-digital converter 104 converts the signal correctly, thereby greatly improving the signal processing accuracy.

Figure 3:
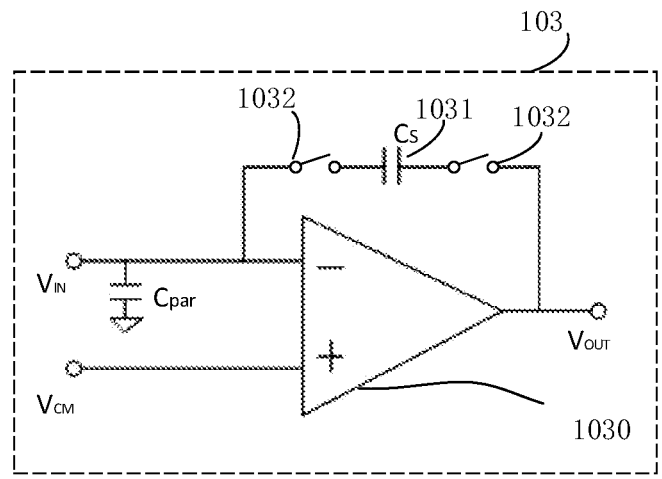
FIG. 3 is a schematic structural view showing the signal processor of the readout circuit according to another embodiment of the present application.

In an embodiment, as shown in FIG. 3, the signal processor 103 further includes sampling switches 1032, two terminals of the sampling capacitor 1031 each are connected to one of the sampling switches 1032. The sampling switches 1032 are configured to be turned on when the sampling capacitor 1031 is charged or discharged. In an embodiment, the sampling mode of the sampling capacitor 1031 is the bottom-plate sampling.

While being switched from the "sampling" state to the "holding" state, the sampling capacitor 1031 may be controlled, by setting the sampling switches 1032, neither to be charged nor discharged any longer. In this embodiment, two terminals of the sampling capacitor 1031 each are connected to one of the sampling switches 1032.

In the "sampling" state, when the control signal controls the sampling switches 1032 to be turned on, the sampling capacitor 1031 is charged or discharged, that is, the input signal Vi at the sampling input $V_{IN}$ is input, through the sampling input $V_{IN}$, into the sampling capacitor 1031 connected to first operational amplifier 1030. At this time, the output voltage Vo at the output $V_{OUT}$ may follow the input signal Vi at the input terminal $V_{IN}$, and the voltage of the sampling capacitor 1031 is the same as the input voltage at the input terminal $V_{IN}$.

In the "holding" state, the control signal controls the sampling switch 1032 to be turned off, which is equivalent that the sampling capacitor 1031 is only connected to a high-impedance input of the signal processor 103, the sampling capacitor 1031 is neither charged nor discharged any longer, and the electric charge signal is held in the signal processor 103. At this time, the value of the input signal Vi at the sampling input $V_{IN}$ remains unchanged, and the output voltage Vo at the output $V_{OUT}$ of the signal processor 103 may also remain a constant output value for a long time, till the control signal controls the sampling switches 1032 to be turned on, and then the "holding" state is switched to the "sampling" state.

In this embodiment, while being switched from the "sampling" state to the "holding" state, the sampling capacitor 1031 may be controlled, by the sampling switches 1032, to be switched from being charged or discharged to neither being charged nor discharged any longer, so that while the analog-digital converter 104 is converting signals, the input signal is held unchanged by the sampling capacitor 1031 to ensure that the analog-digital converter 104 converts the signals correctly, thereby greatly improving the signal processing accuracy.

Figure 4:
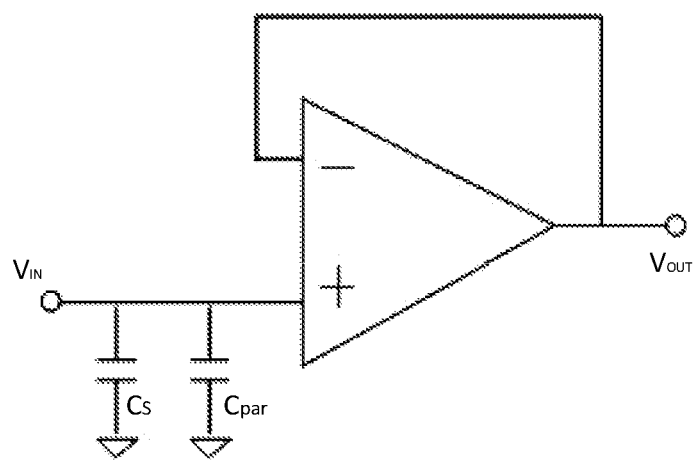
FIG. 4 is a schematic structural view showing a gain buffer of the readout circuit in the related art.

In addition, in the related art, one CT unit-gain buffer, a structure of which is shown in FIG. 4, is connected to each channel to provide a buffering function for the analog-digital converter, after the analog signal collected by the signal sampler 101 has passed through the integrator and then enter the analog-digital converter. In this case, only the top-plate sampling can be configured to process signals in the voltage domain. If the CT unit-gain buffer is arranged after a data selector and arranged to be multiplex for the plurality of channels, then when the product is implemented, the multi-channel layout wiring will cause a charge redistribution between the total parasitic capacitor (Cpar) and the sampling capacitor (Cs), thus reducing the amplitude of the signal at the node $V_{IN}$ and deteriorating the signal-to-noise ratio of the signal channel, and also reducing the feedback coefficient of the CT unit-gain buffer, thereby reducing the loop gain of the CT unit-gain buffer, resulting in the degradation of the signal establishing accuracy and the degradation of the bandwidth.

Compared with the related art, when the sampling capacitor 1031 of the embodiment of the present application is in the sampling state, it may sample by means of the bottom-plate sampling, and the signal may be processed in the charge domain by means of the bottom-plate sampling, and the signal processor 103 adopts the flip-flop-capacitor-type signal processor. Please continue to refer to FIG. 3, in this structure, the feedback coefficient of the signal processor 103 may be reduced. In this way, when the actual product is implemented, according to the principle of charge conservation, the total parasitic capacitor Cpar caused by the layout wiring of the multiplex signal processor 103 will not cause the reduction of the signal-to-noise ratio of the signal channel. As long as the signal of the signal processor 103 is fully established, the point potential at the sampling input $V_{IN}$ is equal to that at the common-mode voltage terminal $V_{CM}$ of the signal processor 103, and the electric charge signals will be completely held in the sampling capacitor 1031, thereby guaranteeing the integrity of the signals and the sampling accuracy to the maximum extent.

In addition, in practical applications, when the readout circuit of the above structure is implemented in form of a product, the parasitic capacitance caused by the layout wiring of multiplex circuit board may be reduced as much as possible by rationally arranging the layout wiring of the circuit board. The detailed rational arrangement of the layout wiring of the circuit board is not limited in the embodiments of the present application, and the wiring may be arranged according to actual needs during implementation of the product.

When the multiplex signal processor continuously processes the signal charges of the plurality of channels, the memory effect of the signal processor will cause mutual interference between the plurality of channels, which affects the accuracy of signal processing. In view of this, in order to reduce the mutual interference between a plurality of channels caused by the memory effect of the signal processor, the embodiment of the present application further provides a readout circuit.

Figure 5:
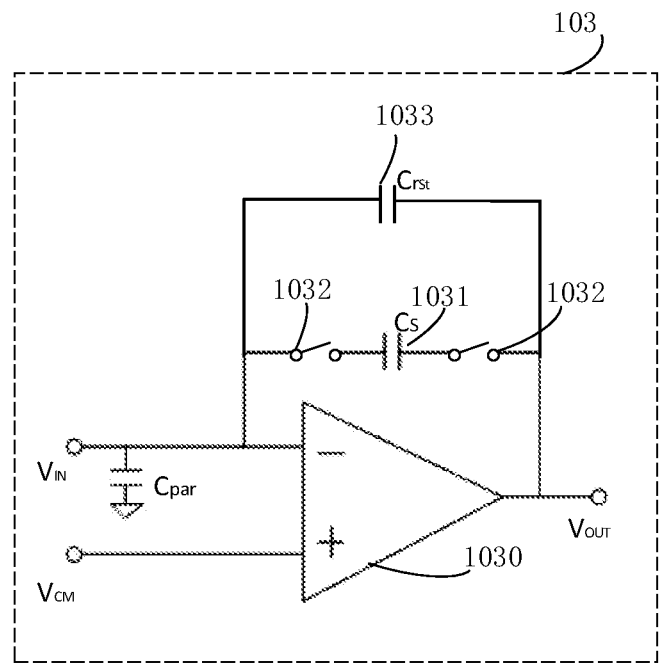
FIG. 5 is a schematic structural view showing the signal processor of the readout circuit according to yet another embodiment of the present application.

As shown in FIG. 5, in an embodiment, the signal processor 103 includes a resetting capacitor 1033. The first terminal of the resetting capacitor 1033 is connected to the sampling input $V_{IN}$ of the signal processor 103, and the second terminal of the resetting capacitor 1033 is connected to the output $V_{OUT}$ of the signal processor 103. After the electric charge signal of one channel is processed, the resetting capacitor 1033 resets the voltage at the sampling input $V_{IN}$ of the signal processor 103 to the initial input voltage, and resets the voltage at the output $V_{OUT}$ of the signal processor 103 to the initial output voltage.

Based on any one of the embodiments above, in this embodiment, the memory effect of the signal processor 103 is eliminated by connecting the resetting capacitor 1033. Illustratively, taking the resetting capacitor 1033 connected in the embodiment of FIG. 3 as an example, please continue to refer to FIG. 5, the first terminal of the resetting capacitor 1033 is connected to the sampling input $V_{IN}$ of the signal processor 103, and the second terminal of the resetting capacitor 1033 is connected to the output $V_{OUT}$ of the signal processor 103. In this way, after the sampling capacitor 1031 finishes processing the signal of one channel, the input and the output of the signal processor 103 are reset to the initial values by the resetting capacitor 1033, that is, the voltage at the sampling input $V_{IN}$ of the signal processor 103 is reset to the initial input voltage, and the voltage at the output $V_{OUT}$ of the signal processor 103 is reset to the initial output voltage, thereby avoiding the mutual interference between the plurality of channels caused by the memory effect of the signal processor. It may be understood that the initial values herein are the voltage values of the signal processor 103 in the initial state and may be obtained in advance.

Figure 6:
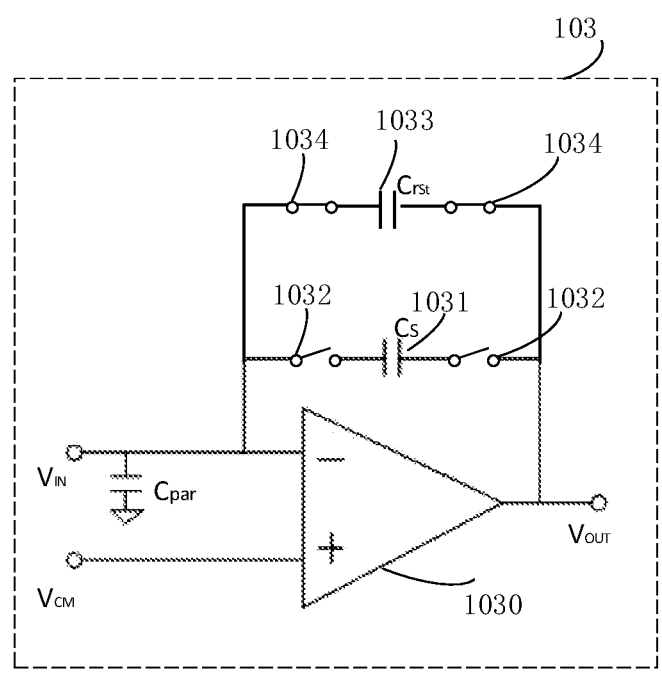
FIG. 6 is a schematic structural view showing the signal processor of the readout circuit according to yet another embodiment of the present application.

In an embodiment, as shown in FIG. 6, the signal processor 103 further includes resetting switches 1034, and two terminals of the resetting capacitor 1033 each are connected to one of the resetting switches 1034. The resetting switches 1034 are turned on when the resetting capacitor 1033 is resetting (FIG. 6 shows a turn-on state of the resetting switches).

The resetting capacitor 1033 resets once after each processing for the signal of one channel is finished, to eliminate a residual memory of the previous processing for the signal of the channel, which remains in the signal processor 103, and to avoid affecting the signal processing accuracy. However, the resetting capacitor 1033 needs not to perform the reset function while the same electric charge signal of one channel is being processed. The reset function of the resetting capacitor 1033 may be implemented by setting the resetting switches 1034, and the resetting switches 1034 are controlled to be turned on and off by the logic control signals.

Specifically, the resetting switches 1034 are turned on when the resetting capacitor 1033 is resetting, and turned off when the resetting capacitor 1033 needs not to perform the reset function. It may be understood that, taking the sampling capacitor 1031 in the "sampling" state and finishing processing one signal of one channel as an example, the reset function of the resetting capacitor 1033 is performed when the sampling capacitor 1031 is switched from being in the "sampling" state to being in the "holding" state, that is, the resetting switches 1034 for the resetting capacitor 1033 and the sampling switches 1032 for the sampling capacitor 1031 cannot be turned on or turned off simultaneously. That is, when the resetting switches 1034 for the resetting capacitor 1033 are turned off, the sampling switches 1032 for the sampling capacitor 1031 are turned on, and when the resetting switches 1034 for the resetting capacitor 1033 are turned on, the sampling switches 1032 for the sampling capacitor 1031 are turned off.

Figure 7:
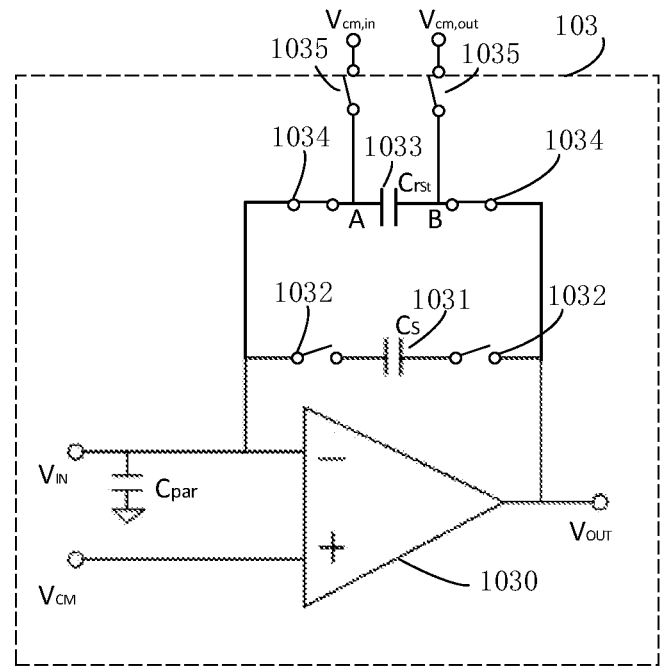
FIG. 7 is a schematic structural view showing the signal processor of the readout circuit according to yet another embodiment of the present application.

In addition, as shown in FIG. 7, in another embodiment, the signal processor 103 further includes holding switches 1035. One holding switch 1035 is arranged between the first terminal of the resetting capacitor 1033 and the common-mode voltage input terminal $V_{cm,in}$, and another holding switch 1035 is arranged between the second terminal of the resetting capacitor 1033 and the common-mode voltage output terminal $V_{cm,out}$. The holding switches 1035 are turned on when the signal processor 103 is in the holding state.

When the sampling capacitor 1031 is in the sampling state, the holding switches 1035 are controlled to be turned on by the control signal, so that the voltages at two terminals (points A and B in FIG. 7) of the resetting capacitor 1033 are reset to the input common-mode voltage and the output common-mode voltage of the signal processor 103, respectively. That is, the voltage at the point A is reset to be the same as the input common-mode voltage at the common-mode voltage input $V_{cm,in}$ of the signal processor 103, and the voltage at the point B is reset to be the same as the output common-mode voltage at the common-mode voltage output $V_{cm,out}$ of the signal processor 103. In this way, it can be ensured that, before and after the capacitor is flip-flopped, the direct-current operating points of the signal processor 103 (of the flip-flop-capacitor type) are the same, thus preventing the signal processor 103 from deviating from a normal working state to affect the establishing of the output signal.

Figure 8:
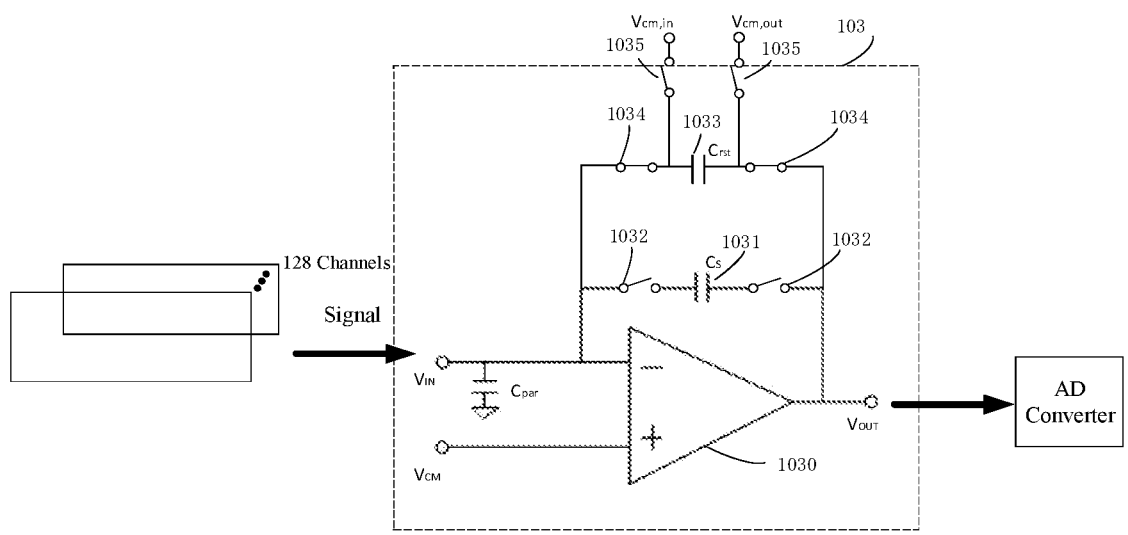
FIG. 8 is a schematic structural view showing the readout circuit according to another embodiment of the present application.

Referring to FIG. 8, taking the number of channels being 128 as an example, based on FIG. 7, it is illustrated that the electric charge signals output from the integrators of channels are input sequentially through the sampling input $V_{IN}$. The signals are first converted into electric charge signals by the integrators, and then are input into the flip-flop-capacitor-type signal processor 103 through the sampling input $V_{IN}$. The sampling capacitor 1031 (Cs) samples the electric charge signals output from the integrators by means of the bottom-plate sampling, and then based on the principle of charge conservation, completes holding the signal, and provides the buffering function for the analog-digital converter connected in the subsequent stage. Since the same signal processor is multiplex by the multi-channel circuit, the highest utilization coefficient of the power consumption is achieved, thereby realizing the readout of the sensor signal at a lower power consumption. Moreover, the arrangement of the resetting capacitor may reduce the memory effect of the signal processor, thereby achieving a high-precision quantized result of a current signal of the sensor.

In practical applications, during the design of the readout circuit, if each pixel (pixel channel) is quantized by a separate dedicated analog-digital converter (ADC), then all pixels may be sampled, processed, quantized, and read out simultaneously, which improves the efficiency of sampling, processing, quantizing, and reading out the analog signal. However, in this design, since one analog-digital converter is dedicated to one channel, when the product is implemented, in the top-layer bus of the layout, the analog power ground, the precise reference voltage source, and the digital signal of each pixel need to be led out. In this way, in the layout wiring, it is difficult to separate the sensitive analog signals from the digital signals, which will inevitably cause the digital signals to interfere with the sensitive analog signals. Moreover, due to the deep nanoscale process, the power consumption of the digital signal is getting lower along with the increase of the frequency, so that, compared with the power consumption of the low-speed ADC, the power consumption of the high-speed ADC is not increased proportionally to the sampling frequency. Therefore, when implementing the readout circuit, the quantizing method by adopting the separate dedicated ADC for each pixel will increase the area of the chip, increase the cost, and increase the power consumption.

In view of this, after analysis, it is found that the analog-digital converter may be multiplex, and the signal processor may also be multiplex to achieve the highest utilization coefficient of the power consumption and reduce costs. However, when the readout circuit is designed by this method, since the sampling times of the electric charge signals of all channels in the readout circuit are identical, but the times of quantizing the sampled signals in the analog-digital converter at the back end are different, therefore the times took for the charges sampled by different capacitors to wait for being quantized will be different, and when the signal is large, the difference of the waiting times will cause the leakage of the charges on the sampling capacitor, thus causing an error of a fixed trend between the plurality of channels. The error may affect the quality of the image produced by the finally-read-out analog signal.

Figure 9:
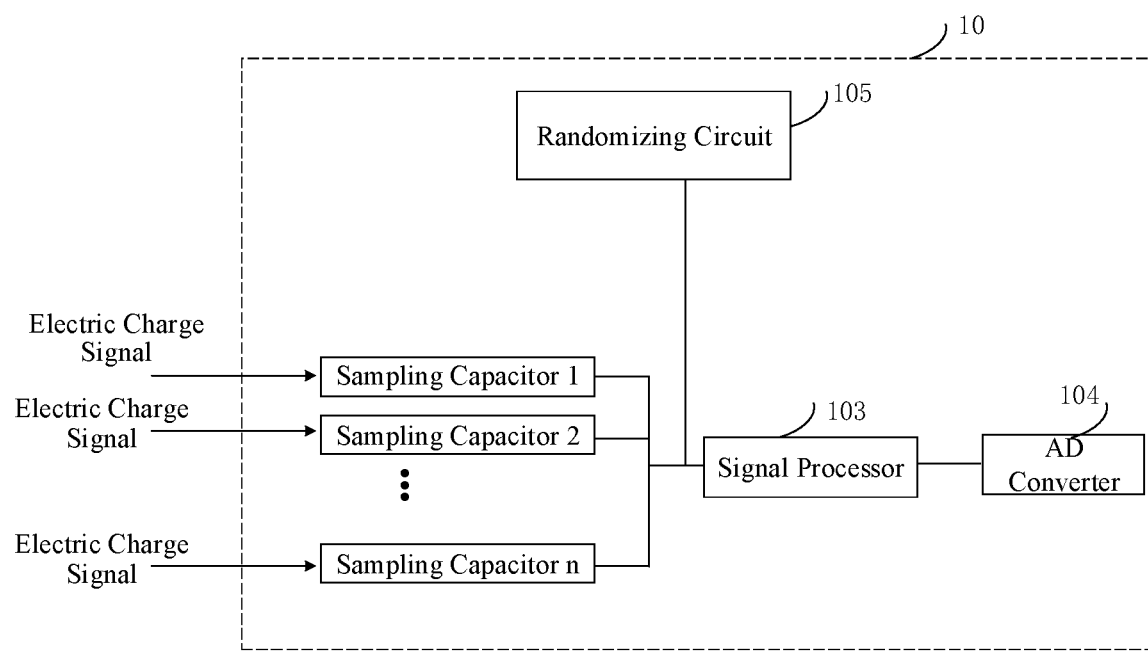
FIG. 9 is a schematic structural view showing the readout circuit according to yet another embodiment of the present application.

Therefore, in view of the error caused between the plurality of channels in the readout circuit, which will result in the technical defect of poor quality of the finally produced image, an embodiment of the present application further provides a readout circuit, to effectively reduce the error between the channels in the readout circuit, improve the readout accuracy of the analog signal, and further improve the image quality. As shown in FIG. 9, based on any one of the embodiments above, the readout circuit 10 further includes a randomizing circuit 105, and a plurality of third sampling capacitors (including the sampling capacitor 1 to the sampling capacitor n). At least one of the plurality of third sampling capacitors correspondingly samples the electric charge signal output by the integrator of each channel. The randomizing circuit 105 is configured to randomize the order in which the sampling capacitors are flip-flopped to the signal processor 103, and the signal processor 103 is further configured to hold the electric charge signals sampled by the sampling capacitors (including the capacitor 1 to the capacitor n) in sequence according to the randomized order, and transmit the held electric charge signals to the analog-digital converter 104 to obtain the quantized result of the electric charge signals.

Where, for the plurality of third sampling capacitors (including the capacitor 1 to the capacitor n), n may be 10, that is, ten channels are arranged in the readout circuit, and ten third sampling capacitors are provided correspondingly. The plurality of third sampling capacitors each are connected to the input of the signal processor 103, and the output of the signal processor 103 is connected to the input of the analog-digital converter 104. In such a connection manner, the signal processor and the analog-digital converter in the readout circuit are multiplex for the plurality of channels, thereby reducing the power consumption and the cost of the readout circuit.

Generally, the function of the signal processing circuit is to accurately sample the analog signal in the sampling state, and to hold the sampled result for a certain time period in the holding state and then send it to the analog-digital converter 104 to have it quantized, thereby improving the processing capability of the analog-digital converter for the signals input at a relatively high frequency. That is, the signal processing circuit is a front-end circuit of the analog-digital converter, and is configured to mainly sample the analog input and isolate the circuit, thereby providing relatively lossless noise for the analog-digital converter. In the embodiment of the present application, the electric charge signals are held by the signal processor, so that the correct quantized results of the electric charge signals may be obtained after the electric charge signals are converted by the analog-digital converter at the back end.

At least one of the plurality of third sampling capacitors correspondingly samples the electric charge signal of at least one channel, and the electric charge signal is obtained from the analog signal.

Specifically, in practical applications of the readout circuit 10, at least one of the plurality of third sampling capacitors correspondingly samples the electric charge signal of at least one channel, or each sampling capacitor correspondingly samples the electric charge signal of one channel. The electric charge signal refers to a signal obtained by converting the analog signal. For example, an analog signal of a medical device is sampled by the signal sampler, and the analog signal is converted, by means of integration and the like, into the electric charge signal.

After being obtained, the electric charge signal of each channel needs to be sampled and held in the signal processor. The first operational amplifier 1030 is connected to the sampling capacitors to realize the sampling and holding function jointly. The signal processor 103 is controlled, by the input logic levels, to be in the "sampling" state or in the "holding" state. In the "sampling" state, the output of the circuit follows the input analog signal, and in the "holding" state, the output of the circuit holds the analog signal instantaneously input at the moment that the previous sampling ends, till the signal processor enters the next sample state.

Figure 10:
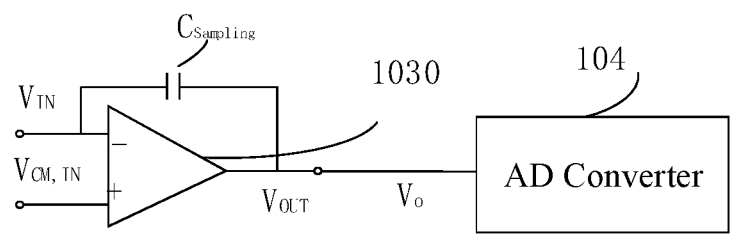
FIG. 10 is a schematic structural view showing the signal processor in the readout circuit according to an embodiment of the present application.

Please refer to FIG. 10, FIG. 10 illustrates the connection between the capacitor and the first operational amplifier 1030 in the signal processor1. For the sake of clarity, only one sampling capacitor $C_{sampling}$ is shown in FIG. 10 as an example. It should be understood that the connection of each of other sampling capacitors is the same as the connection shown in the schematic view.

That is, as shown in FIG. 10, the first terminal of the sampling capacitor is connected to the sampling input $V_{IN}$ of the first operational amplifier 1030, namely the sampling input $V_{IN}$ of the signal processor 103, and the second terminal of the sampling capacitor is connected to the output $V_{OUT}$ of the first operational amplifier 1030, namely the output $V_{OUT}$ of the signal processor 103.

Based on this connection manner, the sampling capacitor may be charged according to the electric charge signal, and the sampled electric charge signal may be transmitted to the analog-digital converter 104 by means of the output $V_{OUT}$ of the signal processor 103.

Specifically, during operation, the signal processor 103 and the sampling capacitor are in the "sampling" state or in the "holding" state. In the "sampling" state, that is, the electric charge signal is input, through the sampling input $V_{IN}$, into the sampling capacitor connected to the signal processor 103. It should be understood that the electric charge signal of each channel is used to charge the corresponding sampling capacitor. The charging process may be understood as the process of sampling the electric charge signal of the corresponding channel by the sampling capacitor. At the same time, the output voltage Vo at the output $V_{OUT}$ of the signal processor 103 may follow the input signal Vi at the input $V_{IN}$, and the voltage of the sampling capacitor is the same as the input voltage at the sampling input $V_{IN}$.

In the "holding" state, the sampling capacitor is neither charged nor discharged any longer, and when the "sampling" state is switched to the "holding" state, it indicates that the analog-digital converter 104 is currently converting signal. During the conversion, the sampling capacitor is neither charged nor discharged any longer, and the electric charge signal is held in the sampling capacitor. At the same time, the value of the input signal Vi at the sampling input $V_{IN}$ of the signal processor 103 remains unchanged, and the output voltage Vo at the output $V_{OUT}$ of the signal processor 103 remains a constant output for a very long time until the signal processor 103 is switched from being in the "holding" state to being in the "sampling" state.

In this way, when the "sampling" state is switched to the "holding" state, that is, while the analog-digital converter 104 is converting the signal, the input signal is held unchanged by the sampling capacitor, so that the analog-digital converter 104 may correctly convert the signal, thereby greatly improving the signal processing accuracy.

In addition, as may be seen from FIG. 10, the signal processor 103 also has a common-mode voltage input $V_{CM, IN}$. The common-mode voltage input by the common-mode voltage input $V_{CM, IN}$ may be regarded as a reference voltage, a specific value of which may be pre-defined according to the actual situation. As may be obtained in FIG. 10, $Vo = V_{IN} - V_{CM, IN}$.

In an embodiment, the signal processor 103 in this embodiment of the present application is a flip-flop-capacitor-type signal processor. The flip-flop-capacitor-type structure is a fully differential structure, which may well eliminate a DC bias and an even-order harmonic distortion, and restrain common-mode noises from the substrate. Moreover, the feedback coefficient of the flip-flop-capacitor-type structure is 1, so in the case of the same closed-loop bandwidth, the unit gain bandwidth (GBW) of the operational amplifier required by the flip-flop-capacitor-type structure is relatively small. Therefore, the flip-flop-capacitor-type structure of the embodiment of the present application may further reduce the final power consumption of the readout circuit.

Based on this, when the signal processing circuit implements "sampling" and "holding", the sampling capacitor corresponding to each channel will be flip-flopped to the signal processor 103. However, if it is configured that the sampling capacitor corresponding to each channel is flip-flopped to the signal processor 103 at a fixed order, then the time took for the electric charge signal sampled by each sampling capacitor to wait for being quantized by the analog-digital converter at the back end is different, thus causing a fixed error between the quantized values of the analog signals read out from all channels. That is, there is a fixed error in the image generated according to the finally read-out analog signal, thus causing the poor quality of the final image.

In the embodiment of the present application, the randomizing circuit 105 is configured to randomize the order in which the sampling capacitor corresponding to each channel is flip-flopped to the flip-flop-capacitor-type signal processor, so that the sampling capacitor samples and holds in an unfixed order, and the waiting time for each of the sampling capacitors of all channels is random, that is, the fixed noise in the finally generated image is converted into white noise, which makes it difficult for human eyes to recognize, thereby improving the quality of the image.

In order to describe the implementation principle and the function of the randomizing circuit 105 above in detail, a readout circuit is provided hereinafter. In the readout circuit, the object electric charge signal represents the electric charge signal output by the integrator in the embodiments above. The signal processor 103 and the sampling capacitors (including the capacitor 1 to the capacitor n) belonging to the signal processing circuit are taken as an example.

Figure 11:
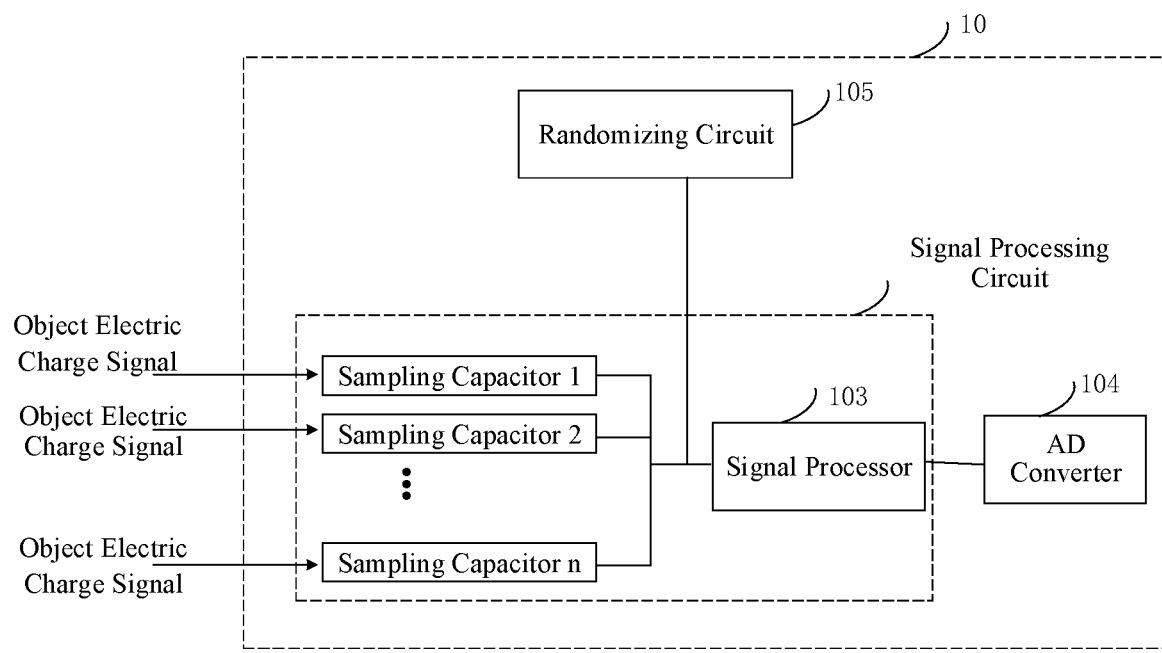
FIG. 11 is a schematic structural view showing the readout circuit according to yet another embodiment of the present application.

In an embodiment, as shown in FIG. 11, an embodiment of the present application provides a readout circuit 10. The readout circuit 10 includes the randomizing circuit 105, a signal processing circuit, and the analog-digital converter 104. The signal processing circuit includes a plurality of third sampling capacitors (including the capacitor 1 to the capacitor n) and a signal processor 103. At least one of the plurality of third sampling capacitors correspondingly samples the object electric charge signal of at least one channel. The randomizing circuit 105 is configured to randomize the order in which the sampling capacitors are flip-flopped to the signal processor. The signal processor 103 is configured to hold the object electric charge signals sampled by the sampling capacitors in the randomized order, and to transmit the held object electric charge signals to the analog-digital converter 104 to obtain the quantized result of the object electric charge signals.

Please refer to FIG. 11, the signal processing circuit includes the plurality of third sampling capacitors (including the capacitor 1 to the capacitor n) and the signal processor 103. Where, for the plurality of third sampling capacitors (including the capacitor 1 to the capacitor n), n may be 10, that is, ten channels are arranged in the readout circuit, and ten third sampling capacitors are provided correspondingly. The plurality of third sampling capacitors each are connected to the input of the signal processor 103, and the output of the signal processor 103 is connected to the input of the analog-digital converter 104. In such a connection manner, the signal processor and the analog-digital converter in the readout circuit are multiplex for the plurality of channels, thereby reducing the power consumption and the cost of the readout circuit.

Generally, the function of the signal processing circuit is to accurately sample the analog signal in the sampling state, and hold the sampled result for a certain period of time in the holding state and then send it to the analog-digital converter 104 to have it quantized, thereby improving the processing capability of the analog-digital converter for the signals input at a relatively high frequency. That is, the signal processing circuit is the front-end circuit of the analog-digital converter, and is configured to mainly sample the analog input and isolate the circuit, thereby providing relatively lossless noise for the analog-digital converter. In the embodiment of the present application, the object electric charge signals are held by the signal processor, so that the correct quantized results of the analog signals may be obtained after the object electric charge signals are converted by the analog-digital converter at the back end.

At least one of the plurality of third sampling capacitors (including the capacitor 1 to the capacitor n) correspondingly samples the object electric charge signal of at least one channel, and the object electric charge signal is obtained based on the analog signal.

Specifically, in practical applications of the readout circuit 10, at least one of the plurality of third sampling capacitors (including the capacitor 1 to the capacitor n) correspondingly samples the object electric charge signal of at least one channel, or each of the sampling capacitors (including the capacitor 1 to the capacitor n) correspondingly samples the object electric charge signal of one channel. The object electric charge signal refers to a signal obtained by converting the analog signal. For example, an analog signal of a medical device is sampled by the signal sampler, and the object electric charge signal is the electric charge signal obtained by converting the analog signal by means of integration and the like.

Figure 12:
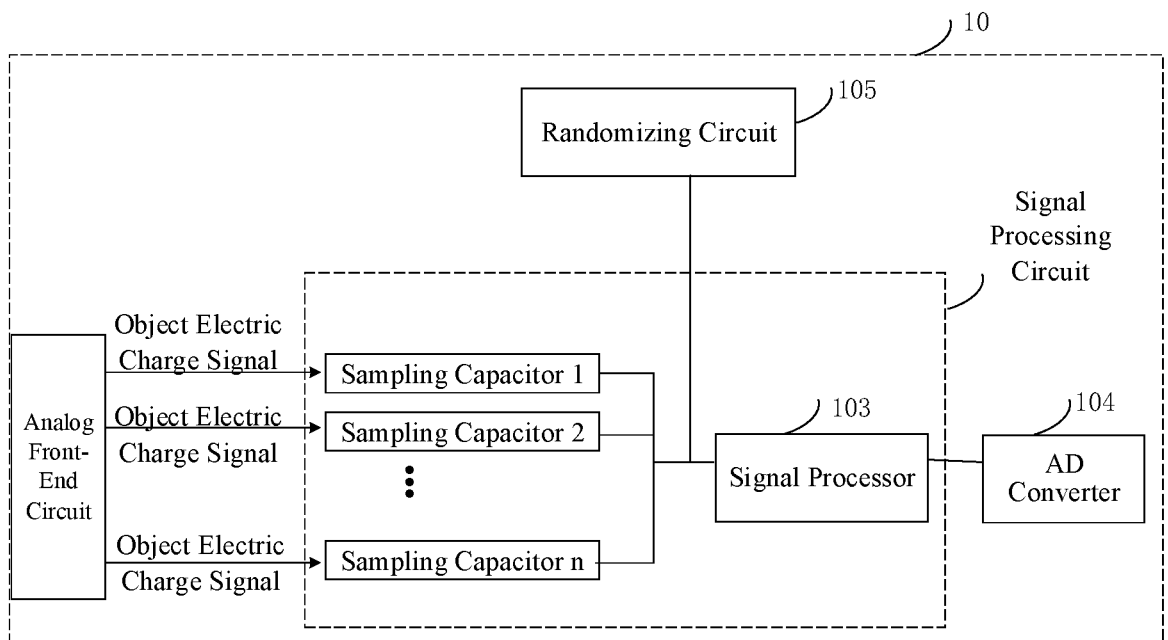
FIG. 12 is a schematic structural view showing the readout circuit according to yet another embodiment of the present application.

In an embodiment, the circuit that converts the analog signal into the object electric charge signal is called an analog front-end circuit. As shown in FIG. 12, in this embodiment, the readout circuit 10 further includes the analog front-end circuit, which is configured to sample the analog signal of the object device and convert the analog signal into the object electric charge signal.

The object device generally refers to any device in any field, for example, in the medical industry, the object device refers to any medical device, including but not limited to the magnetic resonance imaging (MRI) equipment, the computed tomography (CT) equipment, the X-ray machine, or the ultrasonic imaging device, etc. The type and specific function of the object device are not limited in the embodiments of the present application. Then the analog signals sampled from the object device may be optical signals, photoelectric signals, voice signals, temperature signals, etc.

The analog front-end circuit converts the analog signal to obtain the object electric charge signal. The specific structure of the analog front-end circuit is not limited in the embodiments of the present application, and it may be implemented by a chip that stores a control program in advance or a combination of an integrator and a signal sampler.

After the object electric charge signal of each channel is obtained, the object electric charge signal needs to be sampled and held by the signal processing circuit. The signal processor 103 and the sampling capacitors (including the capacitor 1 to the capacitor n) in the signal processing circuit are connected to realize the sampling and holding function jointly. Controlled by the input logic levels, the signal processing circuit is in the "sampling" state or the "holding" state. In the "sampling" state, the output of the signal processing circuit follows the input analog signal. In the "holding" state, the output of the signal processing circuit holds an instantaneous input analog signal sampled when the previous sampling ends, till the next sampling state starts.

Figure 13:
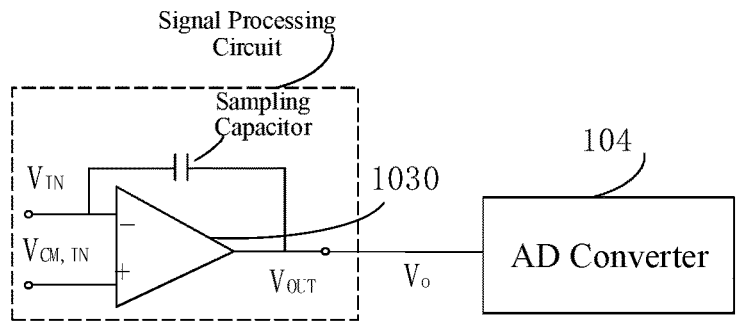
FIG. 13 is a schematic structural view showing a signal processing circuit in the readout circuit according to an embodiment of the present application.

Please refer to FIG. 13. FIG. 13 illustrates the connection mode between the capacitor and the signal processor in detail. For the sake of clarity, only one sampling capacitor is shown in FIG. 13 as an example. It should be understood that the connection mode of each of other sampling capacitors is the same as the connection mode shown in the schematic view.

That is, as shown in FIG. 13, the first terminal of each of the third sampling capacitors (including the capacitor 1 to the capacitor n) is connected to the sampling input $V_{IN}$ of the signal processor 103, and the second terminal of each of the third sampling capacitors (including the capacitor 1 to the capacitor n) is connected to the output $V_{OUT}$ of the signal processor 103.

Based on this connection manner, each of the third sampling capacitors (including the capacitor 1 to the capacitor n) may be charged according to the object electric charge signal, and the sampled object electric charge signal may be transmitted to the analog-digital converter 104 by means of the output $V_{OUT}$ of the signal processor 103.

Specifically, during operation, the signal processor 103 and each of the third sampling capacitors (including the capacitor 1 to the capacitor n) are in the "sampling" state or in the "holding" state. In the "sampling" state, that is, the object electric charge signal is input, through the sampling input $V_{IN}$, into the sampling capacitor connected to the signal processor 103. It should be understood that the object electric charge signal of each channel is used to charge the corresponding sampling capacitor. The charging process may be understood as the process of sampling the object electric charge signal of the corresponding channel by the sampling capacitor. At the same time, the output voltage Vo at the output $V_{OUT}$ of the signal processor 103 may follow the input signal Vi at the input $V_{IN}$, and the voltage of the sampling capacitor is the same as the input voltage at the sampling input $V_{IN}$.

In the "holding" state, each of the third sampling capacitors (including the capacitor 1 to the capacitor n) is neither charged nor discharged any longer, and when the "sampling" state is switched to the "holding" state, it indicates that the analog-digital converter 104 is currently converting signal. During the conversion, the sampling capacitor is neither charged nor discharged any longer, and the object electric charge signal is held in the sampling capacitor. At the same time, the value of the input signal Vi at the sampling input $V_{IN}$ of the signal processor 103 remains unchanged, and the output voltage Vo at the output $V_{OUT}$ of the signal processor 103 remains a constant output for a very long time until the signal processor 103 is switched from being in the "holding" state to being in the "sampling" state.

In this way, when the "sampling" state is switched to the "holding" state, that is, while the analog-digital converter 104 is converting the signal, the input signal is held unchanged by the sampling capacitor, so that the analog-digital converter 104 may correctly convert the signal, thereby greatly improving the signal processing accuracy.

In addition, as may be seen from FIG. 13, the signal processor 103 also has a common-mode voltage input $V_{CM,IN}$. The common-mode voltage input by the common-mode voltage input $V_{CM,IN}$ may be regarded as a reference voltage, a specific value of which may be pre-defined according to the actual situation. As may be obtained in FIG. 13, $Vo=V_{IN}-V_{CM,IN}$.

In an embodiment, the signal processor 103 in this embodiment of the present application is a flip-flop-capacitor-type signal processor. The flip-flop-capacitor-type structure is a fully differential structure, which may well eliminate a DC bias and an even-order harmonic distortion, and restrain common-mode noises from the substrate. Moreover, the feedback coefficient of the flip-flop-capacitor-type structure is 1, so in the case of the same closed-loop bandwidth, the unit gain bandwidth (GBW) of the operational amplifier required by the flip-flop-capacitor-type structure is relatively small. Therefore, the flip-flop-capacitor-type structure of the embodiment of the present application may further reduce the final power consumption of the readout circuit.

Based on this, when the signal processing circuit implements "sampling" and "holding", each of the sampling capacitors (including the capacitor 1 to the capacitor n) corresponding to each channel will be flip-flopped to the signal processor 103. However, if it is configured that each of the sampling capacitors (including the capacitor 1 to the capacitor n) corresponding to each channel is flip-flopped to the signal processor at a fixed order, then the time took for the object electric charge signal sampled by each sampling capacitor to wait for being quantized by the analog-digital converter at the back end is different, thus causing a fixed error between the quantized values of the analog signals read out from all channels. That is, there is a fixed error in the image generated according to the finally read-out analog signal, thus causing the poor quality of the final image.

In the embodiment of the present application, the randomizing circuit 105 is configured to randomize the order in which the sampling capacitors (including the capacitor 1 to the capacitor n) corresponding to the various channels are flip-flopped to the flip-flop-capacitor-type signal processor, so that the sampling capacitor samples and holds in an unfixed order, and the waiting time for each of the sampling capacitors of all channels is random, that is, the fixed noise in the finally generated image is converted into white noise, which makes it difficult for human eyes to recognize, thereby improving the quality of the image.

Specifically, please continue to refer to FIG. 11, the randomizing circuit 105 is configured to generate random signals, and is connected between the sampling capacitors (including the capacitor 1 to the capacitor n) and the signal processor 103 to realize the effect that the sampling capacitors (including the capacitor 1 to the capacitor n) corresponding to the various channels are flip-flopped to the flip-flop-capacitor-type signal processor 103 in a randomized order.

In an embodiment, the randomizing circuit may be implemented by a chip with a pre-written control program, that is, a preset randomizing algorithm is written in the chip to serve as a randomizing circuit. The randomizing circuit acts on each sampling capacitor to realize the effect of randomizing the order in which the sampling capacitors are flip-flopped to the signal processor.

In another embodiment, the randomizing circuit may be implemented by a sampling butterfly circuit, so that the randomizing circuit acts on each sampling capacitor to realize the effect of randomizing the order in which the sampling capacitors are flip-flopped to the signal processor.

After the order, in which the sampling capacitors are flip-flopped to the signal processor, is randomized by the randomizing circuit, according to the randomized order, the signal processor holds the object electric charge signals sampled by the sampling capacitors in sequence.

The signal output from the output of the signal processor is the signal obtained after the signal processor holds the object electric charge signal sampled by the sampling capacitor, and will be input into the analog-digital converter 104. The analog-digital converter 104 is an electronic component which is configured to convert an analog signal into a digital signal. That is, after the electric charge signal is input into the analog-digital converter 104, the analog-digital converter 104 will convert the electric charge signal into a digital signal and output the digital signal. The output digital signal is the quantized result of the analog signal of the object device sampled by the signal sampler, and the quantized value is the value corresponding to the analog signal read out by the readout circuit.

The readout circuit provided in the embodiment of the present application includes the randomizing circuit, the signal processing circuit, and the analog-digital converter. The signal processing circuit includes the plurality of third sampling capacitors and the signal processor. The signal processor includes the first operational amplifier. At least one of the plurality of third sampling capacitors correspondingly sample the object electric charge signal of at least one channel. The randomizing circuit is configured to randomize the order in which the sampling capacitors are flip-flopped to the signal processing circuit, and the signal processor is configured to hold the object electric charge signals sampled by the sampling capacitors in the randomized order, and to transmit the held object electric charge signals to the analog-digital converter to obtain the quantized result of the object electric charge signals. In the process of determining the quantized result of the object electric charge signal, the randomizing circuit randomizes the order in which the sampling capacitors are flip-flopped to the signal processor, so that the sampling capacitors are flip-flopped to, in an unfixed order, the signal processor to sample and hold the signals, therefore the waiting time for each of the sampling capacitors of all channels is random, that is, the fixed noise in the image generated according to the read out analogy signal is converted into white noise, which makes it difficult for human eyes to recognize the noise in the image, thereby improving the quality of the finally generated image.

Figure 14:
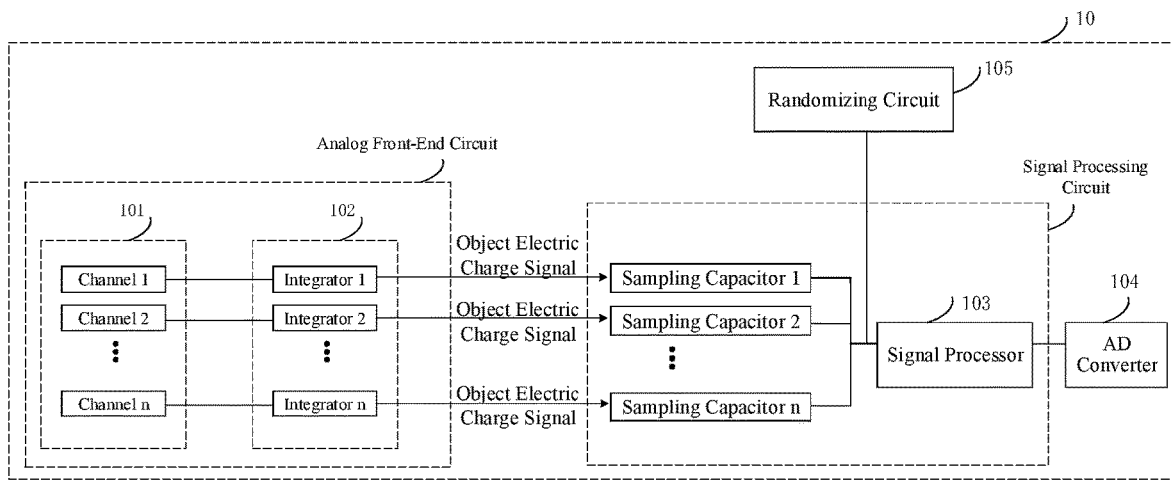
FIG. 14 is a schematic structural view showing the readout circuit according to yet another embodiment of the present application.

Based on the embodiments above, an implementation of an internal structure of an analog front-end circuit is provided. As shown in FIG. 14, the analog front-end circuit includes a signal sampler 101 and integrators 102. The signal sampler 101 includes at least one channel, and each channel of the signal sampler 101 is connected to at least one integrator 102. The signal sampler 101 is configured to sample the analog signals of the object device, and to transmit the analog signals to the respective integrators 102 of the channels to obtain the object electric charge signals output by the integrators 102.

The signal sampler 101 is configured to sample analog signals, such as optical signals, photoelectric signals, voice signals, temperature signals, etc. Correspondingly, the signal sampler 101 may be any type of sensors, such as a photoelectric sensor, a voice sensor, a temperature sensor, and the like.

Taking the photoelectric sensor as an example, the signal sampler 101 includes a plurality of channels 101 (including the channel 1 to the channel n), that is, the photoelectric sensor includes the plurality of channels. Usually, for a sensor, a multi-channel sensor is named relative to a single-channel sensor. For example, the difference between the multi-channel sensor and the single-channel sensor is the number of data that they can measure. Generally, the single-channel sensor can measure only one data, and the multi-channel sensor may measure a plurality of data. The specific number of channels of the multi-channel sensor is not limited in this embodiment of the present application, for example, 128 channels are provided, that is, n=128. Or 10 channels are provided, that is, n=10.

The signal sampler 101 is configured to sample the analog signals of the object device, and to transmit the analog signals to the integrators 102 corresponding to the channels to obtain the object electric charge signals output by each of the integrators 102.

The integrator 102 is a component whose output signal is the integration of the input signal over time. The integrator may be regarded as a counter in a continuous domain, and may accumulate the input and then output the accumulated value. In the embodiment of the present application, each of the channels (including the channel 1 to the channel n) of the signal sampler 101 is connected to one of the integrators 102 (including the integrator 1 to the integrator n), so that the signal sampled by the signal sampler 101 is converted into an object electric charge signal by the integrator 102. For example, the photoelectric signal sampled by the photoelectric sensor is converted into an electric charge signal by the integrator.

In this embodiment, the analog front-end circuit includes the signal sampler and the integrators, and the signal sampler and the integrators are of the plurality of channels, and have structures in one-to-one correspondence with each other. In this way, for any analog signal of the object device sampled by the signal sampler, the corresponding integrator may convert the analog signal into the corresponding electric charge signal, so that the object electric charge signal obtained based on the analog signal is more accurate.

Next, implementable structures of the signal processing circuit above will be described by means of some embodiments. It may be understood that, the implementable structures shown in these embodiments are only examples, but not used to limit the present application.

Figure 15:
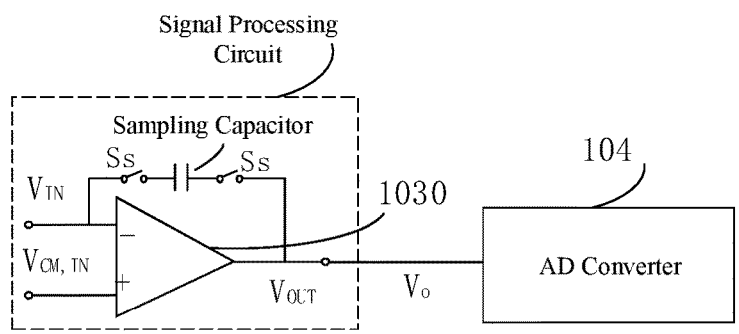
FIG. 15 is a schematic structural view showing the signal processing circuit in the readout circuit according to another embodiment of the present application.

As shown in FIG. 15, in an embodiment, for the sake of clarity, the signal processing circuit is illustrated separately. Based on the embodiments above, as shown in FIG. 15, the signal processor 103 of the signal processing circuit further includes sampling switches Ss. Two terminals of at least one of the sampling capacitors (including the capacitor 1 to the capacitor n) each are connected to one sampling switch Ss. The sampling switches Ss are turned on while the corresponding sampling capacitor is being charged or discharged.

While being switched from being in the "sampling" state to being in the "holding" state, the sampling capacitor may be controlled, by the sampling switches, neither to be charged nor discharged any longer. In this embodiment, two terminals of the at least one of the sampling capacitors (including the capacitor 1 to the capacitor n) each are connected to one sampling switch Ss, or two terminals of each of the sampling capacitors each are connected to one sampling switch.

During operation and in the "sampling" state, when a logic control signal controls the sampling switches Ss to be turned on, the sampling capacitor is charged or discharged, that is, the input signal is input, through the sampling input $V_{IN}$, into the sampling capacitor connected to the signal processor 103. At this time, the output voltage Vo at the output $V_{OUT}$ of the signal processor 103 may follow the input signal at the input terminal $V_{IN}$, and the voltage of the sampling capacitor is the same as the input voltage at the input terminal $V_{IN}$.

In the "holding" state, when a logical control signal controls the sampling switches Ss to be turned off, which is equivalent that the sampling capacitor is only connected to a high-impedance input of the signal processor 103, the sampling capacitor 1031 is neither charged nor discharged any longer, and the electric charge that has been charged is held in the signal processor. At this time, the value of the input signal at the sampling input $V_{IN}$ remains unchanged, and the output voltage Vo at the output $V_{OUT}$ of the signal processor 103 may also remain a constant output value for a long time, till the control signal controls the sampling switches Ss to be turned on, and then the "holding" state is switched to the "sampling" state.

In this embodiment, while being switched from being in the "sampling" state to being in the "holding" state, the sampling capacitor may be controlled, by the sampling switches, to be switched from being charged or discharged to neither being charged nor discharged any longer, so that while the analog-digital converter is converting signals, the input signal is held unchanged by the sampling capacitor to ensure that the analog-digital converter converts the signal correctly, thereby greatly improving the signal processing accuracy.

In addition, in an embodiment of the present application, the sampling capacitors (including the capacitor 1 to the capacitor n) sample the object electric charge signals of the corresponding channels by means of the bottom-plate sampling.

The respective signals may be processed in the charge domain by means of the bottom-plate sampling, and the signal processor 103 adopts the flip-flop-capacitor-type signal processor. In this structure, the feedback coefficient of the signal processor 103 may be reduced. In this way, when the actual product is implemented, according to the principle of charge conservation, the total parasitic capacitor Cpar caused by the layout wiring of the multiplex signal processor 103 will not cause the reduction of the signal-to-noise ratio of the signal channel. As long as the signal of the signal processor 103 is fully established, the point potential at the respective sampling input of the signal processor 103 is equal to the voltage of respective common-mode voltage terminal of the signal processor 103, and the electric charge signals will be completely held in the respective sampling capacitor 1031, thereby guaranteeing the integrity of the signals and the sampling accuracy to the maximum extent.

In practical applications, when the readout circuit of the above structure is implemented in form of a product, the parasitic capacitance caused by the layout wiring of the multiplex circuit board may be reduced as much as possible by rationally arranging the layout wiring of the circuit board. The detailed rational arrangement of the layout wiring of the circuit board is not limited in the embodiments of the present application, and the wiring may be arranged according to actual needs during implementation of the product.

When the multiplex signal processor continuously processes the signal charges of the plurality of channels, the memory effect of the signal processor will cause mutual interference between the plurality of channels, which affects the accuracy of signal processing.

Figure 16:
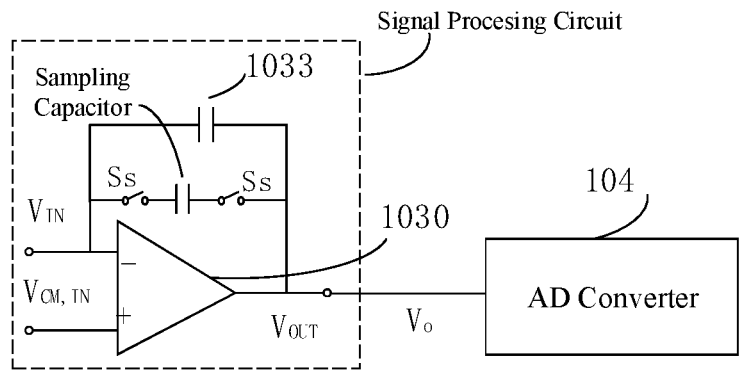
FIG. 16 is a schematic structural view showing the signal processing circuit in the readout circuit according to yet another embodiment of the present application.

In view of this, in order to reduce the mutual interference between the plurality of channels caused by the memory effect of the signal processor, the embodiment of the present application further provides a readout circuit. As shown in FIG. 16, the signal processor 103 of the signal processing circuit further includes a resetting capacitor 1033. The first terminal of the resetting capacitor 1033 is connected to the sampling input of the signal processor 103, and the second terminal of the resetting capacitor 1033 is connected to the output of the signal processor 103. After each time the object electric charge signal is processed, the resetting capacitor 1033 resets the voltage at the sampling input of the signal processor 103 to the initial input voltage, and resets the voltage at the output of the signal processor 103 to the initial output voltage.

In the embodiment, the memory effect of the signal processor is eliminated by connecting the resetting capacitor.

For example, please continue to refer to FIG. 16, the first terminal of the resetting capacitor 1033 is connected to the sampling input $V_{IN}$ of the signal processor 103, and the second terminal of the resetting capacitor 1033 is connected to the output $V_{OUT}$ of the signal processor 103. Based on this connection, after each time the object electric charge signal is processed by the signal processing circuit, the resetting capacitor 1033 resets the voltage at the sampling input $V_{IN}$ of the signal processor 103 to the initial input voltage, and resets the voltage at the output $V_{OUT}$ of the signal processor 103 to the initial output voltage.

In this way, after each time the signal processing circuit finishes processing the object electric charge signal, the input and the output of the signal processor 103 are reset to the initial values by the resetting capacitor 1033, thereby avoiding the mutual interference between the plurality of channels caused by the memory effect of the signal processor. It may be understood that the initial values herein are the voltage values of the signal processor 103 in the initial state and may be obtained in advance.

Figure 17:
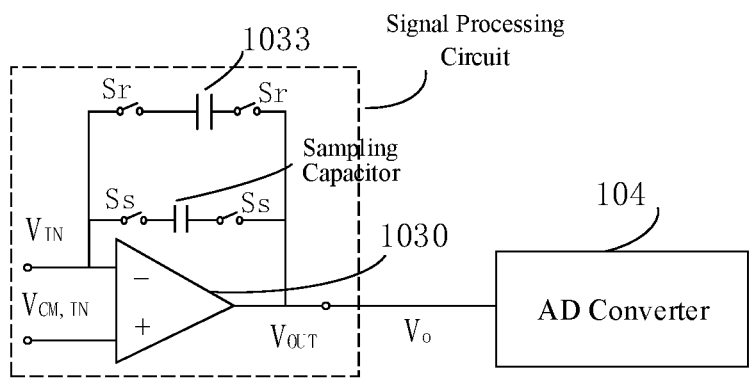
FIG. 17 is a schematic structural view showing the signal processing circuit in the readout circuit according to yet another embodiment of the present application.

In an embodiment, as shown in FIG. 17, the signal processor 103 of the signal processing circuit further includes resetting switches Sr, and two terminals of the resetting capacitor 1033 each are connected to one resetting switch Sr. The resetting switches Sr are turned on when the resetting capacitor 1033 is resetting. FIG. 17 shows a turn-off state of the resetting switches.

As mentioned above, the resetting capacitor 1033 resets once after each time the signal processing circuit finishes processing the object electric charge signal, to eliminate a residual memory of the previous processing for the electric charge signal, which remains in the signal processor 103 of the signal processing circuit, and to avoid affecting the signal processing accuracy. It should be understood that the resetting capacitor 1033 needs not to perform the reset function while the same electric charge signal is being processed.

In an embodiment, the reset function of the resetting capacitor 1033 may be implemented by setting the resetting switches 1034, that is, the resetting switches Sr control the resetting capacitor 1033 to reset, where, the resetting switches Sr are controlled to be turned on and off by the logic control signals. Specifically, the resetting switches Sr are turned on when the resetting capacitor 1033 is resetting, and turned off when the resetting capacitor 1033 needs not to perform the reset function.

It may be understood that, taking any one of the sampling capacitors (including the capacitor 1 to capacitor n) in the "sampling" state and finishing processing the electric charge signal once as an example, the reset function of the resetting capacitor 1033 is performed when the sampling capacitor is switched from being in the "sampling" state to being in the "holding" state, that is, the resetting switches Sr for the resetting capacitor 1033 and the sampling switches Ss for the sampling capacitor cannot be turned on or turned off simultaneously. That is, when the resetting switches Sr are turned off, the sampling switches Ss are turned on, and when the resetting switches Sr are turned on, the sampling switches Ss are turned off.

Figure 18:
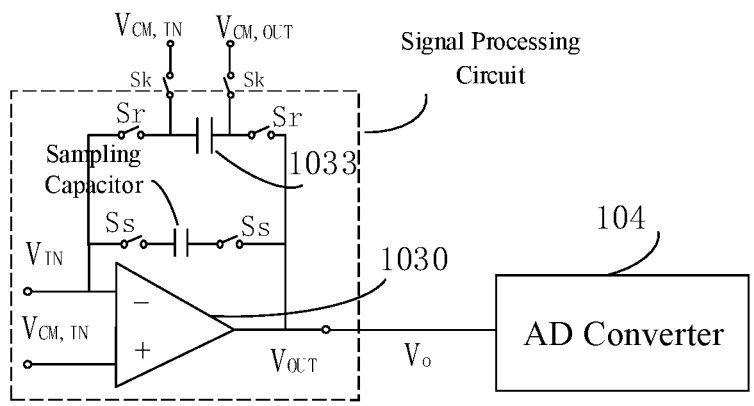
FIG. 18 is a schematic structural view showing the signal processing circuit in the readout circuit according to yet another embodiment of the present application.

As shown in FIG. 18, in another embodiment, the signal processor 103 of the signal processing circuit further includes holding switches Sk. One holding switch Sk is arranged between the first terminal of the resetting capacitor 1033 and the input terminal of the common-mode voltage, and another holding switch Sk is arranged between a second terminal of the resetting capacitor 1033 and the output terminal of the common-mode voltage. The holding switches Sk are turned on when the signal processor 103 is in the holding state.

When any one of the sampling capacitors (including the capacitor 1 to the capacitor n) is in the sampling state, the holding switches Sk are controlled to be turned on by the logical control signal, so that the voltages at two terminals (points A and B in FIG. 18) of the resetting capacitor Cr are reset to the input common-mode voltage and the output common-mode voltage of the signal processor 103, respectively. That is, the voltage at the point A is reset to be the same as the input common-mode voltage at the common-mode voltage input $V_{CM,IN}$ of the signal processor 103, and the voltage at the point B is reset to be the same as the output common-mode voltage at the common-mode voltage output $V_{CM,OUT}$ of the signal processor 103.

In this way, it can be ensured that, before and after the capacitor is flip-flopped, the direct-current operating points of the signal processor 103 (of the flip-flop-capacitor type) are the same, thus preventing the signal processor 103 from deviating from a normal working state to affect the establishing of the output signal.

Additionally, in an embodiment, the signal processor 103 may be implemented by adopting a gain-boost folded co-source co-gate structure.

The operational amplifier is the most important module in the signal processor, and the gain and the bandwidth of the operational amplifier directly determine the accuracy and the speed of the signal processing circuit. A multi-stage amplifier, a relatively small bias current, and a long-channel device are required for the relatively high gain, while a single-stage amplifier, a relatively large bias current, and a short-channel device are required for the relatively large bandwidth. In view of these requirements, in the embodiment of the present application, the operational amplifier of the signal processor adopts the gain-boost folded co-source co-gate structure, thereby improving the gain of the amplifier, and meeting the requirements of the relatively high gain and the relatively large bandwidth. In the embodiment of the present application, the signal processor adopts the gain-boost folded co-source co-gate structure, which enables the low-frequency gain and the bandwidth of the signal processor to be large enough, thereby meeting the requirements for the establishment accuracy and the speed of the analog-digital converter.

It should be noted that, in the circuit architecture shown in the above embodiments, the number of the channels of the readout circuit, the accuracy and speed of reading, the structure and the gain and the bandwidth of the amplifier, etc., may all be adjusted according to actual applications, which are not limited in the embodiments of the present application.

In addition, in practical applications, the readout circuit may be designed to be a single-ended structure or a fully differential structure. Specifically, after analysis, it is found that, if the readout circuit adopts the fully differential structure, it can better restrain noises introduced by the power supply, the ground, and the bias circuit, but a common-mode feedback loop with higher power consumption needs to be provided. If noise of a specific level is required to be achieved, more power consumption is required, which will cause the scale of the readout circuit to be extremely large. Each chip consumes too much power, thus causing self-heating effects, and making it difficult to realize a large-scale system integration.

In view of this, in order to reduce the power consumption of the readout circuit and achieve the noise of the specific level at the cost of the minimum power consumption, the readout circuit is configured to be the single-ended structure. In addition, if the readout circuit is configured to be the single-ended structure, the restraint capability of the readout circuit against the interference noises introduced by the power source and the ground and the bias circuit is relatively poor, and these interference noises will disable the noise of the specific level expected by the readout circuit to be achieved, thus disabling the readout circuit to meet the requirements of high precision and low noise.

Therefore, in view of the technical defect that the readout circuit with the single-ended structure is easily interfered by bias noise, power supply noise, and ground noise, disabling the requirements of high precision and low noise to be met, the present application further provides a readout circuit, which can effectively restrain the noises in the readout circuit.

Figure 19:
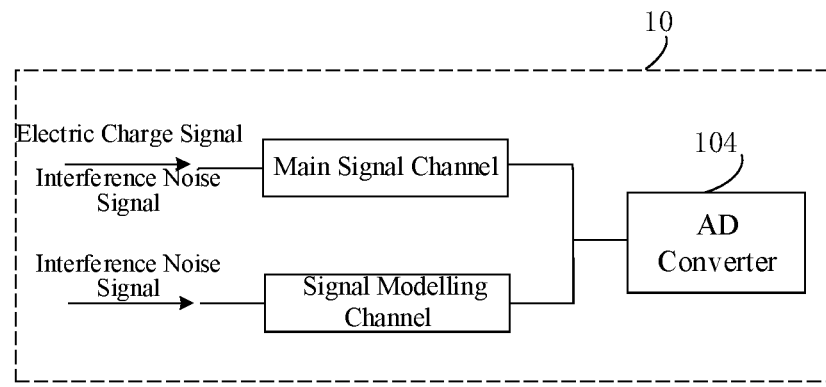
FIG. 19 is a schematic structural view showing the readout circuit according to yet another embodiment of the present application.

As shown in FIG. 19, based on any one of the readout circuits above, in an embodiment, the readout circuit 10 further includes a signal modelling channel. The signal modelling channel is configured to process the interference noise signal to obtain a modelled electric charge signal. The interference noise signal is the noise information generated by the readout circuit. The analog-digital converter 104 is configured to restrain noise of the modelled electric charge signal and noise of the sampled and held electric charge signal, to obtain the quantized result corresponding to the electric charge signal.

The channel where the signal processor 103 of any one of the embodiments above is located is a main signal channel. The main signal channel and the signal modelling channel are two parallel signal channels. The signals that enter the main signal channel are the electric charge signal output by the integrator and the interference noise signal generated in the readout circuit, and the signal that enters the signal modelling channel is only the interference noise signal. The output of the main signal channel and the output of the signal modelling channel are both connected to the analog-digital converter 104, that is, after being processed by the main signal channel and the signal modelling channel, the electric charge signals obtained are input into the analog-digital converter 104.

In an embodiment, the timing sequences and the structures of the main signal channel and the signal modelling channel are identical. That is, the structures of the main signal channel and the signal modelling channel are the same, and the timing sequences of the two channels during operation are the same. It may be understood that, as the signals to be processed by the two channels are different, the processed electric charge signal obtained from the main signal channel and the processed electric charge signal obtained from the signal modelling channel are also different. It may be understood that the processed electric charge signal obtained from the main signal channel is the sampled and held electric charge signal described in the embodiments above, and the processed electric charge signal obtained from the signal modelling channel is the modelled electric charge signal. It should also be noted that, the modelled electric charge signal in the embodiment of the present application is used only for distinguishing the processed electric charge signals obtained from different channels, rather than for limitation. Other terms named with "modelling" are also used only for distinction, rather than limitation.

In practical applications, during normal operation, each component in the readout circuit 10 will generate some interference noises (i.e, the interference noise signals in the embodiments of the present application) more or less. Optionally, these interference noises include but are neither limited to the disorder signals generated in the process of obtaining the object electric charge signal based on the analog signal, nor limited to the power supply noise, the ground noise, and the bias noise generated in the readout circuit.

The disorder signals generated in the process of obtaining the electric charge signal based on the analog signal refer to the disorder signal caused by the processing error of the analog front-end circuit itself in the process of converting the analog signal into the electric charge signal.

The power supply noise is generated directly or indirectly by the voltage source of the readout circuit, and will interfere with the noise of specific level required by the readout circuit. The power supply noise includes, such as, the distributed noise caused by the inherent impedance of the power supply itself, noise caused by electromagnetic interference in AC or DC power lines, and noise between the power supply and the ground, etc.

The ground noise refers to the noise caused by the ground wire. For example, due to the existence of the impedance of the ground wire, when a current flows through the ground wire, a voltage will be generated across the ground wire, thus producing the ground noise. Or a differential mode voltage is generated by different currents of different ground wires caused by interference, thus causing the ground noise, etc.

The power supply noise and the ground noise are generated all the time during the operation of the readout circuit, and the power supply noise and the ground noise are negligible for passive devices, but have greater effects on active devices. For example, the main signal channel and the signal modelling channel are active devices, so the modelled electric charge signal and the sampled and held electric charge signal obtained from the two channels both carry the power supply noise and the ground noise generated in the corresponding channels all the time.

The bias noise refers to the noise generated by the bias circuit in the readout circuit. The bias circuit is a circuit that provides bias voltages for the main signal channel and for the signal modelling channel of the readout circuit, and generates the bias noise during operation. It should be noted that, in the embodiment of the present application, the bias circuit is common to the main signal channel and the signal modelling channel, that is, the main signal channel and the signal modelling channel share a common bias circuit. In this way, it may be ensured that the bias noise generated in the main signal channel and the bias noise generated in the signal modelling channel are identical. The same principle is applicable to the power supply noise and the ground noise.

It should also be noted that in the figure, the interference noise signal is shown as entering the main signal channel and the signal modelling channel, but in practice, such as the bias noise is generated in the main signal channel and in the signal modelling channel. For the sake of clarity, this case is not shown in the figure, but is illustrated in the way of entering the signal channel.

This kind of noise, generated during the operation of the signal channel, together with the signal, will be processed simultaneously by the signal channel. Therefore, the sampled and held electric charge signal finally output by the main signal channel and the modelled electric charge signal finally output by the signal modelling channel also carry the respective noises generated in the corresponding signal channels. This case is also applicable for other figures, and will not be described repeatedly herein.

For the interference noise signals above, the main signal channel will process the electric charge signal and the interference noise signal simultaneously, obtaining the sampled and held electric charge signal. The signal modelling channel will process only the interference noise signal, obtaining the modelled electric charge signal. Combining with the case that the main signal channel and the signal modelling channel have the same timing sequence and the same structure, it may be seen that, compared with the modelled electric charge signal, the sampled and held electric charge signal contains the extra object electric charge signal.

Since the output of the main signal channel and the output of the signal modelling channel are both connected to the input of the analog-digital converter, the sampled and held electric charge signal and the modelled electric charge signal will enter the analog-digital converter simultaneously.

Then the analog-digital converter 104 may perform a processing of restraining noises based on the modelled electric charge signal and the sampled and held electric charge signal, so that the interference noise signals above may be eliminated to a certain extent from the quantized result corresponding to the analog signal finally output by the analog-digital converter, thus realizing the purpose of restraining the interference noise signals.

In an embodiment, the analog-digital converter 104 has a differential structure, and has the function of subtracting the modelled electric charge signal from the sampled and held electric charge signal, so after the modelled electric charge signal and the sampled and held electric charge signal enter the analog-digital converter 104, the analog-digital converter 104 performs the processing of restraining noise on the modelled electric charge signal and the sampled and held electric charge signal. The processing of restraining noises is a subtraction operation, thus obtaining the processed signal of the electric charge signal itself in which the interference noise signal is restrained. In this way, the analog-digital converter 104 performs an analog-digital conversion on the electric charge signal itself, thereby obtaining the quantized value of the analog signal, in which the interference noise signal is restrained, and the quantized value is the value of the analog signal read out by the readout circuit.

In the readout circuit provided in the embodiment of the present application, the readout circuit includes a main signal channel, a signal modelling channel, and an analog-digital converter. The main signal channel is configured to process the electric charge signal and the interference noise signal, to obtain the sampled and held electric charge signal. The signal modelling channel is configured to process the interference noise signal, to obtain the modelled electric charge signal. The analog-digital converter is configured to perform the processing of restaining noise on the modelled electric charge signal and the sampled and held electric charge signal, to obtain the quantized result corresponding to the analog signal. The signals which enter the main signal channel include the electric charge signal and the interference noise signal, and the signal which enters the signal modelling channel includes only the interference noise signal, so compared with the modelled electric charge signal, the sampled and held electric charge signal contains the extra processed signal of the electric charge signal itself. In this way, by performing the processing of restraining noise on the modelled electric charge signal and the sampled and held electric charge signal, the quantized value of the electric charge signal in which the interference noise is restrained is obtained. Therefore, by arranging the main signal channel and the signal modelling channel, the interference noises in the readout circuit may be offset, thereby effectively restraining the interference noises in the readout circuit.

Figure 20:
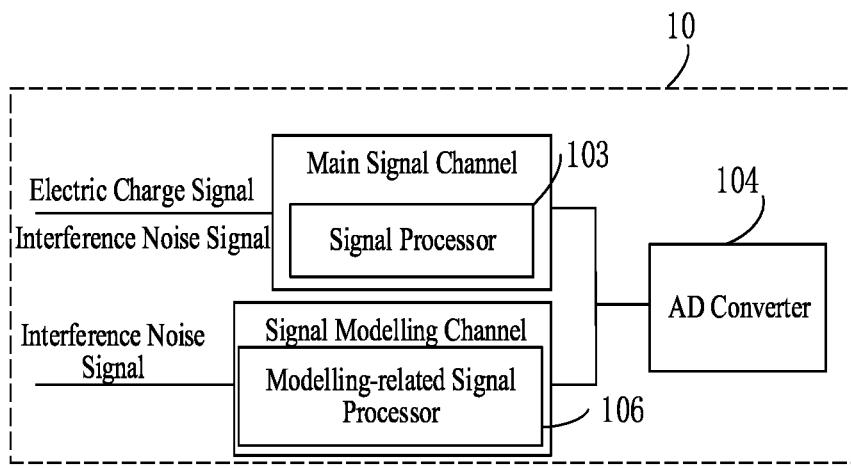
FIG. 20 is a schematic structural view showing the readout circuit according to yet another embodiment of the present application.

In an embodiment, as shown in FIG. 20, the channel where the modelling-related signal processor 106 is arranged is equivalent to a signal modelling channel. The signal modelling channel includes a second operational amplifier 1060. The second operational amplifier 1060 is configured to process the interference noise signal to obtain a processed electric charge signal, and to input the processed electric charge signal into the analog-digital converter 104.

The signal modelling channel includes the second operational amplifier 1060. The second operational amplifier 1060 is the same as the first operational amplifier 1030 in the above embodiments. The output of the second operational amplifier 1060, namely the output of the modelling-related signal processor 106, is connected to the input of the analog-digital converter 104. The signal processor 103 samples and holds the electric charge signal output by the integrator together with the interference noise signal generated in the readout circuit, thus obtaining the sampled and held electric charge signal. The modelling-related signal processor 106 samples and holds the interference noise signal generated in the readout circuit, thus obtaining the modelled electric charge signal. In addition, the working principle and the function of the modelling-related signal processor 106 each are also the same as those of the signal processor 103, and will not be described repeatedly herein.

In an embodiment, the signal modelling channel further includes a modelling-related sampling capacitor Cs2. A first terminal of the modelling-related sampling capacitor Cs2 is connected to the sampling input $V_{IN2}$ of the second operational amplifier 1060, and a second terminal of the modelling-related sampling capacitor Cs2 is connected to the output $V_{OUT2}$ of the second operational amplifier 1060. The modelling-related sampling capacitor Cs2 is configured to be charged according to the interference noise signal, and to be discharged into the analog-digital converter 104 through the output of the modelling-related signal processor 106.

In an embodiment, the signal modelling channel further includes a modelling-related resetting capacitor Cr2. A first terminal of the modelling-related resetting capacitor Cr2 is connected to the sampling input $V_{IN2}$ of the second operational amplifier 1060, and a second terminal of the modelling-related resetting capacitor Cr2 is connected to the output $V_{OUT2}$ of the second operational amplifier 1060. The modelling-related resetting capacitor Cr2 is configured to reset the voltage at the sampling input of the modelling-related signal processor 106 to the initial input voltage, and to reset the voltage at the output of the modelling-related signal processor 106 to the initial output voltage.

In an embodiment, the signal modelling channel further includes modelling-related resetting switches. The modelling-related resetting switches are connected to two ends of the modelling-related resetting capacitor respectively. The modelling-related resetting switch is turned on when the modelling-related resetting capacitor is resetting.

In an embodiment, the signal modelling channel further includes modelling-related holding switches. One modelling-related holding switch is arranged between the first terminal of the modelling-related resetting capacitor and the input terminal of the common-mode voltage, and another modelling-related holding switch is arranged between a second terminal of the modelling-related resetting capacitor and the output terminal of the common-mode voltage. The modelling-related holding switches are turned on when modelling-related signal processor 106 is in the holding state.

In order to describe the implementation principle and the function of the signal modelling channel above in detail, a readout circuit is provided herein. In the readout circuit, the channel where the signal processor 103 is located is the main signal channel, and the object electric charge signal represents the electric charge signal output by the integrator in the above embodiment. A first processed electric charge signal represents the electric charge signals, which are obtained by the signal processor 103 (in the main signal channel) by means of sampling and holding the electric charge signal output by the integrator and the interference noise signal generated by the readout circuit. A second processed electric charge signal represents the electric charge signal, which is obtained by the signal modelling channel by means of processing the interference noise signal, that is, the second processed electric charge signal is such as, the modelled electric charge signal above.

The implementation process of the signal modelling channel restraining the interference noise signal generated in the readout circuit will be described in detail with reference to the accompanying drawings herein.

Figure 21:
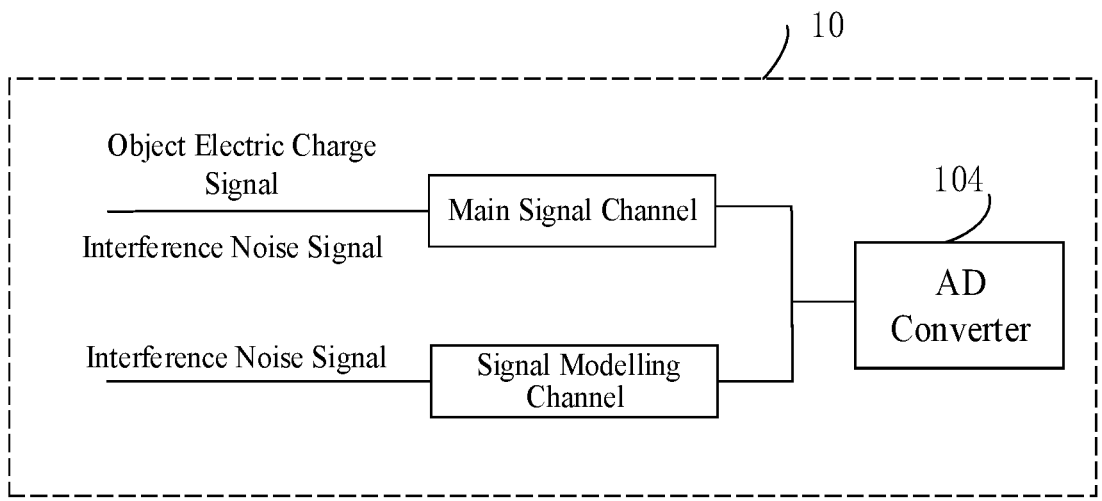
FIG. 21 is a schematic structural view showing the readout circuit according to yet another embodiment of the present application.

In an embodiment, as shown in FIG. 21, an embodiment of the present application provides a readout circuit 10. The readout circuit includes a main signal channel, a signal modelling channel and an analog-digital converter 104. The main signal channel is configured to process the object electric charge signal and the interference noise signal, to obtain the first processed electric charge signal. The signal modelling channel is configured to process the interference noise signal to obtain the second processed electric charge signal. The analog-digital converter 104 is configured to perform a processing of restraining noise on the first processed electric charge signal and the second processed electric charge signal, to obtain the quantized result corresponding to the object electric charge signal. The interference noise signal is the noise information generated by the readout circuit.

Referring to FIG. 21, the main signal channel and the signal modelling channel are two parallel signal channels. The signals that enter the main signal channel are the object electric charge signal and the interference noise signal, and the signal that enters the signal modelling channel is the interference noise signal. The output of the main signal channel and the output of the signal modelling channel are both connected to the analog-digital converter 104, that is, after being processed by the main signal channel and the signal modelling channel, the electric charge signals obtained are input into the analog-digital converter 104.

In an embodiment, the timing sequences and the structures of the main signal channel and the signal modelling channel are identical. That is, the structures of the main signal channel and the signal modelling channel are the same, and the timing sequences of the two channels are the same. It may be understood that, as the signals to be processed by the two channels are different, the first processed electric charge signal and the second processed electric charge signal are also different.

The object electric charge signal refers to a signal obtained by converting the analog signal. For example, an analog signal of a medical device is sampled by the signal sampler, and the object electric charge signal is the electric charge signal obtained by converting the analog signal by means of integration and the like.

Figure 22:
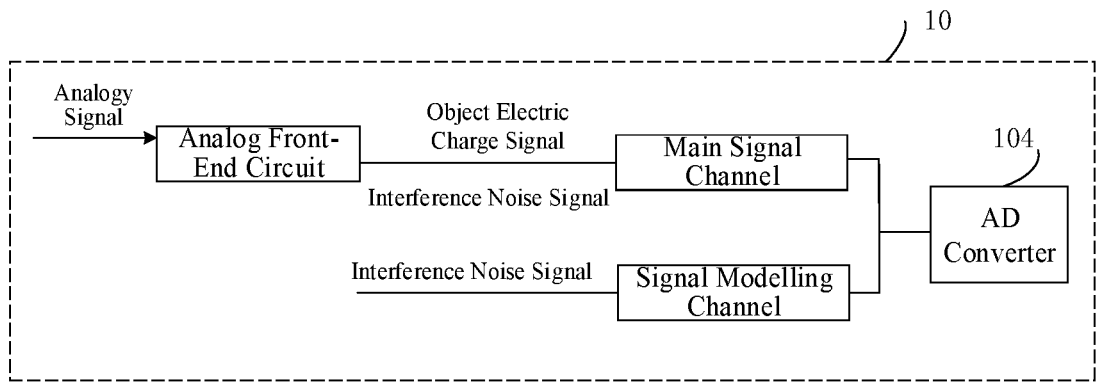
FIG. 22 is a schematic structural view showing the readout circuit according to yet another embodiment of the present application.

In an embodiment, the circuit that converts the analog signal into the object electric charge signal is called the analog front-end circuit. As shown in FIG. 22, in this embodiment, the readout circuit 10 further includes the analog front-end circuit, which is configured to sample the analog signal of the object device and convert the analog signal into the object electric charge signal.

The object device generally refers to any device in any field, for example, in the medical industry, the object device refers to any medical device, including but not limited to the MRI equipment, the computed tomography (CT) equipment, the X-ray machine, or the ultrasonic imaging device, etc. The type and specific function of the object device are not limited in the embodiments of the present application. Then the analog signals sampled from the object device may be optical signals, photoelectric signals, voice signals, temperature signals, etc.

The analog front-end circuit converts the analog signal to obtain the object electric charge signal. The specific structure of the analog front-end circuit is not limited in the embodiments of the present application, and it may be implemented by a chip that stores a control program in advance, or a combination of an integrator and a signal sampler.

In practical applications, during normal operation, each component in the readout circuit 10 will generate some interference noises (i.e, the interference noise signals in the embodiments of the present application) more or less. Optionally, these interference noises include but are neither limited to the disorder signals generated in the process of obtaining the object electric charge signal based on the analog signal, nor limited to the power supply noise, the ground noise, and the bias noise generated in the readout circuit.

The disorder signals generated in the process of obtaining the object electric charge signal based on the analog signal refer to the disorder signal caused by the processing error of the analog front-end circuit itself in the process of converting the analog signal into the object electric charge signal.

The power supply noise is generated directly or indirectly by the voltage source of the readout circuit, and will interfere with the noise of specific level required by the readout circuit. The power supply noise includes, such as, the distributed noise caused by the inherent impedance of the power supply itself, noise caused by electromagnetic interference in AC or DC power lines, and noise between the power supply and the ground, etc.

The ground noise refers to the noise caused by the ground wire. For example, due to the existence of the impedance of the ground wire, when a current flows through the ground wire, a voltage will be generated across the ground wire, thus producing the ground noise. Or a differential mode voltage is generated by different currents of different ground wires caused by interference, thus causing the ground noise, etc.

The power supply noise and the ground noise are generated all the time during the operation of the readout circuit, and the power supply noise and the ground noise are negligible for passive devices, but have greater effects on active devices. For example, the main signal channel and the signal modelling channel are active devices, so the first processed electric charge signal and the second processed electric charge signal obtained from the two channels both carry the power supply noise and the ground noise generated in the corresponding channels all the time.

The bias noise refers to the noise generated by the bias circuit in the readout circuit. The bias circuit is a circuit that provides bias voltages for the main signal channel and for the signal modelling channel of the readout circuit, and generates the bias noise during operation. It should be noted that, in the embodiment of the present application, the bias circuit is common to the main signal channel and the signal modelling channel, that is, the main signal channel and the signal modelling channel share a common bias circuit. In this way, it may be ensured that the bias noise generated in the main signal channel and the bias noise generated in the signal modelling channel are identical. The same principle is applicable to the power supply noise and the ground noise.

It should also be noted that in FIG. 21, the interference noise signal is shown as entering the main signal channel and the signal modelling channel, but in practice, such as the bias noise, is generated in the main signal channel and in the signal modelling channel. For the sake of clarity, this case is not shown in FIG. 21, but is illustrated in the way of entering the signal channel.

This kind of noise generated during the operation of the signal channel, together with the signal, will be processed simultaneously by the signal channel. Therefore, the first processed electric charge signal finally output by the main signal channel and the second processed electric charge signal finally output by the signal modelling channel also carry the respective noises generated in the corresponding signal channels. This case of FIG. 21 is also applicable for other figures, and will not be described repeatedly herein.

For the interference noise signals above, the main signal channel will process the object electric charge signal and the interference noise signal simultaneously, obtaining the first processed electric charge signal. The signal modelling channel will process only the interference noise signal, obtaining the second processed electric charge signal. Combining with the case that the main signal channel and the signal modelling channel have the same timing sequence and the same structure, it may be seen that, compared with the second processed electric charge signal, the first processed electric charge signal contains the extra object electric charge signal.

Since the output of the main signal channel and the output of the signal modelling channel are both connected to the input of the analog-digital converter, the first processed electric charge signal and the second processed electric charge signal will enter the analog-digital converter simultaneously.

Then the analog-digital converter 104 may perform a processing of restraining noises based on the first processed electric charge signal and the second processed electric charge signal, so that the interference noise signals above may be eliminated to a certain extent from the quantized result corresponding to the analog signal finally output by the analog-digital converter, thus realizing the purpose of restraining the interference noise signals.

In an embodiment, the analog-digital converter 104 has a differential structure, and has the function of subtracting the second processed electric charge signal from the first processed electric charge signal, so after the first processed electric charge signal and the second processed electric charge signal enter the analog-digital converter 104, the analog-digital converter 104 performs the processing of restraining noise on the first processed electric charge signal and the second processed electric charge signal. The processing of restraining noise is a subtraction operation, thus obtaining the processed signal of the object electric charge signal itself, in which the interference noise signal is restrained. In this way, the analog-digital converter 104 performs an analog-digital conversion on the object electric charge signal itself, thereby obtaining the quantized value of the analog signal, in which the interference noise signal is restrained, and the quantized value is the value of the analog signal read out by the readout circuit.

In the readout circuit provided in the embodiment of the present application, the readout circuit includes a main signal channel, a signal modelling channel, and an analog-digital converter. The main signal channel is configured to process the object electric charge signal and the interference noise signal, to obtain the first processed electric charge signal. The signal modelling channel is configured to process the interference noise signal, to obtain the second processed electric charge signal. The analog-digital converter is configured to perform the processing of restraining noise on the first processed electric charge signal and the second processed electric charge signal, to obtain the quantized result corresponding to the analog signal. The signals which enter the main signal channel include the object electric charge signal and the interference noise signal, and the signal which enters the signal modelling channel includes only the interference noise signal, so compared with the second processed electric charge signal, the first processed electric charge signal contains the extra processed signal of the object electric charge signal itself. In this way, by performing the processing of restraining noise on the first processed electric charge signal and the second processed electric charge signal, the quantized value of the object electric charge signal in which the interference noise is restrained is obtained. Therefore, by arranging the main signal channel and the signal modelling channel, the interference noises in the readout circuit may be offset, thereby effectively restraining the interference noises in the readout circuit.

In an embodiment, the main signal channel and the signal modelling channel have the same timing sequence and the same structure, which may ensure that the processed signal of the extra object electric charge signal itself is more accurate and does not contain other noise information, thereby improving the effect of restraining noise from the quantized value of the object electric charge signal.

Figure 23:
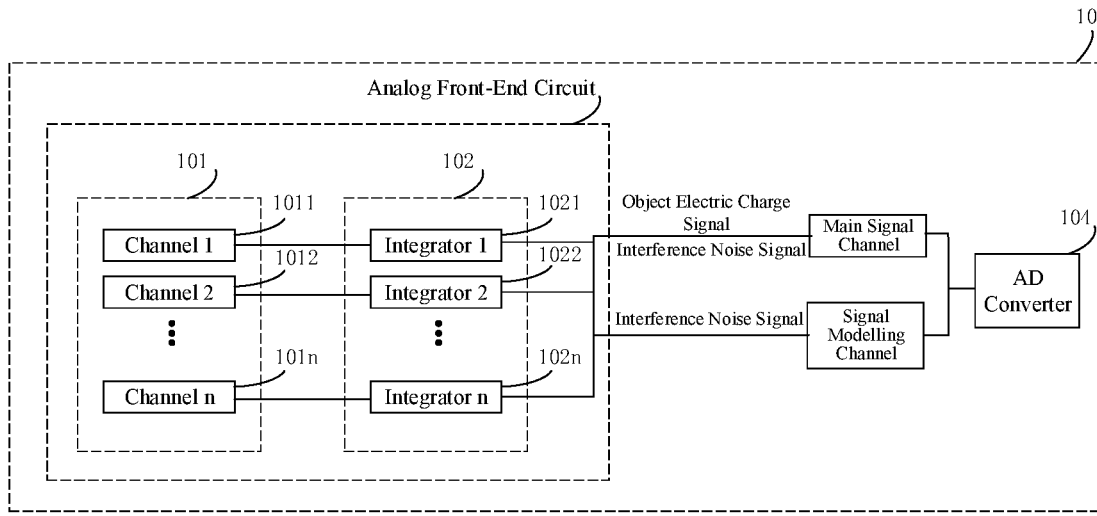
FIG. 23 is a schematic structural view showing the readout circuit according to yet another embodiment of the present application.

Based on the embodiments above, an implementation of an internal structure of an analog front-end circuit is provided. As shown in FIG. 23, the analog front-end circuit includes a signal sampler 101 and integrators 102. The signal sampler 101 includes a plurality of channels, and each channel of the signal sampler 101 is connected to one integrator 102. The signal sampler 101 is configured to sample the analog signals of the object device, and to transmit the analog signals to the respective integrators 102 of the channels to obtain the object electric charge signal output by each of the integrators 102.

The signal sampler 101 is configured to sample analog signals, such as optical signals, photoelectric signals, voice signals, temperature signals, etc. Correspondingly, the signal sampler 101 may be any type of sensors, such as a photoelectric sensor, a voice sensor, a temperature sensor, and the like.

Taking the photoelectric sensor as an example, the signal sampler 101 includes a plurality of channels 101 (including the channel 1 to the channel n), that is, the photoelectric sensor includes the plurality of channels. Usually, for a sensor, a multi-channel sensor is named relative to a single-channel sensor. For example, the difference between the multi-channel sensor and the single-channel sensor is the number of data that can be measured. Generally, the single-channel sensor can measure only one data, and the multi-channel sensor may measure a plurality of data. The specific number of channels of the multi-channel sensor is not limited in this embodiment of the present application, for example, 128 channels are provided, that is, n=128.

The signal sampler 101 is configured to sample the analog signals of the object device, and to transmit the analog signals to the respective integrators 102 of the channels to obtain the object electric charge signal output by each of the integrators 102.

The integrator 102 is a component whose output signal is the integration of the input signal over time. The integrator may be regarded as a counter in a continuous domain, and may accumulate the input and then output the accumulated value. In the embodiment of the present application, each of the channels (including the channel 1 to the channel n) of the signal sampler 101 is connected to one of the integrators 102 (including the integrator 1 to the integrator n), so that the signal sampled by the signal sampler 101 is converted into an object electric charge signal by the integrator 102. For example, the photoelectric signal sampled by the photoelectric sensor is converted into an electric charge signal by the integrator.

Please continue to refer to FIG. 23, assuming n=128, there will be 128 object electric charge signals, and these 128 object electric charge signals will all enter the main signal channel, and simultaneously, the interference noises generated in these 128 channels will all also enter the main signal channel and the signal modelling channel. That is to say, even if there are n signal samplers 101 and corresponding n integrators 102, there is only one main signal channel, one signal modelling channel, and one analog-digital converter 104 at the back end, which are common.

In this embodiment, the analog front-end circuit includes the signal sampler and the integrators, and the signal sampler including the plurality of channels that have a one-to-one correspondence with the integrators. In this way, for the analog signal of the object device sampled by any one of the channels of the signal sampler, the corresponding integrator may convert it into the corresponding electric charge signal, so that the object electric charge signal obtained based on the analog signal is more accurate.

Next, an implementable structure of the main signal channel and the signal modelling channel above will be described in some embodiments. It may be understood that, the implementable structure shown in these embodiments is only an example, but not intended to limit the present application.

Figure 24:
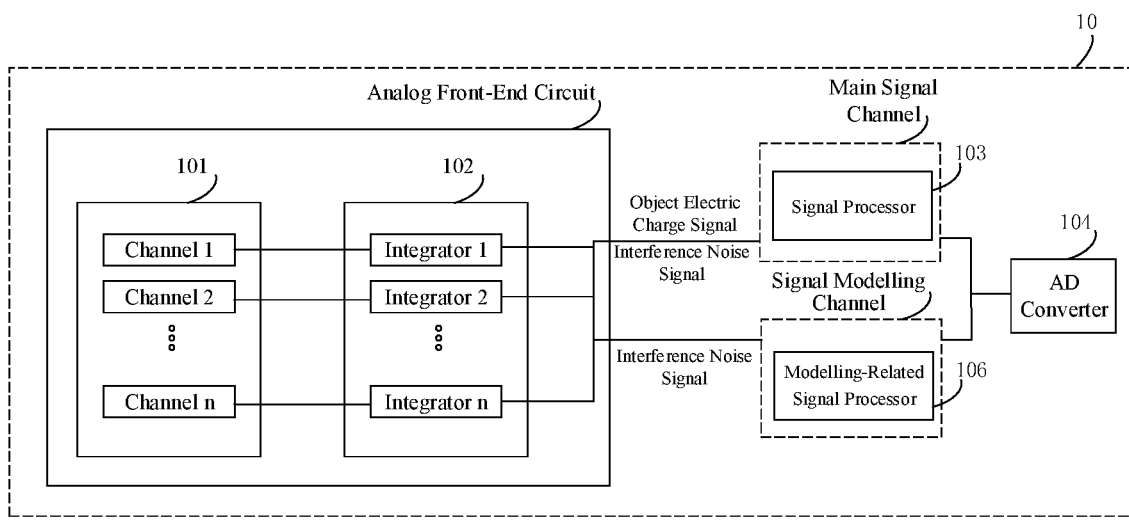
FIG. 24 is a schematic structural view showing the readout circuit according to yet another embodiment of the present application.

As shown in FIG. 24, in an embodiment, the main signal channel includes the signal processor 103. The signal processor 103 is configured to sample and hold the object electric charge signal and the interference noise signal, to obtain the first processed electric charge signal, and configured to output the first processed electric charge signal into the analog-digital converter 104. And/or the signal modelling channel includes the modelling-related signal processor 106. The signal modelling channel is configured to sample and hold the interference noise signal to obtain the second processed electric charge signal, and configured to output the second processed electric charge signal into the analog-digital converter 104.

The signal processor in the main signal channel is the signal processor 103, and the signal modelling channel includes the modelling-related signal processor 106. The modelling-related signal processor 106 is the same as the signal processor 103 in the above embodiments. The output of the signal processor 103 and the output of the modelling-related signal processor 106 are both connected to the input of the analog-digital converter 104.

The signal processing circuit is the front-end circuit of the analog-digital converter, and is configured to mainly sample the analog input and isolate the circuit, thereby providing relatively lossless noise for the analog-digital converter. In the embodiment of the present application, the object electric charge signals are held by the signal processor, so that the correct quantized results of the analog signals may be obtained after the electric charge signals are converted by the analog-digital converter at the back end.

The signals which enter the signal processor 103 are the object electric charge signal and the interference noise signal, and the signal processor 103 samples and holds the object electric charge signal and the interference noise signal, to obtain the first processed electric charge signal. Similarly, the signal which enters the modelling-related signal processor 106 is only the interference noise signal, and the modelling-related signal processor 106 samples and holds the interference noise signal, to obtain the second processed electric charge signal.

Please continue to refer to FIG. 24. The connection mode of the signal processor 103 is the same as that of the modelling-related signal processor 106, and the output of the signal processor 103 and the output of the modelling-related signal processor 106 both are connected to the input of the analog-digital converter 104. Accordingly, the first processed electric charge signal and the second processed electric charge signal will both be input into the analog-digital converter 104.

In an embodiment, both the signal processor 103 and the modelling-related signal processor 106 are flip-flop-capacitor-type signal processors.

The flip-flop-capacitor-type structure is a fully differential structure, which may well eliminate a DC bias and an even-order harmonic distortion, and restrain common-mode noises from the substrate. Moreover, the feedback coefficient of the flip-flop-capacitor-type structure is 1, so in the case of the same closed-loop bandwidth, the unit gain bandwidth (GBW) of the operational amplifier required by the flip-flop-capacitor-type structure is relatively small. Therefore, the flip-flop-capacitor-type structure of the embodiment of the present application may further reduce the final power consumption of the readout circuit.

In an embodiment, the signal processor 103 and the modelling-related signal processor 106 both have the gain-boost folded co-source co-gate structure.

The operational amplifier is the most important module in the signal processor, and the gain and the bandwidth of the operational amplifier directly determine the accuracy and the speed of the signal processor. A multi-stage amplifier, a relatively small bias current, and a long-channel device are required for the relatively high gain, while a single-stage amplifier, a relatively large bias current, and a short-channel device are required for the relatively large bandwidth. In view of these requirements, in the embodiment of the present application, the operational amplifiers of the signal processor 103 and modelling-related signal processor 106 adopt the gain-boost folded co-source co-gate structure, thereby improving the gain of the amplifier, and meeting the requirements of the relatively high gain and the relatively large bandwidth.

Therefore, the signal processor 103 and the modelling-related signal processor 106 adopt the gain-boost folded co-source co-gate structure, which enables the low-frequency gain and the bandwidth of the signal processor to be large enough to satisfy the establish accuracy and speed requirements of the analog-digital converter.

The signal processor 103 and the modelling-related signal processor 106 are the same signal processor. Therefore, the signal processor 103 is taken as an example to illustrate the sampling and holding process of the signal processor.

Specifically, please continue to refer to FIG. 24, after being output by the integrators connected to the channels, these object electric charge signals will all be input into the signal processor 103 through the input thereof in the order of the sequence numbers of the channels. For example, there are 128 channels, and the integrator of each channel outputs an object electric charge signal, then it is the object electric charge signal output by the integrator of the first channel that enters the sampling input of the signal processor 103 firstly, then the following signal is the object electric charge signal output by the integrator of the second channel, till the object electric charge signal output by the integrator of the 128th channel.

Controlled by the input logic levels, the signal processor 103 is in the "sampling" state or the "holding" state. In the "sampling" state, the output of the signal processor follows the input analog signal. In the "holding" state, the output of the signal processor holds an instantaneous input analog signal sampled when the previous sampling ends, till the next sampling state starts.

The object electric charge signal output by the signal processor 103 will be transmitted into the analog-digital converter 104. The analog-digital converter 104 is an electronic component configured to convert an analog signal into a digital signal. That is, after the electric charge signal is input into the analog-digital converter 104, the analog-digital converter 104 converts the electric charge signal into a digital signal and outputs the digital signal. The output digital signal is the quantized result of the analog signal of the object device, which is sampled by the signal sampler.

The above description is based on the object electric charge signal. The signal processor 103 samples and holds the object electric charge signal and the interference noise signal. Similarly, with the same principle, the modelling-related signal processor 106 samples and holds the interference noise signal.

Each channel of the signal sampler 101 is connected to one integrator 102. All the object electric charge signals and the interference noises signal output by all integrators will enter the signal processor 103. Simultaneously, the interference noise signals will also enter the signal modelling channel. That is to say, the object electric charge signals output by all channels in the readout circuit of the embodiment of the present application share the same signal processor, and the signal processor samples and holds the object electric charge signal of each channel, and provides a buffering function for the analog-digital converter, until all signals are converted by the analog-digital converter 104 at the back end, to obtain the correct quantized result of the analog signals, thereby significantly reducing power consumption and greatly simplifying the circuit structure. Moreover, the main signal channel and the signal modelling channel are both provided with the signal processors, one of which is configured to process the object electric charge signal and the interference noise signal, and the other of which is configured to process the interference noise signal, so that the difference between the processed signals of the two signal channels is only the object electric charge signal itself, thereby achieving the effect of restraining the interference noise in the readout circuit effectively.

Figure 25:
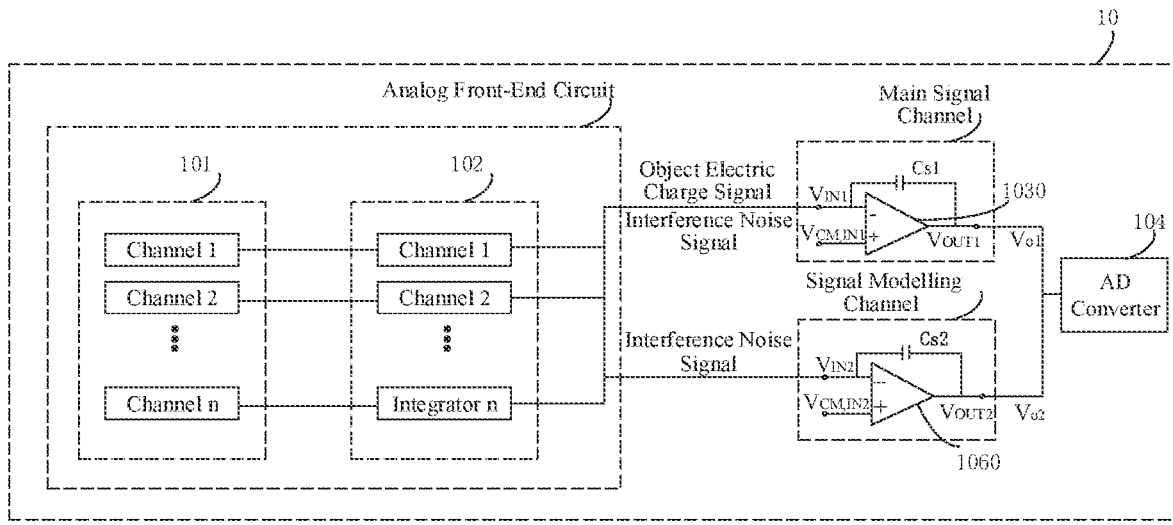
FIG. 25 is a schematic structural view showing the readout circuit according to yet another embodiment of the present application.

Based on the above embodiments, as shown in FIG. 25, in another embodiment, the main signal channel further includes a first sampling capacitor Cs1. The first sampling capacitor Cs1 is configured to be charged according to the object electric charge signal and the interference noise signal, and the first processed electric charge signal is configured to be discharge into the analog-digital converter 104 through the output of the signal processor 103. And/or, the signal modelling channel further includes a second sampling capacitor Cs2. The second sampling capacitor Cs2 is configured to be charged according to the interference noise signal, and the second processed electric charge signal is configured to be discharged into the analog-digital converter 104 through the output of the modelling-related signal processor 106.

In this embodiment, a first terminal of the first sampling capacitor Cs1 is connected to the sampling input of the signal processor 103, and a second terminal of the first sampling capacitor Cs1 is connected to the output of the signal processor 103. A first terminal of the second sampling capacitor Cs2 is connected to the sampling input of the second operational amplifier 1060, and a second terminal of the second sampling capacitor Cs2 is connected to the output of the second operational amplifier 1060.

The first operational amplifier 1030 and the second operational amplifier 1060 each are externally connected to a sampling capacitor, to realize the sampling and holding functions.

The first operational amplifier 1030 is externally connected to the first sampling capacitor Cs1. Please refer to FIG. 5, the first terminal of the first sampling capacitor Cs1 is connected to the sampling input $V_{IN1}$ of the signal processor 103, and the second terminal of the first sampling capacitor Cs1 is connected to the output $V_{OUT1}$ of the signal processor 103.

Based on the above connection mode, the first sampling capacitor Cs1 may be charged according to the object electric charge signal and the interference noise signal, and the first processed electric charge signal may be discharged into the analog-digital converter 104 through the output $V_{OUT1}$ of the signal processor 103.

Specifically, during operation, the signal processor 103 is in the "sampling" state or in the "holding" state. In the "sampling" state, that is, the object electric charge signal and the interference noise signal are input, through the sampling input $V_{IN1}$, into the first sampling capacitor Cs1 connected to the signal processor 103. At this time, the output voltage Vo1 at the output $V_{OUT1}$ may follow the input signal Vi at the input $V_{IN1}$, and the voltage of the first sampling capacitor Cs1 is the same as the input voltage at the sampling input $V_{IN1}$.

In the "holding" state, the first sampling capacitor Cs1 is neither charged nor discharged any longer, and when the "sampling" state is switched to the "holding" state, it indicates that the analog-digital converter 104 is currently converting the object electric charge signal signal of the previous channel. During the conversion, the first sampling capacitor Cs1 is neither charged nor discharged any longer, and the electric charge signal is held in the first sampling capacitor Cs1. At the same time, the value of the input signal Vi at the sampling input $V_{IN1}$ remains unchanged, and the output voltage Vo1 at the output $V_{OUT1}$ of the signal processor 103 remains a constant output for a very long time until the signal processor 103 is switched from being in the "holding" state to being in the "sampling" state. In this way, when the "sampling" state is switched to the "holding" state, that is, while the analog-digital converter 104 is converting the signal, the input signal is held unchanged by the first sampling capacitor Cs1, so that the analog-digital converter 104 may correctly convert the signal, thereby greatly improving the signal processing accuracy.

The second operational amplifier 1060 is externally connected to an second sampling capacitor Cs2. Please refer to FIG. 25, the first terminal of the second sampling capacitor Cs2 is connected to the sampling input $V_{IN2}$ of the second operational amplifier 1060, and a second terminal of the second sampling capacitor Cs2 is connected to the output $V_{OUT2}$ of the second operational amplifier 1060.

Based on the above connection method, the second sampling capacitor Cs2 may be charged according to the interference noise signal, and the second processing electric charge signal may be discharged to the analog-digital converter 104 through the output $V_{OU2}$ of the second operational amplifier 1060.

Specifically, during operation, the modelling-related signal processor 106 is in the "sampling" state or in the "holding" state. In the "sampling" state, that is, the interference noise signal is input, through the sampling input $V_{IN2}$, into the second sampling capacitor Cs2 connected to the modelling-related signal processor 106. At this time, the output voltage Vo2 at the output $V_{OUT2}$ may follow the input signal Vi at the input $V_{IN2}$, and the voltage of the second sampling capacitor Cs2 is the same as the input voltage at the input $V_{IN2}$.

In the "holding" state, the second sampling capacitor Cs2 is neither charged nor discharged any longer, and when the "sampling" state is switched to the "holding" state, it indicates that the analog-digital converter 104 is currently converting the signal. During the conversion, the second sampling capacitor Cs2 is neither charged nor discharged any longer, and the interference noise signal is held in the second sampling capacitor Cs2. At the same time, the value of the input signal Vi at the sampling input $V_{IN2}$ remains unchanged, and the output voltage Vo2 at the output $V_{OUT2}$ of the modelling-related signal processor 106 remains a constant output for a very long time until the modelling-related signal processor 106 is switched from being in the "holding" state to being in the "sampling" state. In this way, when the "sampling" state is switched to the "holding" state, that is, while the analog-digital converter 104 is converting the signal, the input signal is held unchanged by the second sampling capacitor Cs2, so that the analog-digital converter 104 may correctly convert the signal, thereby greatly improving the signal processing accuracy.

In addition, the signal processor 103 and the modelling-related signal processor 106 each have an input terminal namely a common-mode voltage input, that is the input $V_{CM,IN1}$ of the signal processor 103, and the input $V_{CM,IN2}$ of the modelling-related signal processor 106 shown in FIG. 25. The input common-mode voltage may be regarded as a reference voltage, referring to FIG. 25, it may be obtained that $Vo1=V_{IN1}-V_{CM,IN1}$, $Vo2=V_{IN2}-V_{CM,IN2}$.

In this embodiment, the main signal channel and the signal modelling channel each include a sampling capacitor, to realize the sampling of the object electric charge signal and the interference noise signal. The connection and working modes of the sampling capacitors of the main signal channel and the signal modelling channel are identical, but the signals to be processed thereof are different, so that the difference between the first processed electric charge signal and the second processed electric charge signal is only the object electric charge signal itself, so, after entering the analog-digital converter, the second processed electric charge signal is subtracted from the first processed electric charge signal, thus offsetting the identical interference noise signals, and obtaining the object electric charge signal itself, on which an analog-digital conversion is performed to obtain an accurate quantized value of the analog signal.

Figure 26:
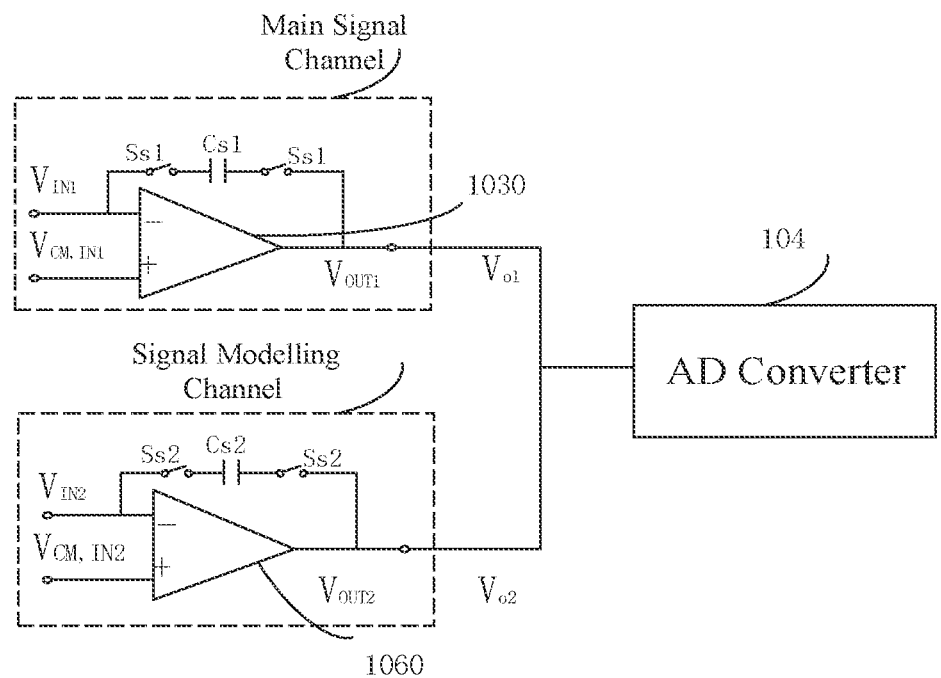
FIG. 26 is a schematic structural view showing a main signal channel and a signal modelling channel of the readout circuit according to an embodiment of the present application.

Optionally, as shown in FIG. 26, for the sake of clarity, the main signal channel and the signal modelling channel are illustrated separately. As shown in FIG. 26, based on the embodiments above, the main signal channel further includes first sampling switches Ss1, and two terminals of the first sampling capacitor Cs1 each are connected to one first sampling switch Ss1. The first sampling switches Ss1 are turned on when the first sampling capacitor Cs1 is charged or discharged. And/or the signal modelling channel further includes second sampling switches Ss2, and two terminals of the second sampling capacitor Cs2 each are connected to one second sampling switch Ss2. The second sampling switches Ss2 are turned on when the second sampling capacitor Cs2 is charged or discharged. Optionally, the sampling modes of the first sampling capacitor Cs1 and the second sampling capacitor Cs2 are both bottom-plate sampling.

When the "sampling" state is switched to the "holding" state, the sampling capacitors may be controlled neither to be charged nor to be discharged by arranging the sampling switches. In the embodiments, two terminals of the sampling capacitor each may be connected to one sampling switch.

Specifically, in the main signal channel, the two terminals of the first sampling capacitor Cs1 each are connected to one first sampling switch Ss1.

In the "sampling" state, when a control signal of the system controls the first sampling switches Ss1 to be turned on, the first sampling capacitor Cs1 is charged or discharged, that is, the input signal at the sampling input $V_{IN1}$ is input, through the sampling input $V_{IN1}$, into the first sampling capacitor Cs1 connected to the signal processor 103. At this time, the output voltage Vo1 at the output $V_{OUT1}$ may follow the input signal at the input terminal $V_{IN1}$, and the voltage of the first sampling capacitor Cs1 is the same as the input voltage at the input terminal $V_{IN1}$.

In the "holding" state, a logical control signal of the system controls the first sampling switches Ss1 to be turned off, which is equivalent that the first sampling capacitor Cs1 is only connected to a high-impedance input of the signal processor 103, the first sampling capacitor Cs1 is neither charged nor discharged any longer, and the electric charge signal and the interference noise signal are held in the first sampling capacitor Cs1. At this time, the value of the input signal at the sampling input $V_{IN1}$ remains unchanged, and the output voltage Vo1 at the output $V_{OUT1}$ of the signal processor 103 may also remain a constant output value for a long time, till the control signal controls the first sampling switches Ss1 to be turned on, and then the "holding" state is switched to the "sampling" state.

Likewise, in the signal modelling channel, the two terminals of the second sampling capacitor Cs2 each are connected to one second sampling switch Ss2.

In the "sampling" state, when a control signal of the system controls the second sampling switches Ss2 to be turned on, the second sampling capacitor Cs2 is charged or discharged, that is, the input signal at the sampling input $V_{IN2}$ is input, through the sampling input $V_{IN2}$, into the second sampling capacitor Cs2 connected to the modelling-related signal processor 106. At this time, the output voltage Vo2 at the output $V_{OUT2}$ may follow the input signal at the input terminal $V_{IN2}$, and the voltage of the second sampling capacitor Cs2 is the same as the input voltage at the input terminal $V_{IN2}$.

In the "holding" state, a control signal of the system controls the second sampling switches Ss2 to be turned off, which is equivalent that the second sampling capacitor Cs2 is only connected to a high-impedance input of the modelling-related signal processor 106, the second sampling capacitor Cs2 is neither charged nor discharged any longer, and the interference noise signal is held in the second sampling capacitor Cs2. At this time, the value of the input signal at the sampling input $V_{IN2}$ remains unchanged, and the output voltage Vo2 at the output $V_{OUT2}$ of the modelling-related signal processor 106 may also remain a constant output value for a long time, till the control signal controls the second sampling switches Ss2 to be turned on, and then the "holding" state is switched to the "sampling" state.

In this embodiment, in both the main signal channel and the signal modelling channel, when the "sampling" state is switched to the "holding" state, the sampling capacitor is controlled to be switched from the state of being charged or discharged to the state of neither being charged nor being discharged by the sampling switches. So that, while the analog-digital converter is converting the signal, the input signal remains unchanged in the sampling capacitor, thereby ensuring that the analog-digital converter converts the signal correctly, thereby greatly improving the signal processing accuracy.

In addition, in the embodiment of the present application, when the first sampling capacitor Cs1 and the second sampling capacitor Cs2 are in the sampling state, they may sample by means of the bottom-plate sampling mode, and the signals may be processed in the charge domain by means of the bottom-plate sampling. The signal processor 103 and the modelling-related signal processor 106 each adopt a flip-flop-capacitor-type signal processor. In this structure, the feedback coefficient of the signal processor 103 and the feedback coefficient of the modelling-related signal processor 106 may be reduced. In this way, when the actual product is implemented, according to the principle of charge conservation, the total parasitic capacitor Cpar caused by the layout wiring of the multiplex signal processor 103 and the modelling-related signal processor 106 will not cause the reduction of the signal-to-noise ratio of the signal channel. As long as the signal of the signal processor 103 and the modelling-related signal processor 106 are fully established, the point potential of the sampling input of the signal processor 103 is equal to the common-mode voltage terminal thereof, and the point potential of the sampling input of the modelling-related signal processor 106 is equal to the common-mode voltage terminal thereof, and the electric charge signals will be completely held in the respective sampling capacitors, thereby guaranteeing the integrality of the signals and the sampling accuracy to the maximum extent.

In practical applications, when the readout circuit of the above structure is implemented in form of a product, the parasitic capacitance caused by the layout wiring of multiplex circuit board may be reduced as much as possible by rationally arranging the layout wiring of the circuit board. The detailed rational arrangement of the layout wiring of the circuit board is not limited in the embodiments of the present application, and the wiring may be arranged according to actual needs during implementation of the product.

When the multiplex signal processor continuously processes the signal charges of the plurality of channels, the memory effect of the signal processor will cause mutual interference between the plurality of channels, which affects the accuracy of signal processing.

Figure 27:
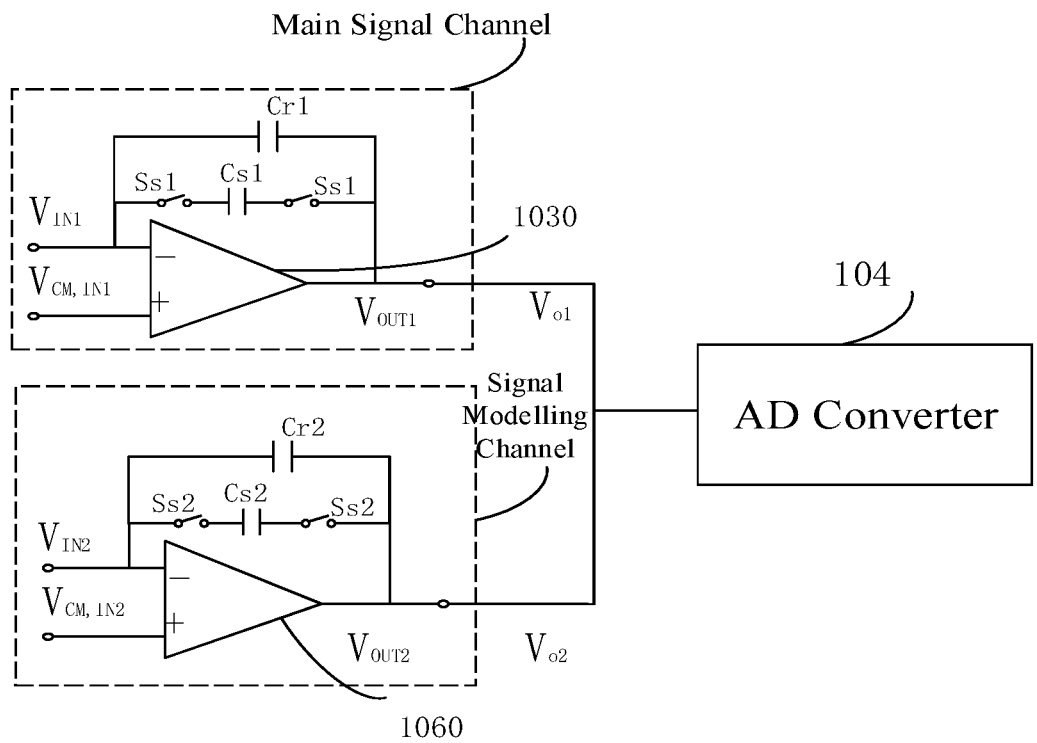
FIG. 27 is a schematic structural view showing the main signal channel and the signal modelling channel of the readout circuit according to another embodiment of the present application.

In view of this, in order to reduce the mutual interference between the plurality of channels caused by the memory effect of the signal processor, the embodiment of the present application further provides a readout circuit. As shown in FIG. 27, the main signal channel further includes a first resetting capacitor Cr1. The first terminal of the first resetting capacitor Cr1 is connected to the sampling input of the signal processor 103, and the second terminal of the first resetting capacitor Cr1 is connected to the output of the signal processor 103. And/or the signal modelling channel further includes a second resetting capacitor Cr2. The first terminal of the second resetting capacitor Cr2 is connected to the sampling input of the second operational amplifier 1060, and the second terminal of the second resetting capacitor Cr2 is connected to the output of the second operational amplifier 1060. The first resetting capacitor Cr1 is configured to, after the object electric charge signal and the interference noise signal are processed once, reset the voltage at the sampling input of the signal processor 103 to an initial input voltage, and to reset the voltage at the output of the signal processor 103 to an initial output voltage. The second resetting capacitor Cr2 is configured to, after the interference noise signal is processed once, reset the voltage at the sampling input of the modelling-related signal processor 106 to an initial input voltage, and to reset the voltage at the output of the modelling-related signal processor 106 to the initial output voltage.

Based on any one of the embodiments above, in this embodiment, the memory effect of the signal processor is eliminated by connecting the resetting capacitors.

Illustratively, please continue to refer to FIG. 27, for the main signal channel, the first terminal of the first resetting capacitor Cr1 is connected to the sampling input of the signal processor 103, and the second terminal of the first resetting capacitor Cr1 is connected to the output of the signal processor 103. Based on the connection mode, after the object electric charge signal and the interference noise signal are processed once, the first resetting capacitor Cr1 resets the voltage at the sampling input of the signal processor 103 to the initial input voltage and resets the voltage at the output of the signal processor 103 to the initial output voltage.

In this way, after the first sampling capacitor Cs1 finishes processing the signal of one channel, the input and the output of the signal processor 103 are reset to the initial values by the first resetting capacitor Cr1. That is, the voltage at the sampling input $V_{IN1}$ of the signal processor 103 is reset to the initial input voltage, and the voltage at the output $V_{OUT1}$ of the signal processor 103 is reset to the initial output voltage, thereby avoiding the mutual interference between the plurality of channels caused by the memory effect of the signal processor. It may be understood that the initial values herein are the voltage values of the signal processor in the initial state, and may be obtained in advance.

Similarly, for the signal modelling channel, the first terminal of the second resetting capacitor Cr2 is connected to the sampling input of the second operational amplifier 1060, and the second terminal of the second resetting capacitor Cr2 is connected to the output of the second operational amplifier 1060. Based on this connection method, after the interference noise signal is processed once, the second resetting capacitor Cr2 resets the voltage of the sampling input of the modelling-related signal processor 106 to the initial input voltage, and resets the voltage at the output of the modelling-related signal processor 106 to the initial output voltage.

After the second sampling capacitor Cs2 finished processing the signal of one channel, the second resetting capacitor Cr2 resets the input and output of the modelling-related signal processor 106 to the initial values. That is, the voltage at the sampling input $V_{IN2}$ of the modelling-related signal processor 106 is reset to the initial input voltage, and the voltage at the output $V_{OUT2}$ of the modelling-related signal processor 106 is reset to the initial output voltage, thereby avoiding the mutual interference between the plurality of channels caused by the memory effect of the signal processor. It may be understood that the initial values herein are the voltage values of the signal processor in the initial state, and may be obtained in advance.

Figure 28:
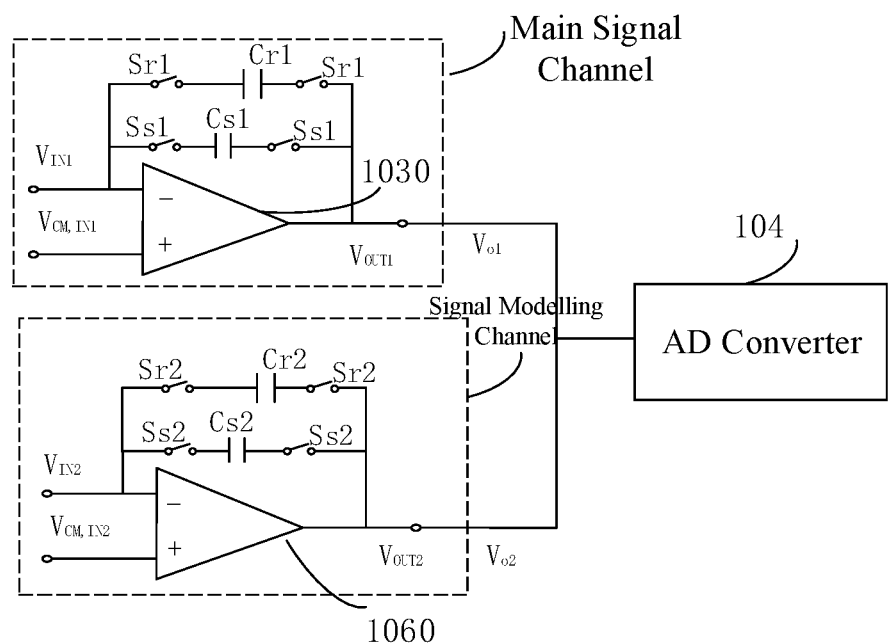
FIG. 28 is a schematic structural view showing the main signal channel and the signal modelling channel of the readout circuit according to yet another embodiment of the present application.

In an embodiment, as shown in FIG. 28, the main signal channel further includes the first resetting switches Sr1, and two terminals of the first resetting capacitor Cr1 each are connected to one first resetting switch Sr1. The first resetting switches Sr1 are turned on when the first resetting capacitor Cr1 is resetting. And/or, the signal modelling channel further includes the second resetting switches Sr2. Two terminals of the second resetting capacitor Cr2 each are connected to one second resetting switch Sr2. The second resetting switches Sr2 are turned on when the second resetting capacitor Cr2 is resetting (the resetting switches shown in FIG. 28 are in a state of being turned off).

Both the first resetting capacitor Cr1 and the second resetting capacitor Cr2 reset once after each processing for one channel is finished, to eliminate a residual memory of the previous processing for the signal of the channel, which remains in the signal processor, and to avoid affecting the signal processing accuracy. It should be understood that, neither the first resetting capacitor Cr1 nor the second resetting capacitor Cr2 needs to perform the reset function while the same electric charge signal of one channel is being processed.

In the embodiment, the reset functions of the first resetting capacitor Cr1 and the second resetting capacitor Cr2 may be implemented by setting the resetting switches, that is, the first resetting switch Sr1 controls the first resetting capacitor Cr1 to reset, and the second resetting switch Sr2 controls the second resetting capacitor Cr2 to reset. For example, the first resetting switch Sr1 and the second resetting switch Sr2 may be controlled to be turned on or to be turned off by logic control signals.

Specifically, the first resetting switches Sr1 are turned on when the first resetting capacitor Cr1 is resetting, and turned off when the first resetting capacitor Cr1 needs not to perform the reset function. The second resetting switches Sr2 are turned on when the second resetting capacitor Cr2 is resetting, and turned off when the second resetting capacitor Cr2 needs not to perform reset function.

It may be understood that, taking the first sampling capacitor Cs1 in the "sampling" state and finishing processing the signal of one channel as an example, the reset function of the first resetting capacitor Cr1 is performed when the first sampling capacitor Cs1 is switched from being in the "sampling" state to being in the "holding" state, that is, the first resetting switches Sr1 of the first resetting capacitor Cr1 and the first sampling switches Ss1 of the first sampling capacitor Cs1 cannot be turned on or turned off simultaneously. That is, when the first resetting switches Sr1 are turned off, the first sampling switches Ss1 are turned on, and when the first resetting switches Sr1 are turned on, the first sampling switches Ss1 are turned off. Likewise, the logic relationship between the second resetting switches Sr2 and the second sampling switches Ss2 is identical, and will not be described repeatedly herein.

Figure 29:
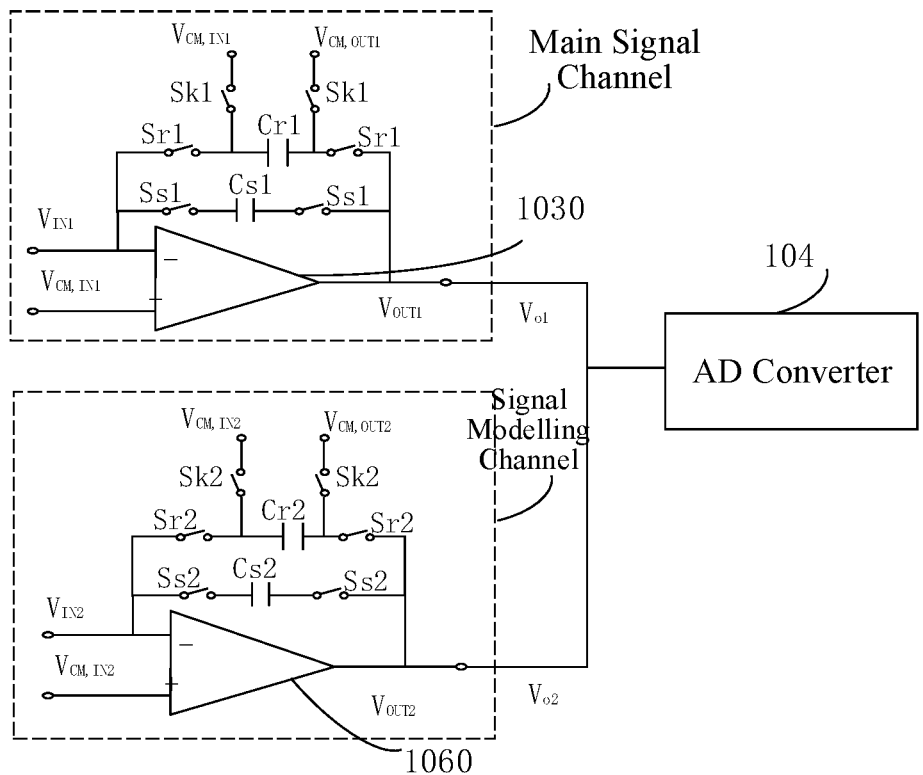
FIG. 29 is a schematic structural view showing the main signal channel and the signal modelling channel of the readout circuit according to yet another embodiment of the present application.

As shown in FIG. 29, in another embodiment, the main signal channel further includes the first holding switches Sk1, one of which is connected between the first terminal of the first resetting capacitor Cr1 and the common-mode voltage input, and another of which is connected between the second terminal of the first resetting capacitor Cr1 and the common-mode voltage output. The first holding switches Sk1 are turned on while the signal processor 103 is sampling. And/or, the signal modelling channel further includes the second holding switches Sk2, one of which is connected between a first terminal of the second resetting capacitor Cr2 and the common-mode voltage input, another of which is connected between a second terminal of the second resetting capacitor Cr2 and the common-mode voltage output. The second holding switches Sk2 are turned on while the modelling-related signal processor 106 is sampling.

When the first sampling capacitor Cs1 is sampling, the first holding switches Sk1 are controlled by the logic control signal to be turned on, so that the voltages at two terminals (points A and B shown in FIG. 29) of the first resetting capacitor Cr1 are reset to the input common-mode voltage and the output common-mode voltage of the signal processor 103, respectively. That is, the voltage at the point A is reset to the same as the input common-mode voltage at the common-mode voltage input $V_{CM,IN1}$ of the signal processor 103, and the voltage at the point B is reset to be the same as the output common-mode voltage at the common-mode voltage output $V_{CM,OUT1}$ of the signal processor 103. In this way, it may be ensured that, before and after the capacitor is flip-flopped, the direct-current operating points of the signal processor 103 (of the flip-flop-capacitor type) are the same, thus preventing the signal processor 103 from deviating from a normal working state to affect the establishment of the output signal.

When the second sampling capacitor Cs2 is sampling, the second holding switches Sk2 are controlled by the logic control signal to be turned on, so that the voltages at two terminals (points C and D shown in FIG. 29) of the second resetting capacitor Cr2 are reset to the input common-mode voltage and the output common-mode voltage of the modelling-related signal processor 106, respectively. That is, the voltage at the point C is reset to the same as the input common-mode voltage at the common-mode voltage input $V_{CM,IN2}$ of the modelling-related signal processor 106, and the voltage at the point D is reset to be the same as the output common-mode voltage at the common-mode voltage output $V_{CM,OUT2}$ of the modelling-related signal processor 106. In this way, it can be ensured that, before and after the capacitor is flip-flopped, the direct-current operating points of the modelling-related signal processor 106 (of the flip-flop-capacitor type) are the same, thus preventing the modelling-related signal processor 106 from deviating from a normal working state to affect the establishment of the output signal.

It should be noted that, in the circuit architecture shown in the above embodiments, the number of the channels of the readout circuit, the accuracy and speed of reading, the structure and the gain and the bandwidth of the amplifier, etc., may all be adjusted according to actual applications, which are not limited in the embodiments of the present application.

In addition, an embodiment of the present application further provides a processor. The processor includes any one of the readout circuits provided in the embodiments above. In an embodiment, a computer device is further provided, and the computer device includes a processor implementing any one of the readout circuits.

A processor can be regarded as a very large-scale integrated circuit, which includes arithmetic units, controllers, registers, memories, readout circuits, and so on. The processors include but are not limited to a central processing unit (CPU), a graphics processing unit (GPU), a field programmable gate array (FPGA), a digital signal processing processing, (DSP), an application specific integrated circuit (ASIC), etc., which are not limited in this embodiment of the present application.

The computer device means any terminal or electronic device that requires an external power supply or a built-in power supply, such as various personal computers, notebook computers, mobile phones (smart mobile terminals), tablet computers, and portable wearable devices, which are not limited in this embodiment. If it is an external power source, the power source may be a power adapter, a mobile power source (a portable charger, a travel charger), etc., which is not limited in this embodiment. The computer device may include any processor implementing any one of the readout circuits.

Figure 30:
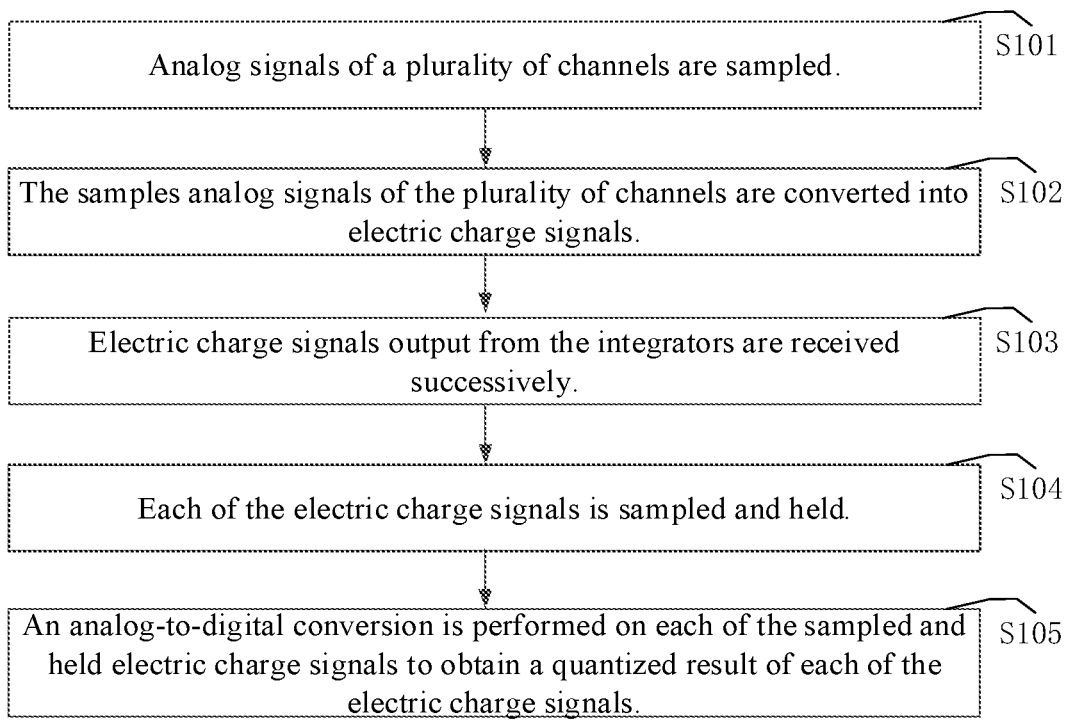
FIG. 30 is a flow chart showing a signal quantizing method according to an embodiment of the present application.

In addition, an embodiment of the present application further provides a signal quantizing method. As shown in FIG. 30, the signal quantizing method may be applied to the readout circuit provided by any one of the embodiments. The signal quantizing method of the embodiment includes following steps S101 to S105.

At step S101, analog signals of a plurality of channels are sampled.

At step S102, the analog signals sampled from the plurality of channels are converted into electric charge signals.

At step S103, electric charge signals output from the integrators are received successively.

At step S104, each of the electric charge signals is sampled and held.

At step S105, an analog-digital conversion is performed on each of the sampled and held electric charge signals to obtain a quantized result of each of the electric charge signals.

A program instruction may be preset to instruct a computer device to quantizing a signal. After receiving a trigger of the program instruction, the computer device performs corresponding operations. That is, according to the preset configuration, the computer device starts to receive the electric charge signals output from the integrators successively, and samples and holds each of the electric charge signals. Then, the computer device may continue to execute the preset program instruction, and performs the analog-digital conversion on the sampled and held electric charge signals, to obtain the quantized result of electric charge signal.

It will be appreciated that the above process is implemented by computer program instructions provided into the processor of a general-purpose computer, special purpose computer, embedded processor, or other programmable data processing device, so that the instructions can be executed by the processor of the computer or other programmable data processing device to implement the signal quantization in this embodiment. Of course, these computer program instructions may also be stored in a computer readable memory capable of directing a computer or other programmable data processing device to function in a particular manner, such that the instructions stored in the computer readable memory result in an article of manufacture comprising the instruction device. Alternatively, these computer program instructions can also be loaded on a computer or other programmable data processing device, such that a series of operational steps are performed on the computer or other programmable device to produce a computer-implementable processing. As such, the functions described above may be implemented by executing the computer program instructions on the computer or other programmable device-.

The principle and logic of implementing each step according to the program instruction in this embodiment may be the same as the principle and logic—of the readout circuit of each of the above-mentioned embodiments, which will not be repeated in this embodiment of the present application. Of course, when the signal quantization is implemented in combination with the program instructions, the implementation can be modified as appropriate, which is not limited in the embodiments of the present application.

Based on the signal quantizing method above, the embodiment of the present application further provides a signal quantizing device, and the signal quantizing device includes a receiving module and a quantizing module.

The receiving module is configured to receive a plurality of electric charge signals, and to sample and hold each of the plurality of electric charge signals.

The quantizing module is configured to perform an analog-digital conversion on each of the plurality of sampled and held electric charge signals and obtain a quantized result of each of the plurality of the electric charge signals.

The principle of each of the steps performed in the above signal quantizing device is the same as the principle and logic of the signal quantizing method and the readout circuit of each of the embodiments, and the details may be referred to the description above and will not be described repeatedly herein.

Figure 31:
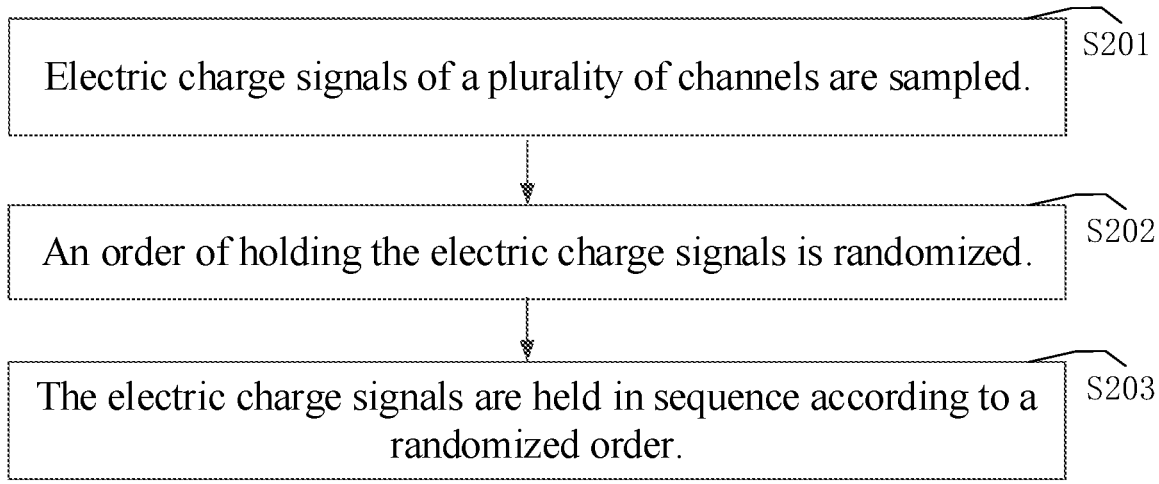
FIG. 31 is a flow chart showing an error processing method according to an embodiment of the present application.

The embodiment of the present application further provides an error processing method. As shown in FIG. 31, the error processing method may be applied to the readout circuit provided by any one of the above embodiments, and the embodiment includes following steps.

At step S201, electric charge signals of a plurality of channels are sampled.

At step S202, an order of holding the electric charge signals is randomized.

At step S203, the electric charge signals are held in sequence according to a randomized order.

A program instruction may be preset to instruct a computer device to process an error. After receiving a trigger of the program instruction, the computer device executes corresponding operations. That is, according to the preset configuration, the computer device starts to sample the object electric charge signals of the plurality of channels, and randomize the order of holding the object electric charge signals. Then, the computer device may continue to execute the preset program instruction, and hold the object electric charge signals in sequence according to the randomized order. Thereafter, the computer device may continue to perform a conversion processing on the held object electric charge signals according to the preset program instruction and obtain the quantized results corresponding to the object electric charge signals, namely, the quantized result corresponding to the analog signals. For example, the conversion processing may convert an analog signal to a digital signal.

It will be appreciated that the above process is implemented by computer program instructions provided into the processor of a general-purpose computer, special purpose computer, embedded processor, or other programmable data processing device, so that the instructions can be executed by the processor of the computer or other programmable data processing device to implement restraining the noise in this embodiment. Of course, these computer program instructions may also be stored in a computer readable memory capable of directing a computer or other programmable data processing device to function in a particular manner, such that the instructions stored in the computer readable memory result in an article of manufacture comprising the instruction device. Alternatively, these computer program instructions can also be loaded on a computer or other programmable data processing device, such that a series of operational steps are performed on the computer or other programmable device to produce a computer-implementable processing. As such, the functions described above may be implemented by executing the computer program instructions on the computer or other programmable device.

The principle and logic of implementing each step according to the program instruction in this embodiment may be the same as the principle and logic of the readout circuit of each of the above-mentioned embodiments, which will not be repeated in this embodiment of the present application. Of course, when restraining noise is implemented in combination with program instructions, the implementation manner may be modified as appropriate, which is not limited in this embodiment of the present application.

Based on the error processing method above, the embodiment of the present application further provides an error processing device. The error processing device includes a sampling module, an order processing module, and a holding processing module.

The sampling module is configured to sample object electric charge signals of a plurality of channels.

The order processing module is configured to randomize an order in which the object electric charge signals are held.

The holding processing module is configured to perform a holding processing on each of the object electric charge signals in sequence according to the randomized order.

The principle of each of the steps performed in the above error processing device is the same as the principle and logic of the error processing method and the readout circuit of each of the embodiments, and the details may be referred to the description above and will not be described repeatedly herein.

Figure 32:
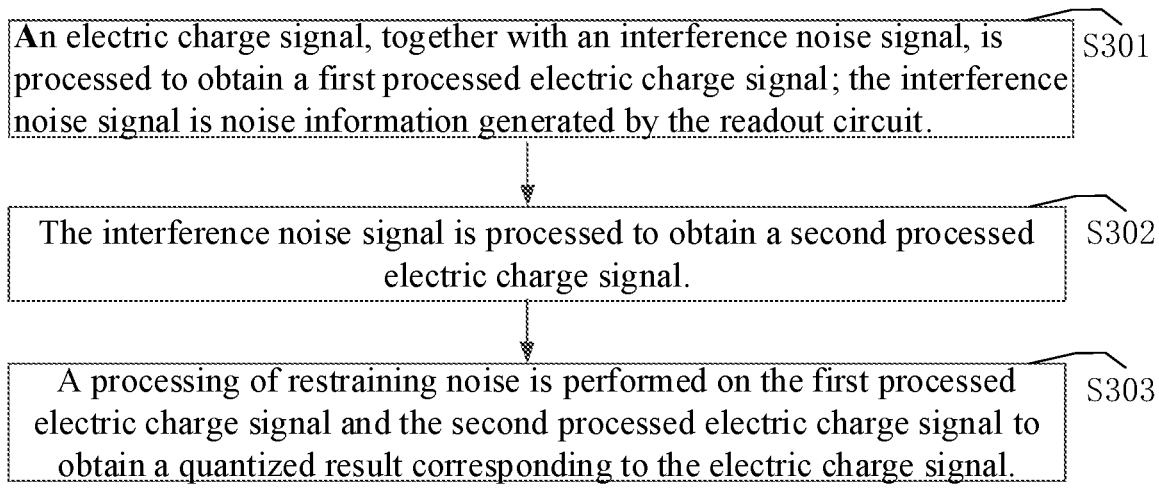
FIG. 32 is a flow chart showing a noise restraining method according to an embodiment of the present application.

The embodiment of the present application also provides a noise restraining method. As shown in FIG. 32, the noise restraining method is applied to the readout circuit, and the embodiment includes following steps.

At step S301, an electric charge signal, together with an interference noise signal, is processed to obtain a first processed electric charge signal; the interference noise signal is noise information generated by the readout circuit.

At step S302, the interference noise signal is processed to obtain a second processed electric charge signal.

At step S303, a processing of restraining noise is performed on the first processed electric charge signal and the second processed electric charge signal to obtain a quantized result corresponding to the electric charge signal.

A program instruction may be preset to instruct to restrain noise. After receiving a trigger of the program instruction, the computer device executes corresponding operations. That is, according to the preset configuration, the computer processes the object electric charge signal together with the interference noise signal to obtain the first processed electric charge signal, and processes the interference noise signal to obtain the second processed electric charge signal. Then, the computer device may continue to execute the preset program instructions, and performs a processing of restraining noise on the first processed electric charge signal and the second processed electric charge signal, to obtain a quantized result corresponding to the object electric charge signal. For example, the processing of restraining noise is performed by subtracting the second processed electric charge signal from the first processed electric charge signal, to obtain a difference, and then an analog-digital conversion is performed on the difference to obtain the quantized result corresponding to the analog signal.

It will be appreciated that the above process is implemented by computer program instructions provided into the processor of a general-purpose computer, special purpose computer, embedded processor, or other programmable data processing device, so that the instructions may be executed by the processor of the computer or other programmable data processing device to implement restraining the noise in this embodiment. Of course, these computer program instructions may also be stored in a computer readable memory capable of directing a computer or other programmable data processing device to function in a particular manner, such that the instructions stored in the computer readable memory result in an article of manufacture comprising the instruction device. Alternatively, these computer program instructions can also be loaded on a computer or other programmable data processing device, such that a series of operational steps are performed on the computer or other programmable device to produce a computer-implementable processing. As such, the functions described above may be implemented by executing the computer program instructions on the computer or other programmable device.

The principle and logic of implementing each step according to the program instruction in this embodiment may be the same as the principle and logic of the readout circuit of each of the above-mentioned embodiments, which will not be repeated in this embodiment of the present application. Of course, when restraining noise is implemented in combination with program instructions, the implementation manner may be modified as appropriate, which is not limited in this embodiment of the present application.

Based on the noise restraining method above, an embodiment of the present application further provides a noise restraining device. The noise restraining device includes the first processing module, the second processing module and the third processing module.

The first processing module is configured to process an object electric charge signal together with an interference noise signal, to obtain a first processed electric charge signal. The interference noise signal is noise information generated by the readout circuit.

The second processing module is configured to process the interference noise signal to obtain a second processed electric charge signal.

The third processing module is configured to perform a processing of restraining noise on the first processed electric charge signal and the second processed electric charge signal, to obtain a quantized result corresponding to the object electric charge signal.

The principle of each of the steps performed in the above noise restraining device is the same as the principle and logic of the noise restraining method and the readout circuit of each embodiment, and the details may be referred to the description above and will not be described repeatedly herein.

In addition, an embodiment of the present application also provides a computer device, including a memory and a processor. A computer program is stored in the memory, and when the computer program is executed by the processor, the processor performs steps of any one of the signal quantizing methods, the error processing method, and the noise restraining method provided by the above embodiments.

Some embodiments of the present application further provide a computer-readable storage medium, on which a computer program is stored, and when performed, the computer program realizes any one of the signal quantizing methods, the error processing method, and the noise restraining method provided by the above embodiments.

A computer program product of an embodiment of the present application includes a computer program. When performed, the computer program performs steps of any one of the signal quantizing methods, the error processing method, and the noise restraining method provided in the embodiments above.

In some embodiments, the present disclosure further provides a chip including the readout circuit provided in any one of the above embodiments. In an implementation, the chip is a system on chip (SoC) and integrates a variety of functional devices. The chip may be connected to other relevant components via an external interface device. The other relevant components may be, for example, a camera, a display, a mouse, a keyboard, a network interface card, or a wifi interface. In some application scenarios, other processing units (e.g., video codecs) and/or interface modules (e.g., DRAM interfaces), etc., may be integrated on the chip. In some embodiment, the present disclosure also provides a chip package structure including the chip described above. In some embodiment, the present disclosure also provides a board including the chip package structure described above.

From the foregoing description, it will be understood by those skilled in the art that the present disclosure also provides an electronic device or apparatus that may include one or more of the above-described boards.

According to different application scenarios, the electronic device or apparatus of the present disclosure may include a server, a cloud server, a server cluster, a data processing device, a robot, a computer, a printer, a scanner, a tablet computer, an intelligent terminal, a PC apparatus, an Internet of Things terminal, a mobile terminal, a mobile phone, a driving recorder, a navigator, a sensor, a monitor, a camera, a camcorder, a projector, a wristwatch, an earphone, a removable memory, a wearable apparatus, a visual terminal, an autopilot terminal, a vehicle, a home appliance, and/or a medical apparatus. The vehicle may include an aircraft, a ship, and/or an automobile. The home appliance may include a television, an air conditioner, a microwave oven, a refrigerator, a rice cooker, a humidifier, a washing machine, an electric lamp, a gas cooker, and a smoke exhauster. The medical apparatus may include a nuclear magnetic resonance instrument, a B-ultrasound instrument, and/or an electrocardiograph. The electronic device or apparatus of the present disclosure may also be applied to fields of Internet, Internet of Things, data center, energy, transportation, public administration, manufacturing, education, power grid, telecommunications, finance, retail, worksite, medical treatment, and the like. Further, the electronic device or apparatus of the present disclosure may also be used in application scenarios related to artificial intelligence, big data, and/or cloud computing such as a cloud, an edge, a terminal, and the like. In one or more embodiment, an electronic device or apparatus having high computational power according to the solution of the present disclosure may be applied to a cloud-side apparatus (e.g., a cloud server), and an electronic device or apparatus having a low power consumption may be applied to a terminal apparatus and/or an edge-side apparatus (e.g., a smartphone or a camera). In one or more embodiment, the hardware information of the cloud-side apparatus is compatible with the hardware information of the terminal apparatus and/or the edge-side apparatus, so that the hardware resources of the terminal apparatus and/or the edge-side apparatus can be simulated by suitable hardware sources matched from the hardware resources of the cloud device according to the hardware information of the terminal apparatus and/or the edge-side apparatus, to achieve the unified management, scheduling and collaborative work of terminal-cloud integration or cloud-edge-terminal integration.

It should be noted that, for the purpose of simplicity, this disclosure describes some methods and embodiments thereof by a series of actions and combinations thereof, but those skilled in the art may understand that the schemes of the present application are not limited by the order of the described actions. Based on the disclosure or teachings of this disclosure, those skilled in the art should understand that some of the steps may be performed in other orders or simultaneously. Further, those skilled in the art may understand that the embodiments described in the present disclosure may be regarded as optional embodiments, that is, the actions or modules involved therein are not necessary for realizing one or some solutions of the present application. In addition, according to different solutions, the description of some embodiments in the disclosure also has its own emphasis. In view of this, those skilled in the art may understand that parts not described in detail in a certain embodiment of the present disclosure may also refer to the related descriptions of other embodiments.

In terms of specific implementations, based on the disclosure and teaching of the application, those skilled in the art may understand that several embodiments disclosed in the disclosure may also be implemented in other ways not disclosed herein. For example, for the electronic device or each unit in the device embodiment described above, they are divided based on considering their logical functions, but there may also be other dividing methods in actual implementations. For another example, multiple units or components may be combined or integrated into another system, or some features or functions of the units or the components may be selectively disabled. For the connection relationship between different units or components, the connections discussed above in conjunction with the accompanying drawings may be direct or indirect interconnections between units or components. In some scenarios, the above direct or indirect interconnections involves a communication connection by means of an interface, and the communication interface may support electrical, optical, acoustic, magnetic, or other forms of signal transmissions.

In the present disclosure, the units described as separate parts may be physically separated or not, and the parts shown as units may be physical units or not. The components or units above may be located in the same location or distributed on a plurality of network units. In addition, some or all units may be selected to achieve the purposes of implementing the solutions described in the embodiments of the present disclosure according to actual requirements. In addition, in some scenarios, the plurality of units in the embodiments of the present disclosure may be integrated in one unit or be located in each physical unit separately.

In some implementation scenarios, the above integrated units described above may be implemented in the form of software program modules. If implemented in the form of a software program module and sold or used as a stand-alone product, the integrated unit may be stored in a computer-readable memory. Based on this, when the solutions of the present disclosure are embodied in the form of a software product, such as a computer-readable storage medium, the software product may be stored in a memory that may include a plurality of instructions, which enable a computer device, such as a personal computer, a server, or a network device, to perform some or all steps of the method described in the embodiments of the present disclosure. The foregoing memory may include, but is not limited to, a USB drive, a flash drive, a read-only memory (ROM), a random-access memory (RAM), a removable hard disk, a magnetic disk, an optical disc, or any other medium capable of storing program codes.

In other implementation scenarios, the integrated units described above may also be implemented in the form of hardware, that is, specific hardware circuits, which may include digital circuits and/or analog circuits. A physical implementation of a hardware structure of a circuit may include, but is not limited to, a physical device, which may include, but is not limited to, a transistor, a memristor, or the like. In view of this, various devices described herein, such as computing devices or other processing devices, may be implemented by a suitable hardware processor, such as a CPU, GPU, FPGA, DSP, ASIC, and the like. Further, the aforementioned storage unit or storage device may be any suitable storage medium (including a magnetic storage medium, a magneto-optical storage medium, or the like), which may be, for example, RRAM (Resistive Random Access Memory), DRAM (Dynamic Random Access Memory), SRAM (Static Random Access Memory), EDRAM (Enhanced Dynamic Random Access Memory), HBM (High Bandwidth Memory), HMC (Hybrid Memory Cube), ROM and RAM, or the like.

While multiple embodiments of the present disclosure have been illustrated and described herein, it will be apparent to those skilled in the art that such embodiments are provided by way of example only. Many modifications, changes, and replacements may be made by those skilled in the art without departing from the ideas and spirit of the present disclosure. It should be understood that various alternatives to an embodiment according to the present disclosure described herein may be used in the practice of the present disclosure. The appended claims are intended to define the scope of the present disclosure and thus cover equivalents or alternatives within the scope of these claims.

In the above-mentioned embodiments, the description of each embodiment has its emphasis. For parts that are not described in detail in a certain embodiment, reference may be made to the relevant descriptions of other embodiments.

The technical features of the above embodiments may be combined arbitrarily. For the sake of brevity, not all possible combinations of the technical features in the above embodiments are described. However, as long as there is no obvious contradiction in the combination of these technical features, such a combination should be considered to be within the scope described in this specification.

The above embodiments of the present disclosure are described in detail as above, and the principles and implementations of the present disclosure are described by means of specific examples. The illustrations of the above embodiments are merely intended to help understand the method and core ideas of the present disclosure. What's more, changes or modifications, made by those skilled in the art based on the specific embodiments and application scopes of the present disclosure, all fall within the scope of the present disclosure. In summary, the contents of this specification should not be construed as a limitation to this disclosure.

What is claimed is:

1. A readout circuit, comprising:
a signal sampler, comprising a plurality of channels;
a plurality of integrators, connected to the plurality of channels and having a one-to-one relationship with the plurality of channels;
a signal processor, comprising a first operational amplifier, a sampling input of the first operational amplifier being connected to outputs of the plurality of integrators, respectively; and
an analog-digital converter, an input of the analog-digital converter being connected to an output of the first operational amplifier;
wherein the readout circuit further comprises a signal modelling channel;
the signal modelling channel comprises a second operational amplifier; and
an output of the second operational amplifier is an output of the signal modelling channel and is connected to the input of the analog-digital converter.

2. The readout circuit according to claim 1, wherein:
the signal processor further comprises a first sampling capacitor; and
a first terminal of the first sampling capacitor is connected to the sampling input of the first operational amplifier, and a second terminal of the first sampling capacitor is connected to the output of the first operational amplifier.

3. The readout circuit according to claim 2, wherein:
the signal processor further comprises sampling switches, and the sampling switches are connected to the first terminal and the second terminal of the first sampling capacitor, respectively.

4. The readout circuit of claim 2, wherein a sampling mode of the first sampling capacitor is bottom-plate sampling.

5. The readout circuit according to claim 1, wherein:
the signal modelling channel further comprises a modelling-related sampling capacitor;
a first terminal of the modelling-related sampling capacitor is connected to a sampling input of the second operational amplifier, and a second terminal of the modelling-related sampling capacitor is connected to the output of the second operational amplifier.

6. The readout circuit according to claim 1, wherein:
the signal modelling channel further comprises a modelling-related resetting capacitor;
a first terminal of the modelling-related resetting capacitor is connected to a sampling input of the second operational amplifier, and a second terminal of the modelling-related resetting capacitor is connected to the output of the second operational amplifier.

7. The readout circuit of claim 6, wherein:
the signal modelling channel further comprises modelling-related resetting switches;
the modelling-related resetting switches are connected to the first terminal and the second terminal of the modelling-related sampling capacitor, respectively;
the modelling-related resetting switches are configured to be turned on when the modelling-related resetting capacitor is resetting.

8. The readout circuit according to claim 6, wherein:
the signal modelling channel further comprises modelling-related holding switches;
one of the modelling-related holding switches is provided between the first terminal of the modelling-related resetting capacitor and a common-mode voltage input of the signal processor, and another of the modelling-related holding switches is provided between the second terminal of the modelling-related resetting capacitor and a common-mode voltage output of the signal processor;
the modelling-related holding switches are configured to be turned on when the signal modelling channel is holding.

9. A signal quantizing method, applicable to the readout circuit of claim 1, comprising:
the signal sampler collecting an analog signal from each of the plurality of channels;
the plurality of integrators converting the analog signal collected from each of the plurality of channels into an electric charge signal, respectively;
the signal processor receiving the electric charge signals output by the plurality of integrators in sequence;
the signal processor sampling and holding each of the electric charge signals; and
the analog-digital converter performing an analog-digital conversion on sampled and held electric charge signal to obtain a quantized result of the electric charge signal;
wherein the signal processor sampling and holding each of the electric charge signals comprises:
the signal processor processing the electric charge signal together with an interference noise signal to obtain a first processed electric charge signal, and the interference noise signal being noise information generated by the readout circuit; and
the signal modelling channel processing the interference noise signal to obtain a second processed electric charge signal.

10. The signal quantizing method according to claim 9, wherein the analog-digital converter performing the analog-digital conversion on the sampled and held electric charge signal to obtain the quantized result of the electric charge signal comprises:
the analog-digital converter performing a processing of restraining noise on the first processed electric charge signal and the second processed electric charge signal to obtain the quantized result of the electric charge signal.

11. A computer device comprising a memory and a processor, wherein a computer program is stored in the memory, and when executing the computer program, the processor performs steps of the method of claim 9.

12. A readout circuit, comprising:
a signal processing circuit, comprising a plurality of sampling capacitors and a signal processor, one terminal of each of the plurality of sampling capacitors being connected to an input of the signal processor, and at least one of the plurality of sampling capacitors being configured to sample at least one signal;

a randomizing circuit, configured to randomize an order in which the plurality of sampling capacitors are flip-flopped to the signal processor; and an analog-digital converter, an input end of the analog-digital converter being connected to an output of the signal processor.

13. A readout circuit, comprising:

a main signal channel, configured to process an electric charge signal together with an interference noise signal to obtain a first processed electric charge signal, and the interference noise signal being noise information generated by the readout circuit;

a signal modelling channel, configured to process the interference noise signal to obtain a second processed electric charge signal;

an analog-digital converter, configured to perform a processing of restraining noise on the first processed electric charge signal and the second processed electric charge signal, to obtain a quantized result corresponding to the electric charge signal.

14. A readout circuit, comprising:

a signal sampler, comprising a plurality of channels;

a plurality of integrators, connected to the plurality of channels and having a one-to-one relationship with the plurality of channels;

a signal processor, comprising a first operational amplifier, a sampling input of the first operational amplifier being connected to outputs of the plurality of integrators, respectively; and an analog-digital converter, an input of the analog-digital converter being connected to an output of the first operational amplifier;

wherein the signal processor further comprises a resetting capacitor and holding switches;

a first terminal of the resetting capacitor is connected to the sampling input of the first operational amplifier, and a second terminal of the resetting capacitor is connected to the output of the first operational amplifier;

one of the holding switches is connected between the first terminal of the resetting capacitor and a common-mode voltage input of the signal processor, and another of the holding switches is connected between the second terminal of the resetting capacitor and a common-mode voltage output of the signal processor.

15. The readout circuit according to claim 14, wherein:

the signal processor further comprises resetting switches, and the resetting switches are connected to the first terminal and the second terminal of the resetting capacitor, respectively.

16. A readout circuit, comprising:

a signal sampler, comprising a plurality of channels;

a plurality of integrators, connected to the plurality of channels and having a one-to-one relationship with the plurality of channels;

a signal processor, comprising a first operational amplifier, a sampling input of the first operational amplifier being connected to outputs of the plurality of integrators, respectively; and an analog-digital converter, an input of the analog-digital converter being connected to an output of the first operational amplifier;

wherein the readout circuit further comprises a plurality of sampling capacitors, and at least one of the plurality of sampling capacitors is configured to be connected to the outputs of the plurality of integrators, respectively; and the readout circuit further comprises a randomizing circuit, and the randomizing circuit is configured to randomize an order in which the plurality of sampling capacitors are flip-flopped to the signal processor.

17. A signal quantizing method, applicable to the readout circuit of claim 16, comprising:

the signal sampler collecting an analog signal from each of the plurality of channels;

the plurality of integrators converting the analog signal collected from each of the plurality of channels into an electric charge signal, respectively;

the signal processor receiving the electric charge signals output by the plurality of integrators in sequence;

the signal processor sampling and holding each of the electric charge signals; and the analog-digital converter performing an analog-digital conversion on sampled and held electric charge signal to obtain a quantized result of the electric charge signal;

wherein the signal processor sampling and holding each of the electric charge signals comprises:

the randomizing circuit randomizing an order in which the electric charge signals are held, and the signal processor holding the electric charge signals in sequence based on a randomized order.

* * * * *